US011677372B2

(12) United States Patent
Kim et al.

(10) Patent No.: US 11,677,372 B2
(45) Date of Patent: Jun. 13, 2023

(54) PIEZOELECTRIC ACOUSTIC RESONATOR WITH DIELECTRIC PROTECTIVE LAYER MANUFACTURED WITH PIEZOELECTRIC THIN FILM TRANSFER PROCESS

(71) Applicant: Akoustis, Inc., Huntersville, NC (US)

(72) Inventors: Dae Ho Kim, Cornelius, NC (US); Frank Zhiquang Bi, Mooresville, NC (US); Mary Winters, Webster, NY (US); Abhay Saranswarup Kochhar, Charlotte, NC (US); Emad Mehdizadeh, Charlotte, NC (US); Rohan W. Houlden, Oak Ridge, NC (US); Jeffrey B. Shealy, Cornelius, NC (US)

(73) Assignee: Akoustis, Inc., Huntersville, NC (US)

( * ) Notice: Subject to any disclaimer, the term of this patent is extended or adjusted under 35 U.S.C. 154(b) by 237 days.

(21) Appl. No.: 17/230,729

(22) Filed: Apr. 14, 2021

(65) Prior Publication Data

US 2021/0234525 A1    Jul. 29, 2021

Related U.S. Application Data

(63) Continuation-in-part of application No. 16/433,849, filed on Jun. 6, 2019, now Pat. No. 11,070,184, which
(Continued)

(51) Int. Cl.
*H03H 3/02* (2006.01)
*H03H 9/05* (2006.01)
(Continued)

(52) U.S. Cl.
CPC .......... *H03H 3/02* (2013.01); *H01L 41/0475* (2013.01); *H01L 41/0477* (2013.01);
(Continued)

(58) Field of Classification Search
CPC ...... H03H 3/02; H03H 3/04; H03H 2003/021; H03H 2003/0407; H03H 9/02015;
(Continued)

(56) References Cited

U.S. PATENT DOCUMENTS 5,231,327 A    7/1993    Ketcham
5,894,647 A    4/1999    Lakin
(Continued)

FOREIGN PATENT DOCUMENTS

CN    1929302 A    3/2007
JP    H09321361 A    12/1997
(Continued)

OTHER PUBLICATIONS

International Search Report and Written Opinion for PCT/US2019/040729, dated Oct. 22, 2019.
(Continued)

*Primary Examiner* — Peter Dungba Vo
*Assistant Examiner* — Joshua D Anderson
(74) *Attorney, Agent, or Firm* — Richard T. Ogawa; Ogawa P.C.

(57) ABSTRACT

A method and structure for a transfer process for an acoustic resonator device. In an example, a bulk acoustic wave resonator (BAWR) with an air reflection cavity is formed. A piezoelectric thin film is grown on a crystalline substrate. Patterned electrodes are deposited on the surface of the piezoelectric film. An etched sacrificial layer is deposited over the electrodes and a planarized support layer is deposited over the sacrificial layer. The device can include a dielectric protection layer (DPL) that protects the piezoelectric layer from etching processes that can produce rough surfaces and reduces parasitic capacitance around the perimeter of the resonator when the DPL's dielectric constant is lower than that of the piezoelectric layer. The DPL can be
(Continued)

configured between the top electrode and the piezoelectric layer, between the bottom electrode and the piezoelectric layer, or both.

20 Claims, 68 Drawing Sheets

Related U.S. Application Data is a continuation of application No. 15/784,919, filed on Oct. 16, 2017, now Pat. No. 10,355,659, which is a continuation-in-part of application No. 15/068,510, filed on Mar. 11, 2016, now Pat. No. 10,217,930.

(51) Int. Cl.

| | | |
|---|---|---|
| *H03H 9/10* | (2006.01) | |
| *H03H 9/13* | (2006.01) | |
| *H03H 9/17* | (2006.01) | |
| *H03H 9/54* | (2006.01) | |
| *H10N 30/87* | (2023.01) | |
| *H10N 30/88* | (2023.01) | |
| *H10N 30/00* | (2023.01) | |
| *H10N 30/85* | (2023.01) | |
| *H10N 30/02* | (2023.01) | |
| *H10N 30/06* | (2023.01) | |
| *H10N 30/077* | (2023.01) | |
| *H10N 30/086* | (2023.01) | |
| *H03H 9/02* | (2006.01) | |
| *H01L 41/047* | (2006.01) | |
| *H01L 41/053* | (2006.01) | |
| *H01L 41/08* | (2006.01) | |
| *H01L 41/18* | (2006.01) | |
| *H01L 41/23* | (2013.01) | |
| *H01L 41/29* | (2013.01) | |
| *H01L 41/317* | (2013.01) | |
| *H01L 41/337* | (2013.01) | |

(52) U.S. Cl.
CPC .......... *H01L 41/053* (2013.01); *H01L 41/081* (2013.01); *H01L 41/18* (2013.01); *H01L 41/23* (2013.01); *H01L 41/29* (2013.01); *H01L 41/317* (2013.01); *H01L 41/337* (2013.01); *H03H 9/02015* (2013.01); *H03H 9/02118* (2013.01); *H03H 9/0523* (2013.01); *H03H 9/105* (2013.01); *H03H 9/13* (2013.01); *H03H 9/173* (2013.01); *H03H 9/175* (2013.01); *H03H 9/177* (2013.01); *H03H 9/547* (2013.01); *H03H 2003/021* (2013.01); *H03H 2003/025* (2013.01); *Y10T 29/42* (2015.01)

(58) Field of Classification Search
CPC ........... H03H 9/02039; H03H 9/02055; H03H 9/02102; H03H 9/02118; H03H 9/0504; H03H 9/0509; H03H 9/0523; H03H 9/105; H03H 9/13; H03H 9/131; H03H 9/17; H03H 9/171; H03H 9/173; H03H 9/175; H03H 9/177; H03H 9/547; H03H 9/564; H01L 41/04; H01L 41/0474; H01L 41/0475; H01L 41/0477; H01L 41/053; H01L 41/08; H01L 41/081; H01L 41/0815; H01L 41/083; H01L 41/18; H01L 41/22; H01L 41/23; H01L 41/27; H01L 41/277; H01L 41/29; H01L 41/31; H01L 41/312; H01L 41/313; H01L 41/317; H01L 41/319; H01L 41/332; H01L 41/337; Y10T 29/42
See application file for complete search history.

(56) References Cited

U.S. PATENT DOCUMENTS

| | | |
|---|---|---|
| 6,051,907 A | 4/2000 | Ylilammi |
| 6,114,635 A | 9/2000 | Lakin et al. |
| 6,262,637 B1 | 7/2001 | Bradley et al. |
| 6,377,137 B1 | 4/2002 | Ruby |
| 6,384,697 B1 | 5/2002 | Ruby |
| 6,472,954 B1 | 10/2002 | Ruby et al. |
| 6,617,060 B2 | 9/2003 | Weeks, Jr. et al. |
| 6,812,619 B1 | 11/2004 | Kaitila et al. |
| 6,841,922 B2 | 1/2005 | Aigner et al. |
| 6,864,619 B2 | 3/2005 | Aigner et al. |
| 6,879,224 B2 | 4/2005 | Frank |
| 6,909,340 B2 | 6/2005 | Aigner et al. |
| 6,933,807 B2 | 8/2005 | Marksteiner et al. |
| 7,112,860 B2 | 9/2006 | Saxler |
| 7,250,360 B2 | 7/2007 | Shealy et al. |
| 7,268,436 B2 | 9/2007 | Aigner et al. |
| 7,365,619 B2 | 4/2008 | Aigner et al. |
| 7,514,759 B1 | 4/2009 | Mehta et al. |
| 7,777,777 B2 | 8/2010 | Bowman et al. |
| 7,875,910 B2 | 1/2011 | Sheppard et al. |
| 7,982,363 B2 | 7/2011 | Chitnis |
| 8,304,271 B2 | 11/2012 | Huang et al. |
| 2005/0219012 A1 | 10/2005 | Milsom et al. |
| 2005/0255234 A1 | 11/2005 | Kanda et al. |
| 2006/0284707 A1* | 12/2006 | Larson, III ............. H03H 9/584 |
| | | 333/187 |
| 2007/0080611 A1 | 4/2007 | Yamada et al. |
| 2008/0024042 A1 | 1/2008 | Isobe et al. |
| 2008/0284541 A1 | 11/2008 | Chitnis |
| 2009/0033177 A1 | 2/2009 | Itaya et al. |
| 2009/0102319 A1* | 4/2009 | Nakatsuka ............. H03H 9/173 |
| | | 310/326 |
| 2011/0114968 A1 | 5/2011 | Sheppard et al. |
| 2011/0298564 A1 | 12/2011 | Iwashita et al. |
| 2012/0287575 A1 | 11/2012 | Nelson |
| 2013/0176086 A1 | 7/2013 | Bradley et al. |
| 2014/0132117 A1 | 5/2014 | Larson, III |
| 2015/0097638 A1 | 4/2015 | Yu et al. |
| 2015/0357993 A1 | 12/2015 | Shealy |
| 2016/0028367 A1 | 1/2016 | Shealy |
| 2016/0036580 A1 | 2/2016 | Shealy |
| 2017/0264256 A1 | 9/2017 | Gibb et al. |
| 2018/0013405 A1 | 1/2018 | Takata |
| 2018/0054176 A1 | 2/2018 | Kim et al. |
| 2018/0138885 A1 | 5/2018 | Stokes et al. |
| 2019/0081611 A1 | 3/2019 | Vetury et al. |

FOREIGN PATENT DOCUMENTS

| | | |
|---|---|---|
| JP | 2009100197 A | 5/2009 |
| JP | 2010-068109 A | 3/2010 |
| KR | 20120023285 A | 3/2012 |
| WO | 2005-034349 A1 | 4/2005 |
| WO | 2016122877 A1 | 8/2016 |
| WO | WO2017171856 A1 | 5/2017 |
| WO | WO2017222990 A1 | 12/2017 |

OTHER PUBLICATIONS

International Search Report and Written Opinion for PCT/US2019/048412, dated Nov. 19, 2019.
International Search Report and Written Opinion for PCT/US2018/050521 dated Jan. 28, 2019.
International Search Report for PCT/US2019/018550, dated May 30, 2019.
International Search Report for PCT/US2015/034560, dated Sep. 18, 2015.
International Search Report and Written Opinion for PCT/US2020023008 dated Dec. 3, 2020.

* cited by examiner

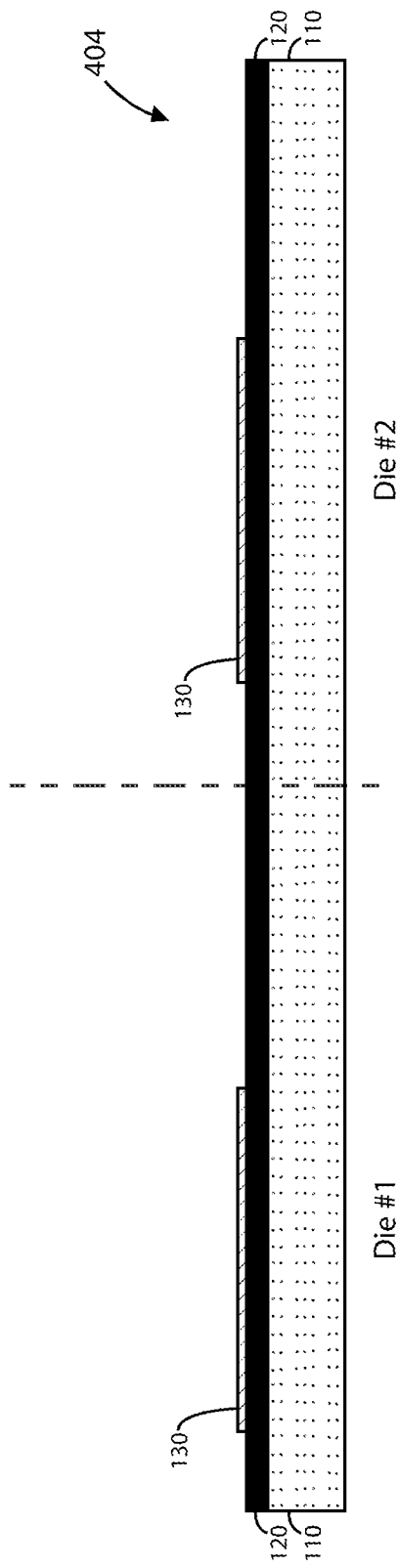
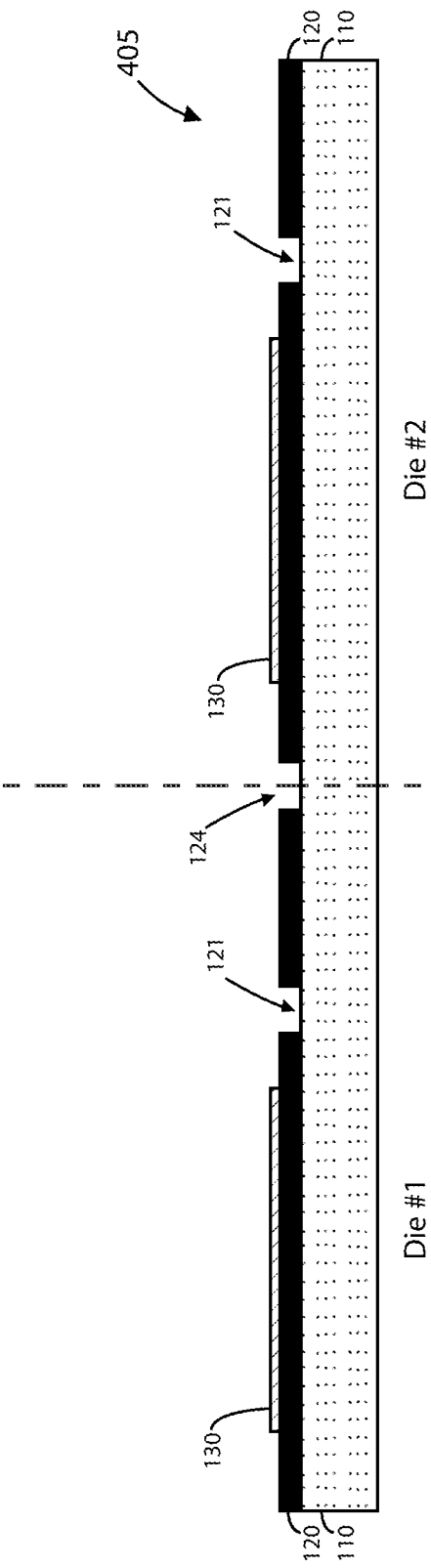

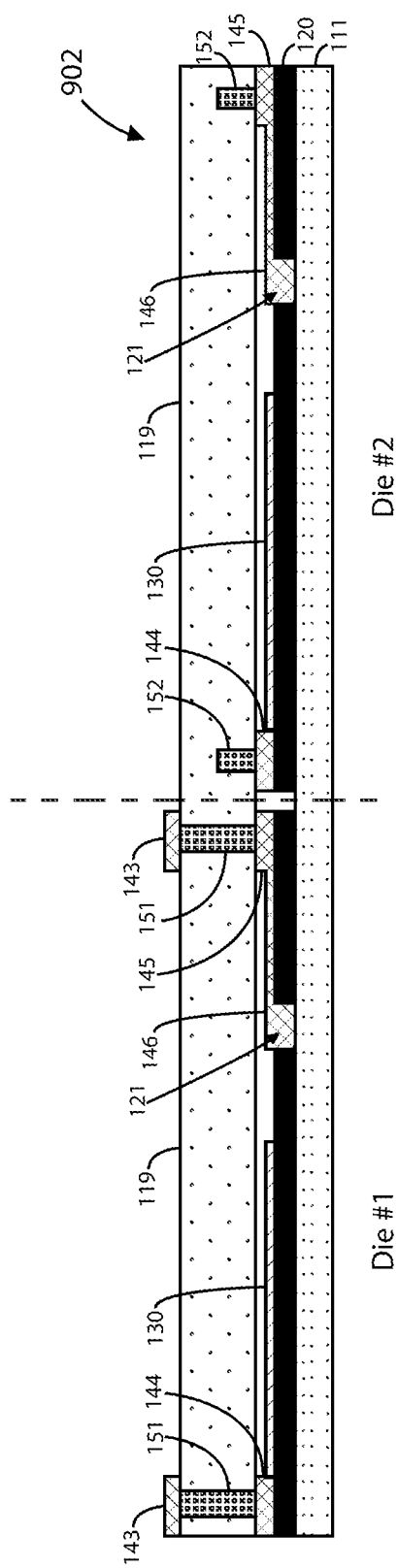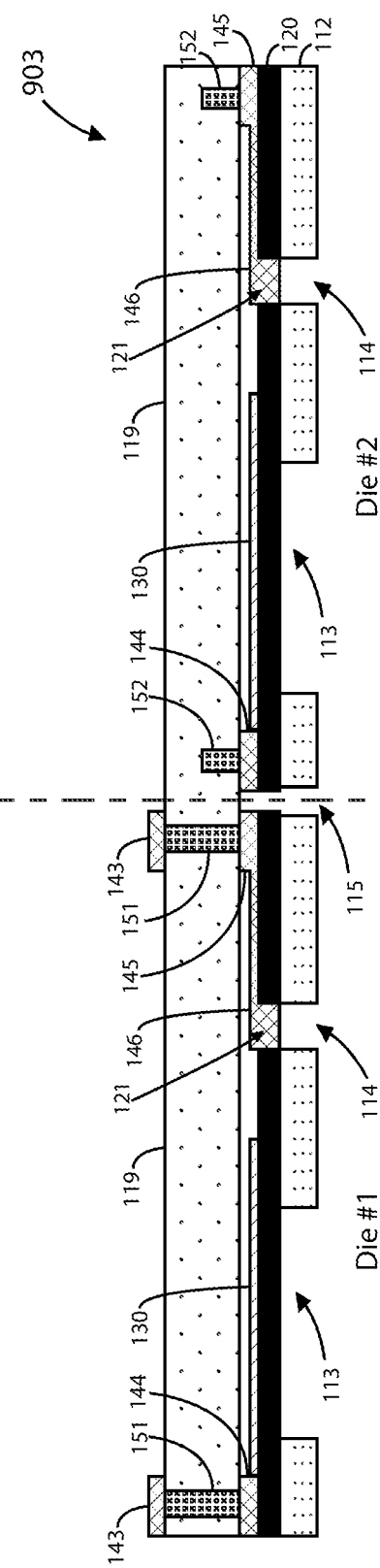

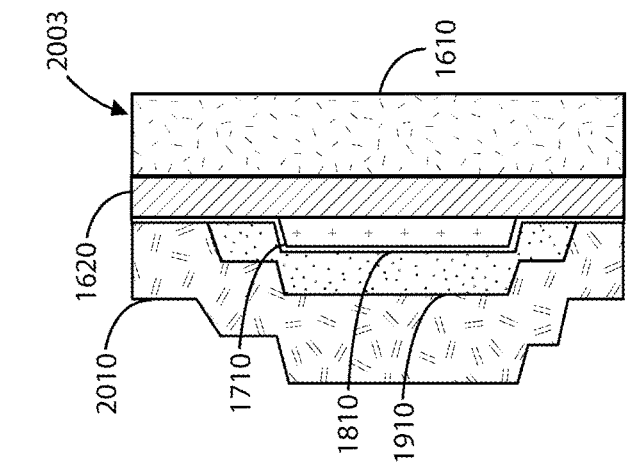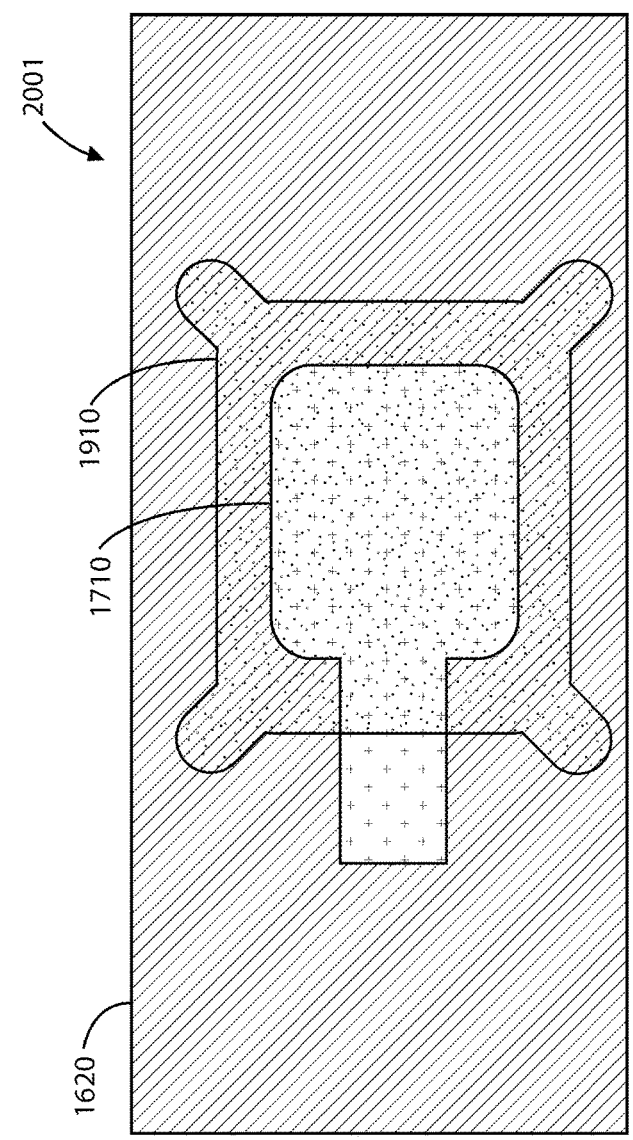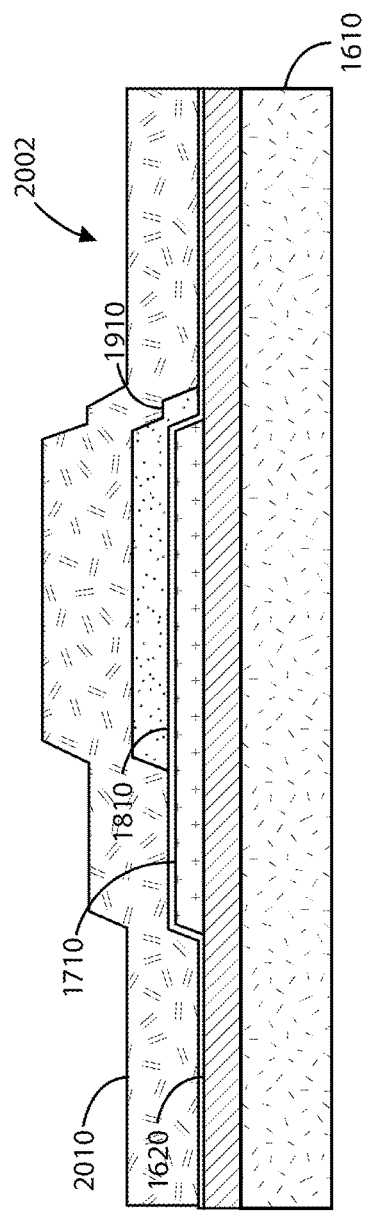
FIG. 20A
FIG. 20B
FIG. 20C

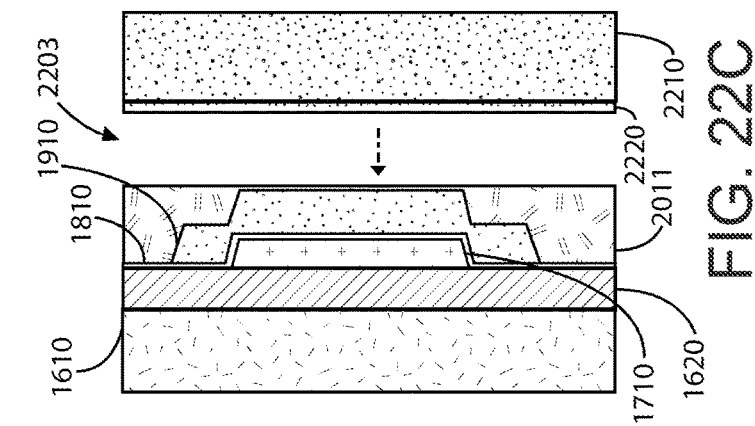
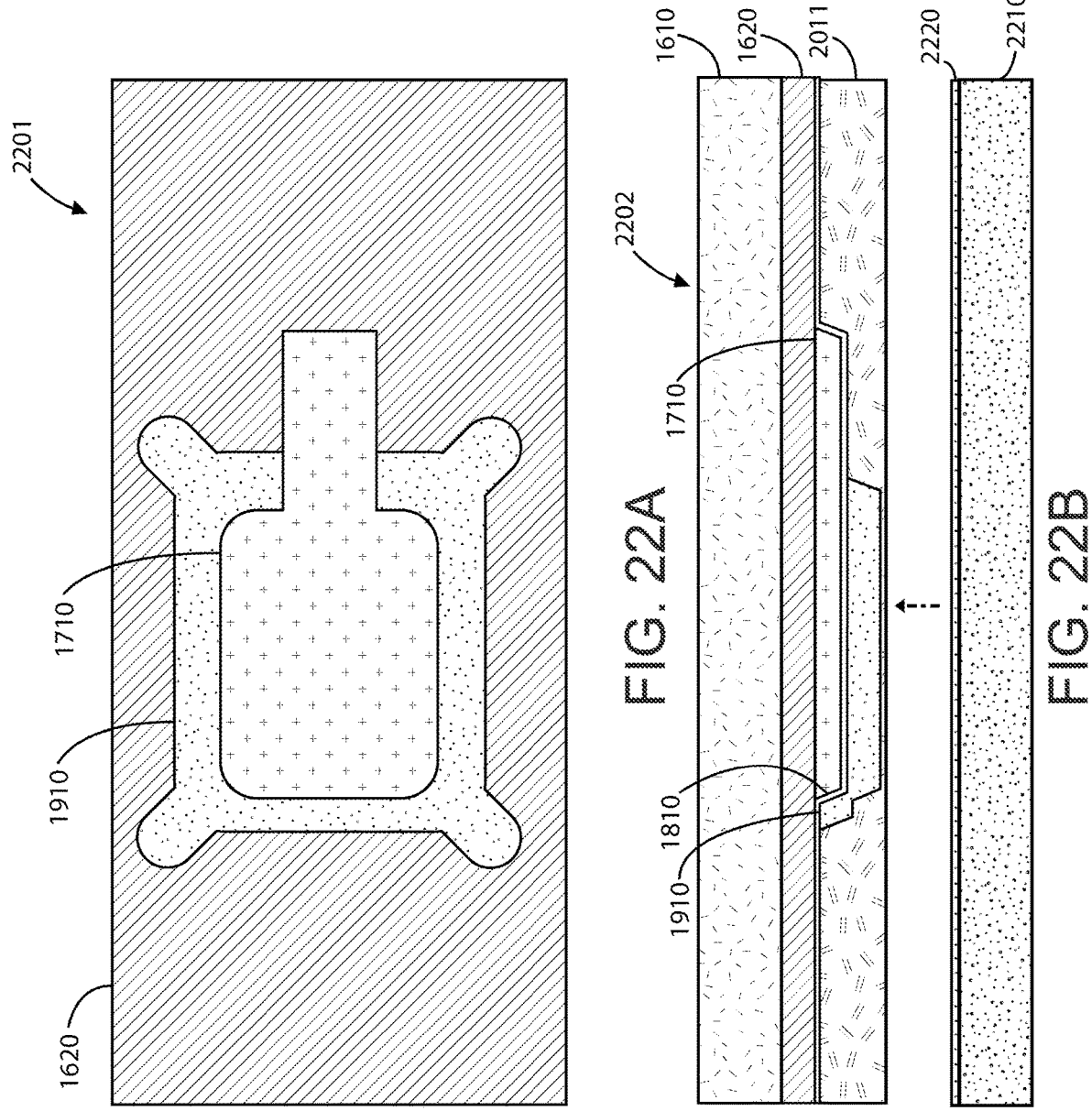

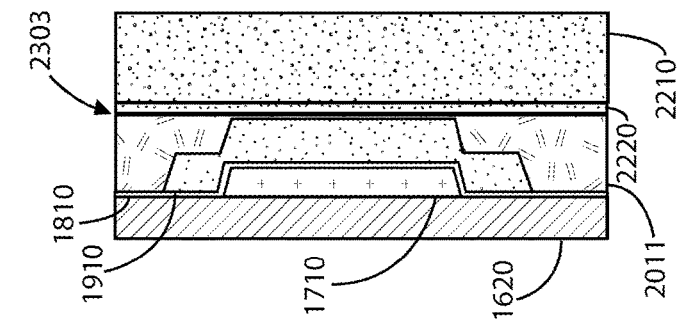
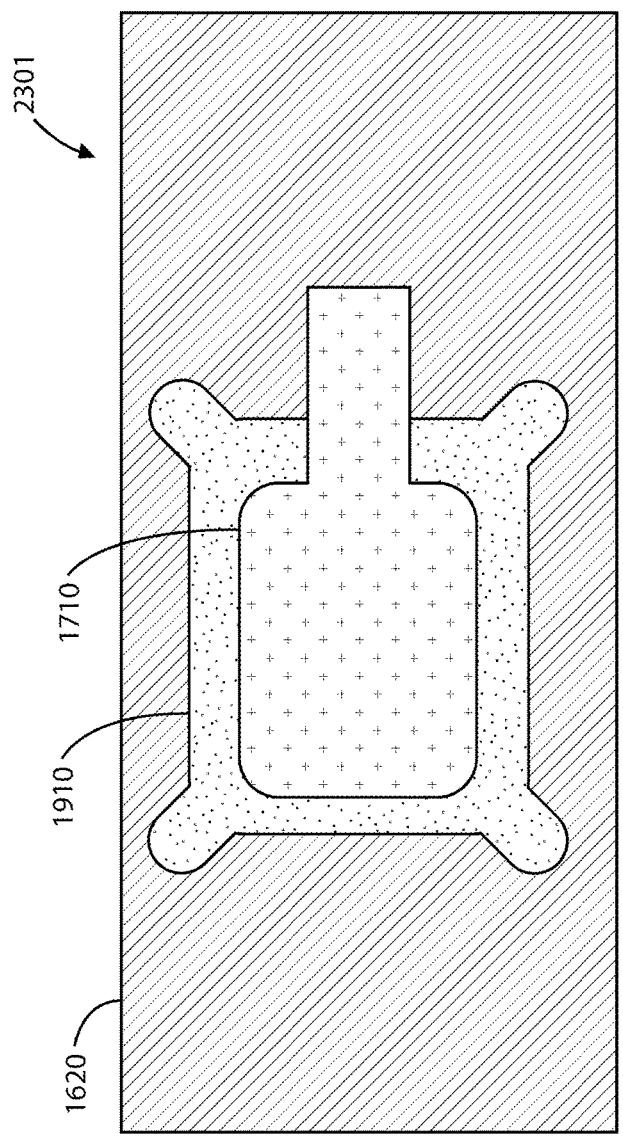
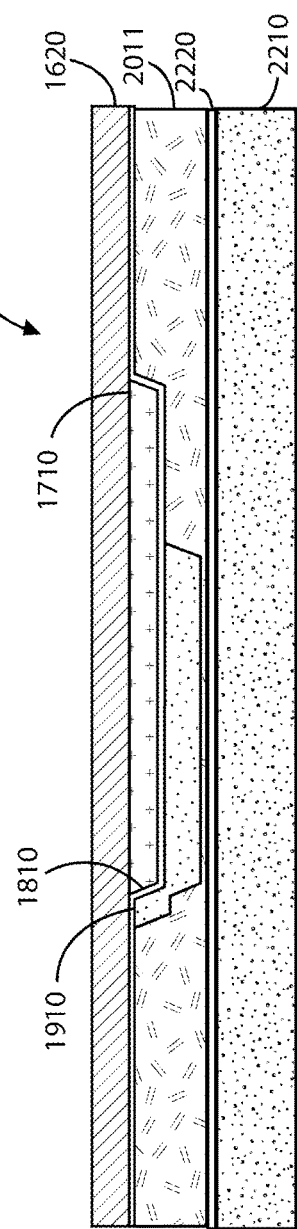
FIG. 23A
FIG. 23B
FIG. 23C

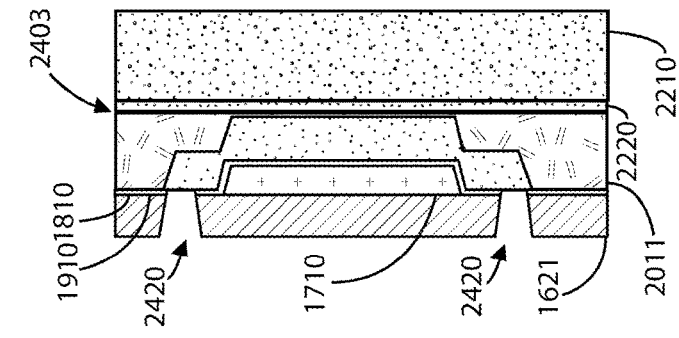
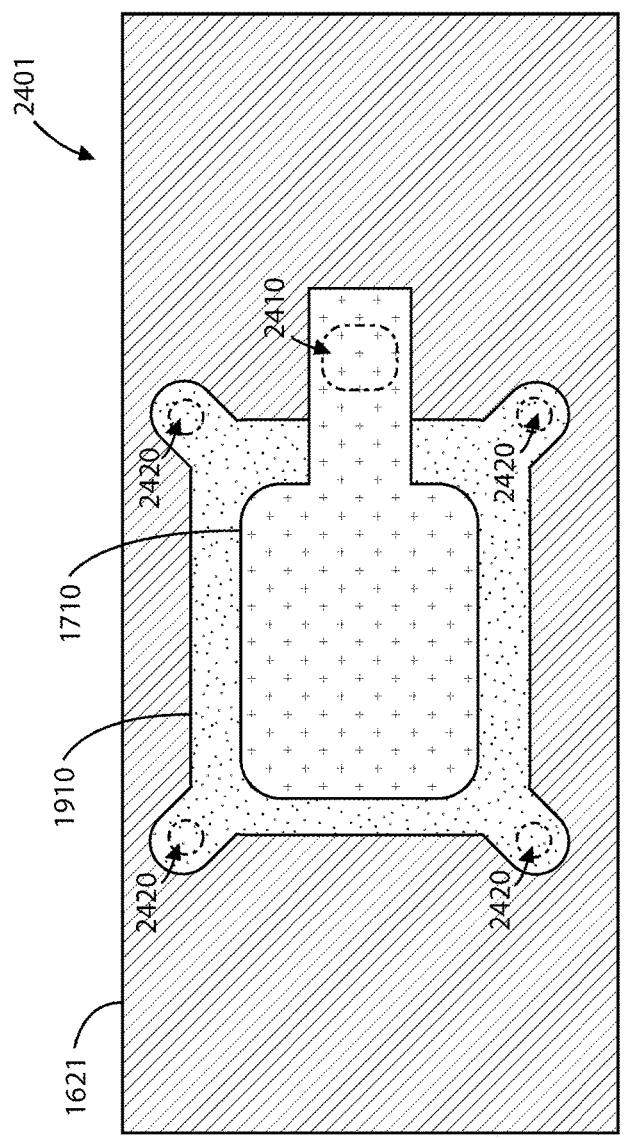
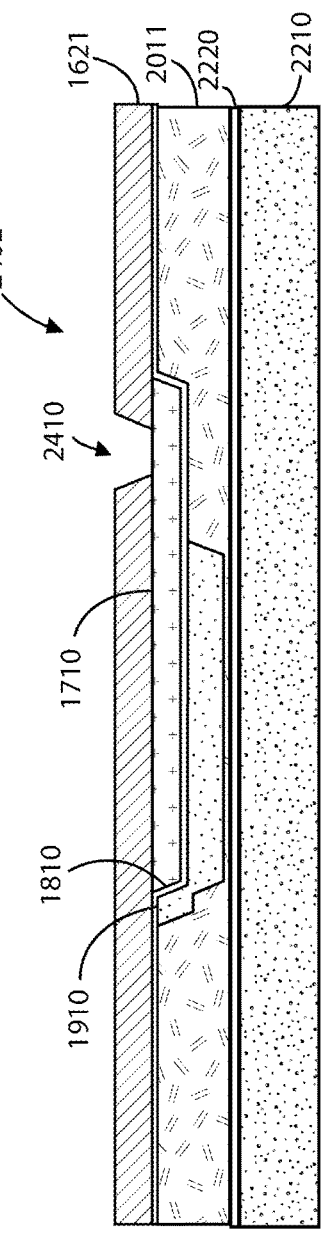
FIG. 24C
FIG. 24A
FIG. 24B

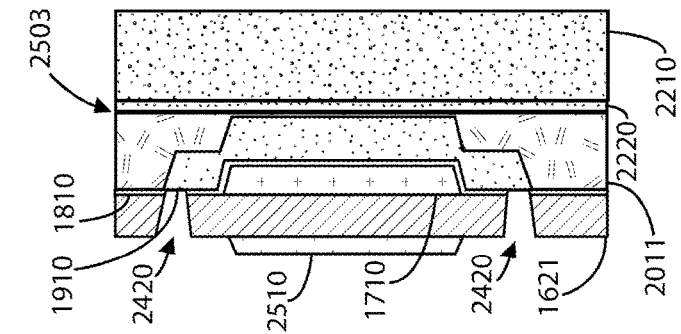
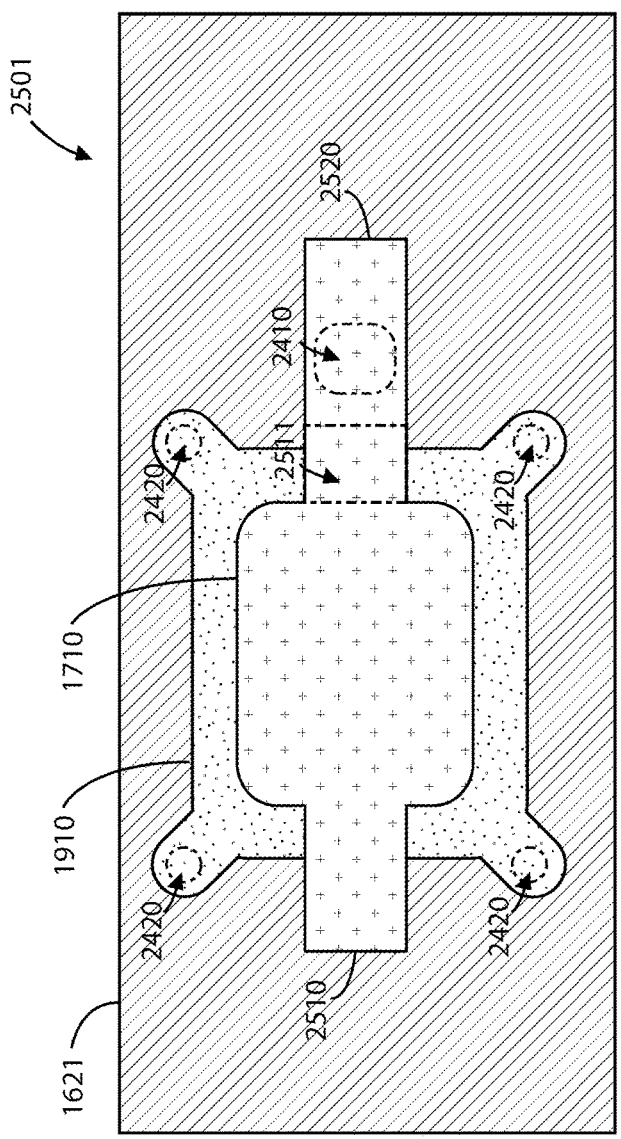
FIG. 25A
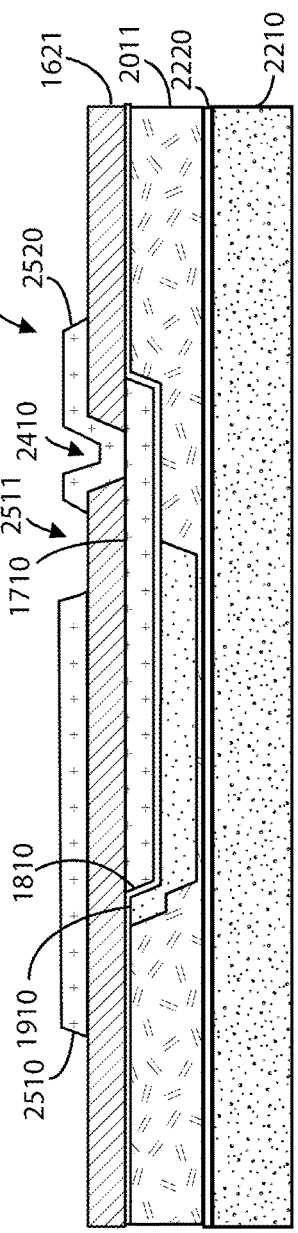
FIG. 25B
FIG. 25C

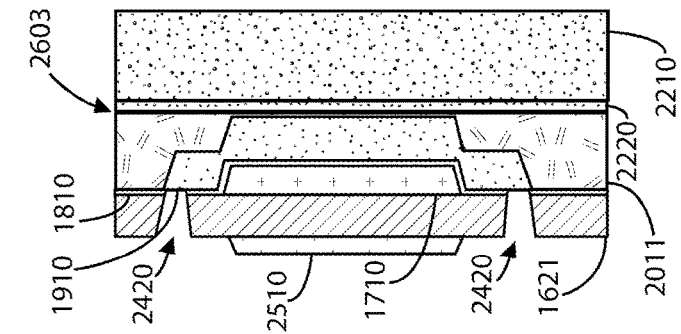
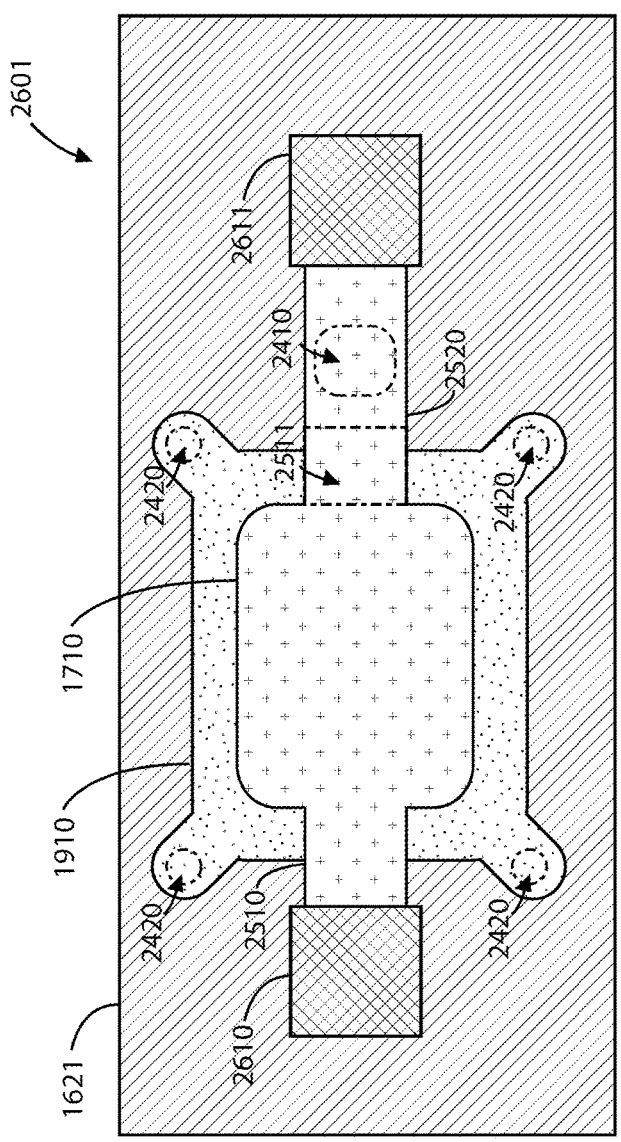
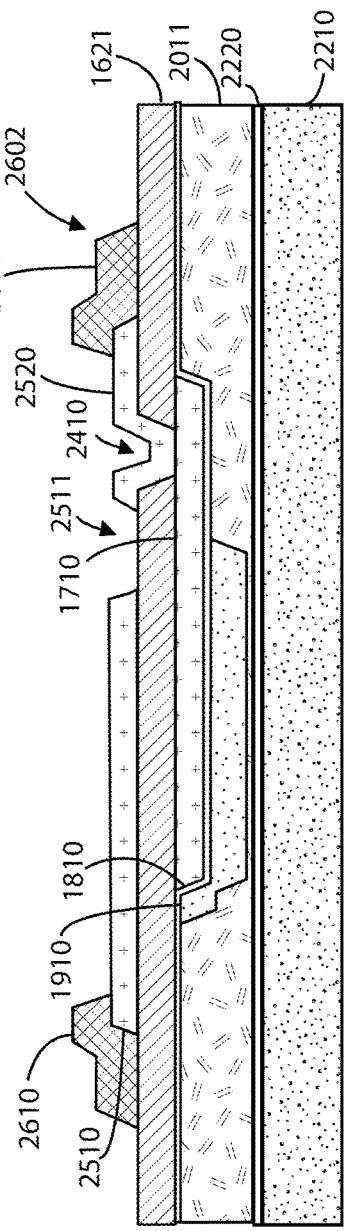
FIG. 26C
FIG. 26A
FIG. 26B

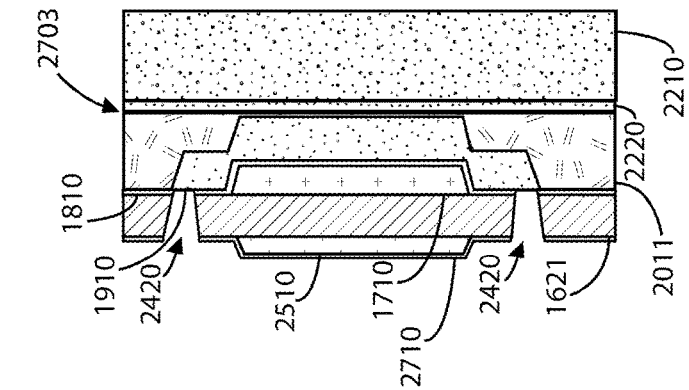
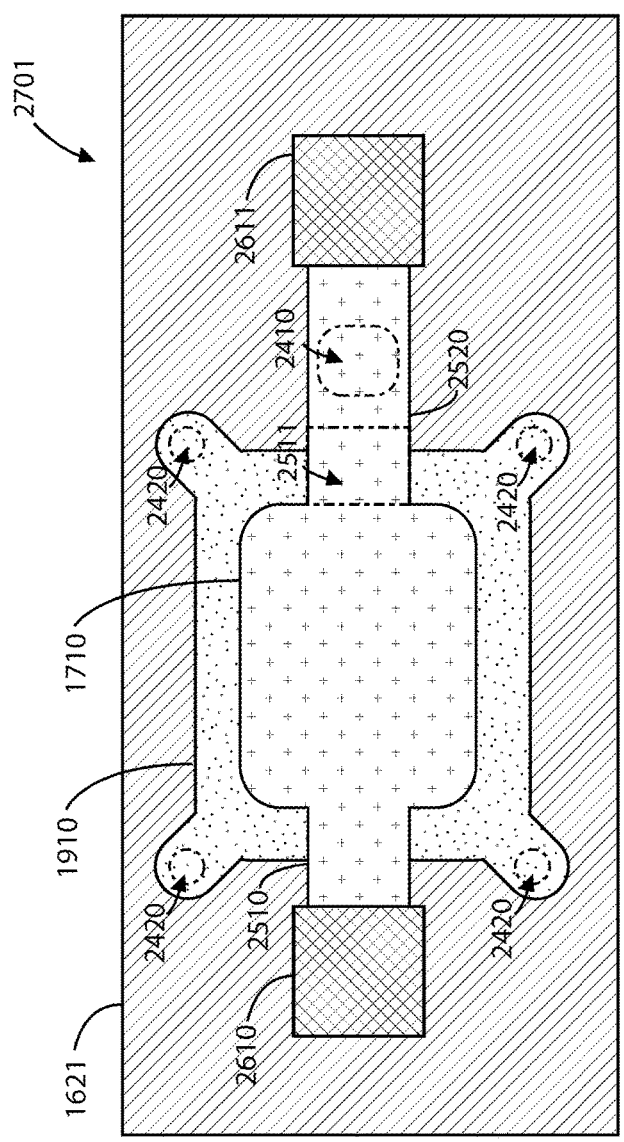
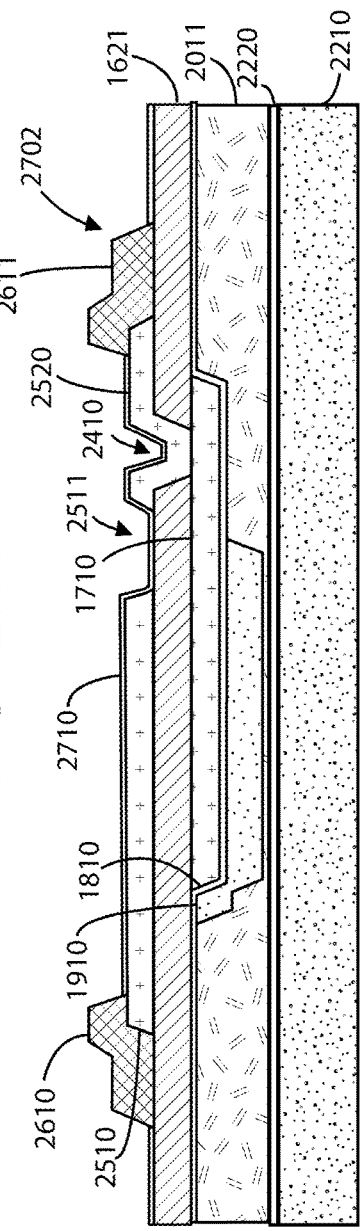
FIG. 27C
FIG. 27A
FIG. 27B

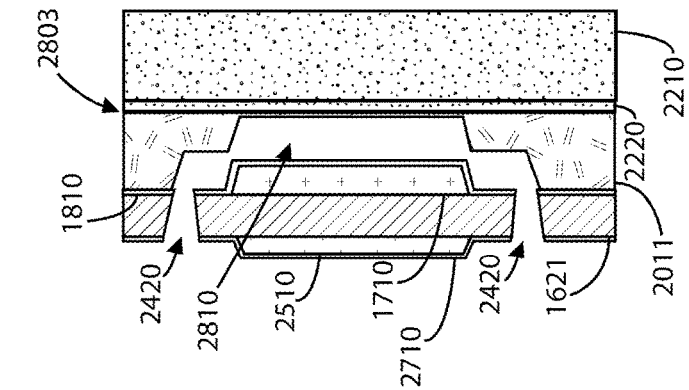
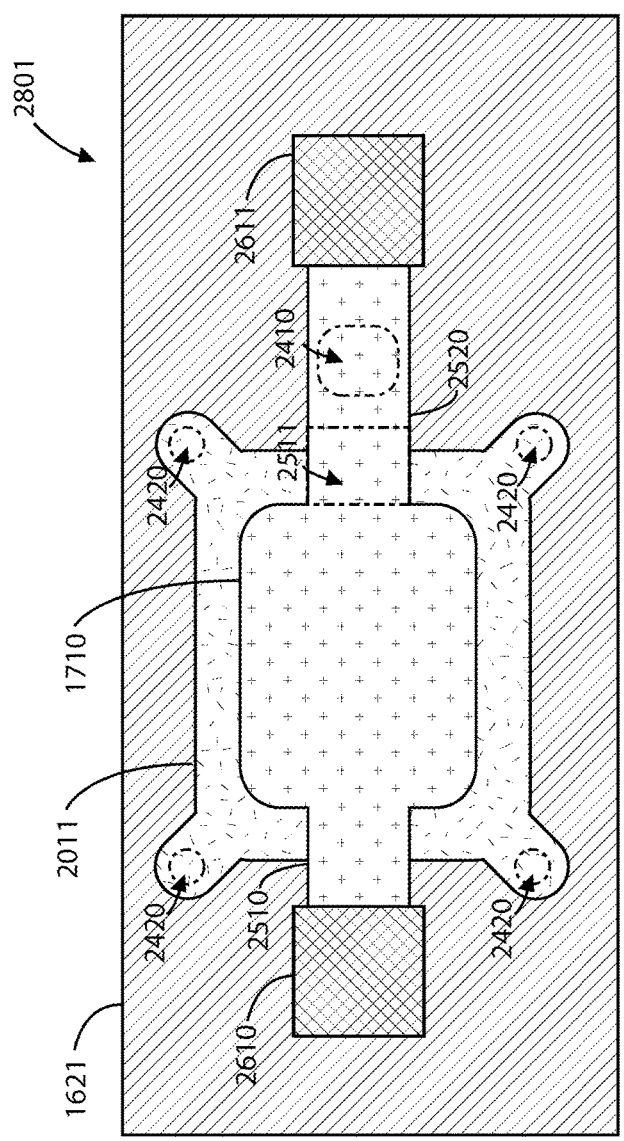
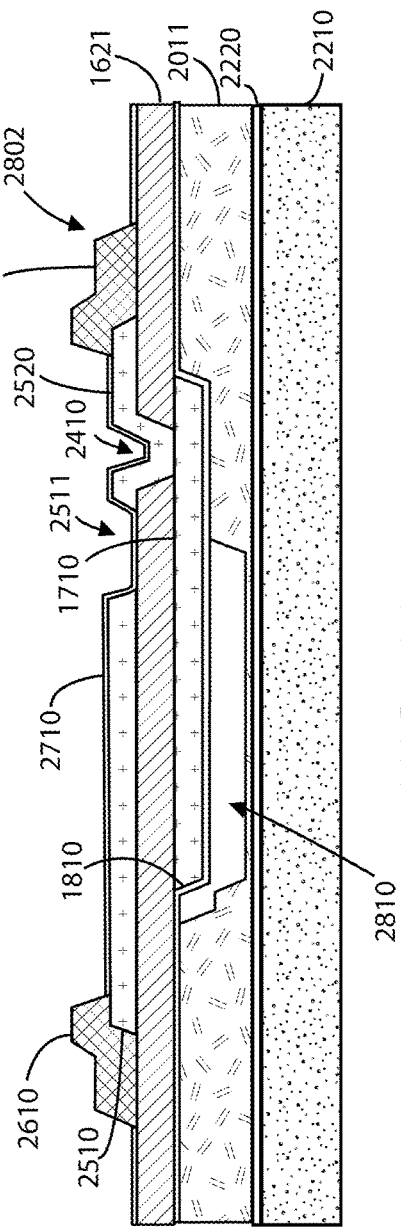

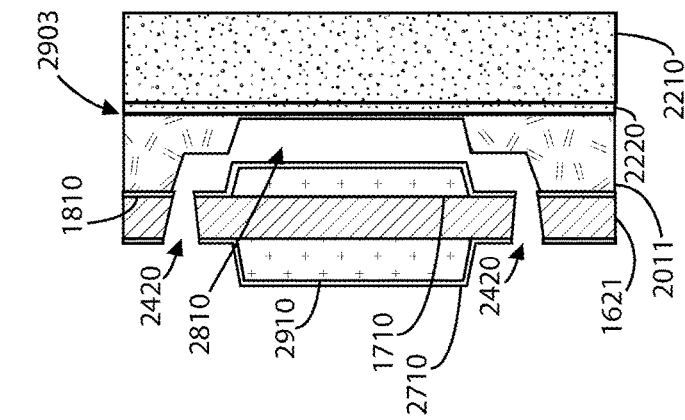
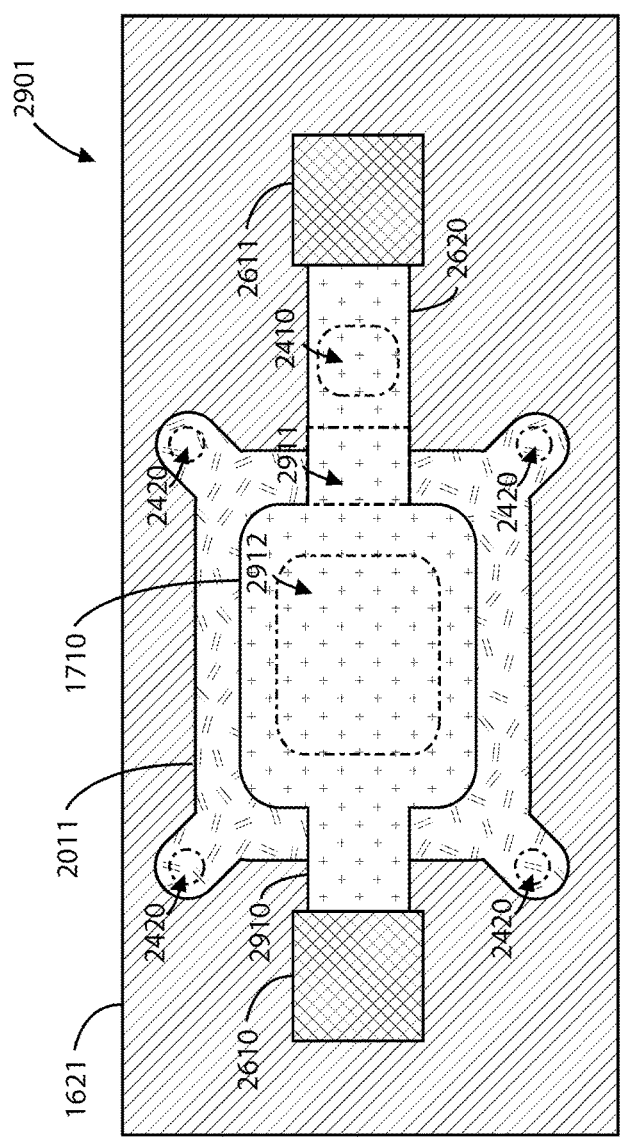
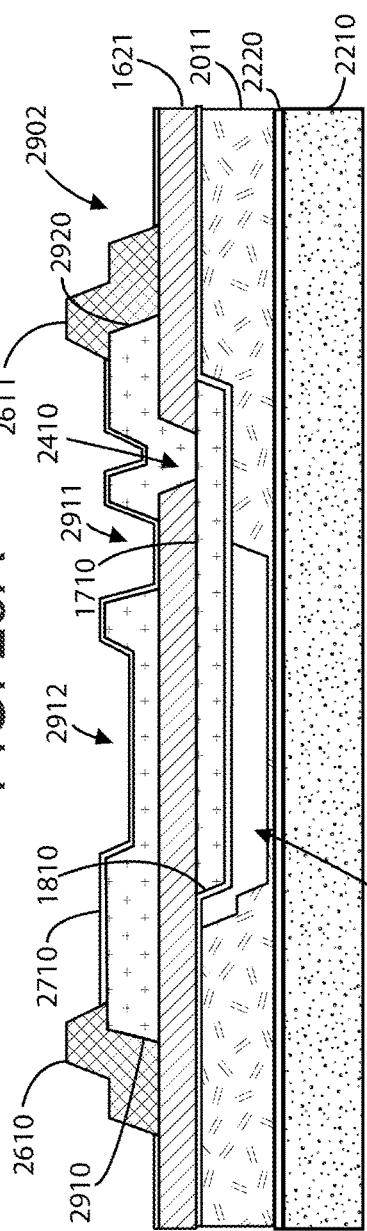
FIG. 29A
FIG. 29B
FIG. 29C

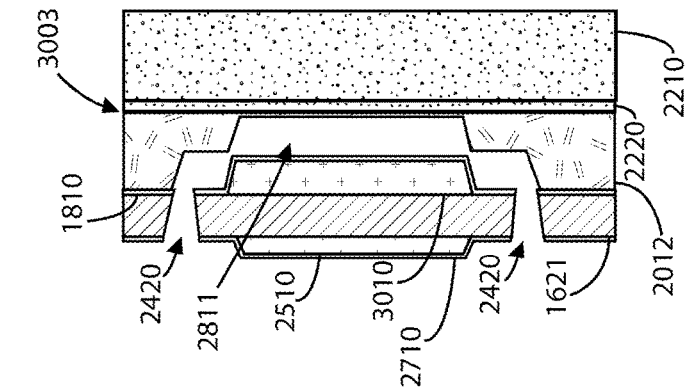
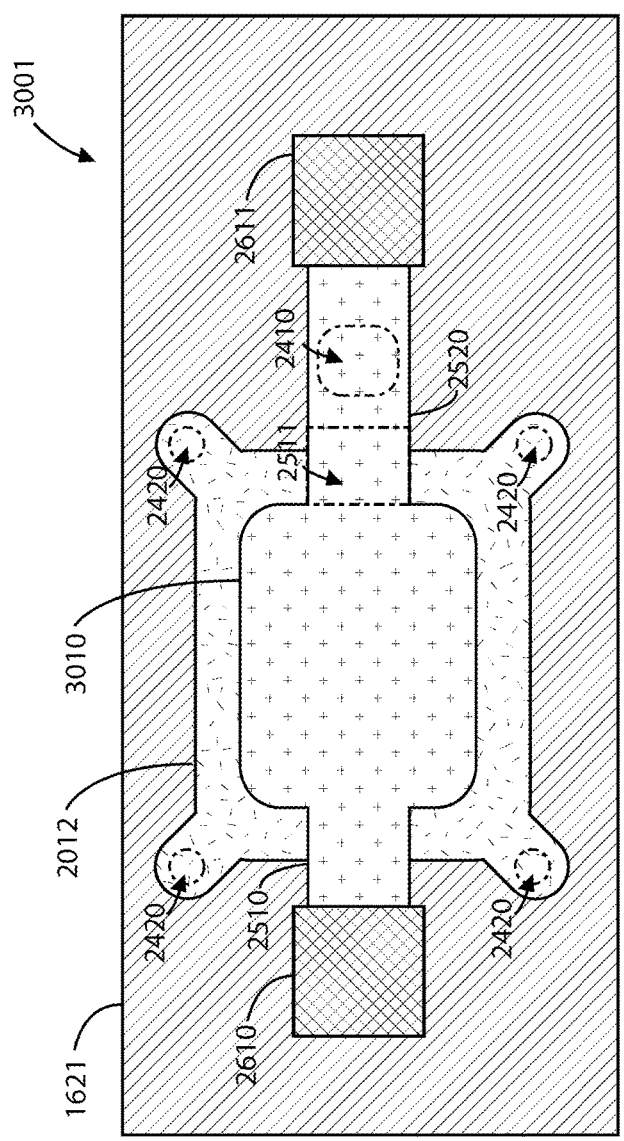
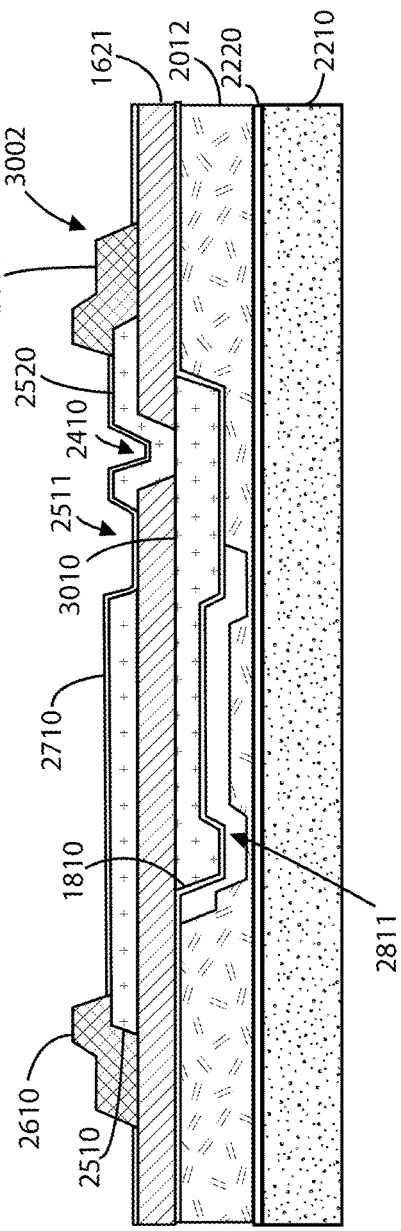

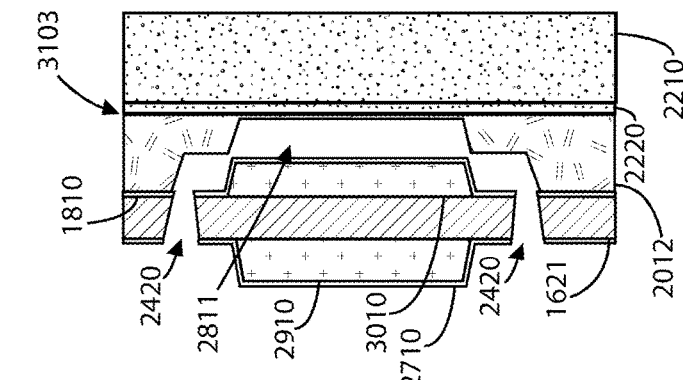
FIG. 31C
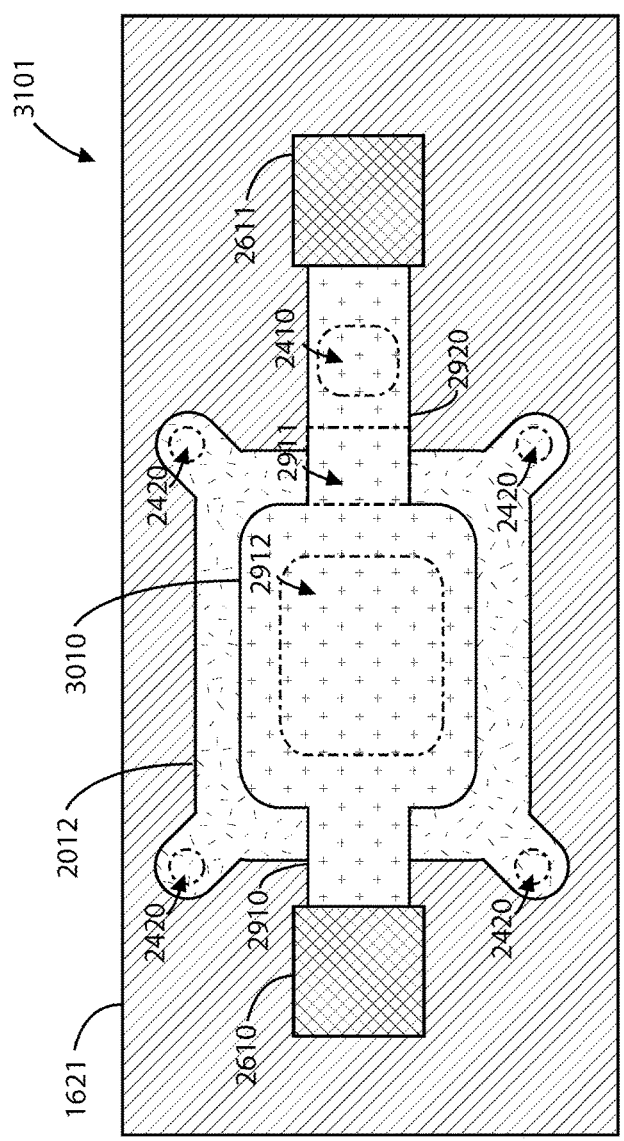
FIG. 31A
FIG. 31B
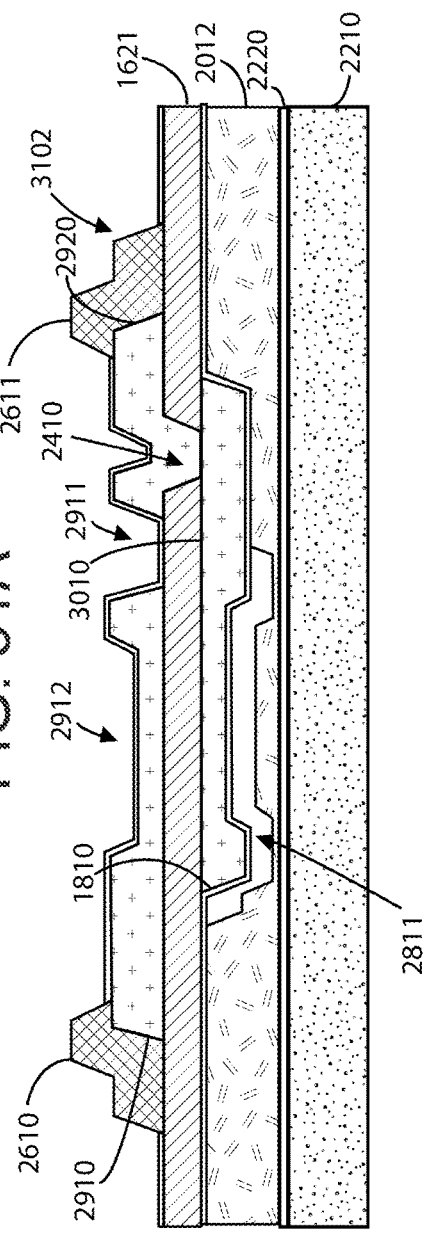

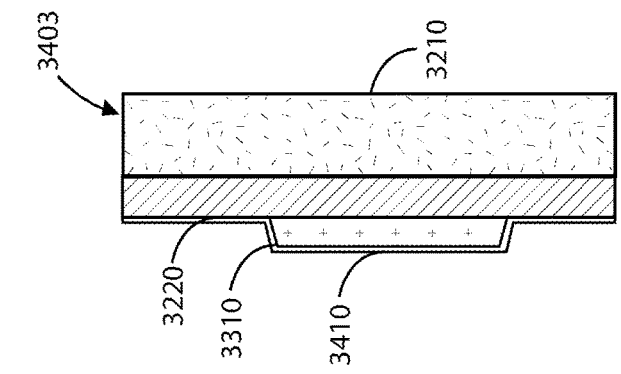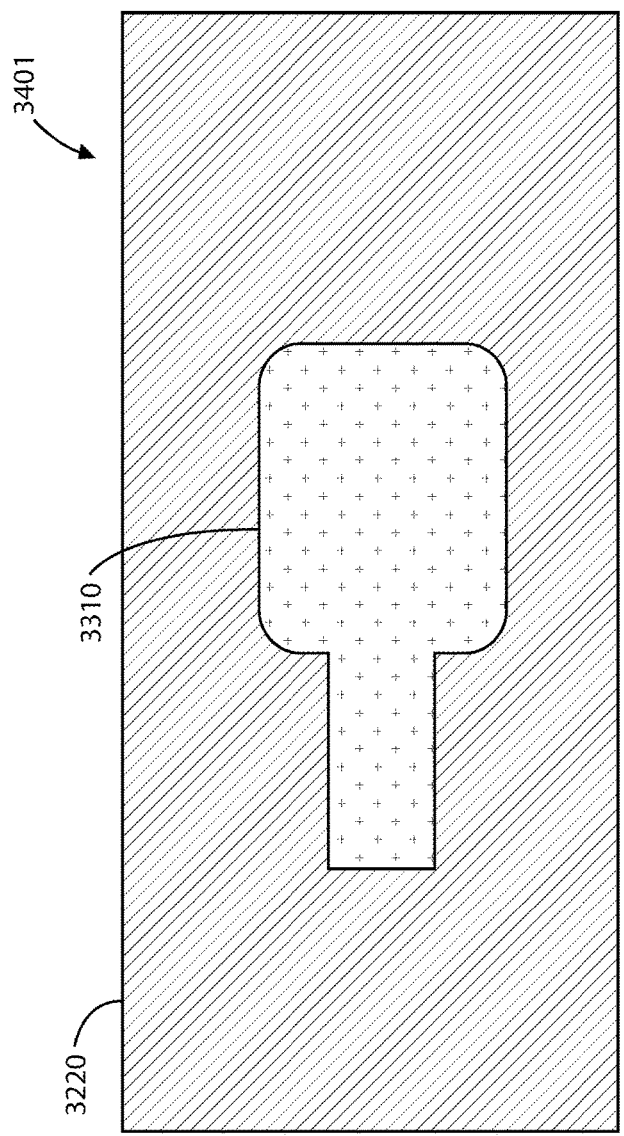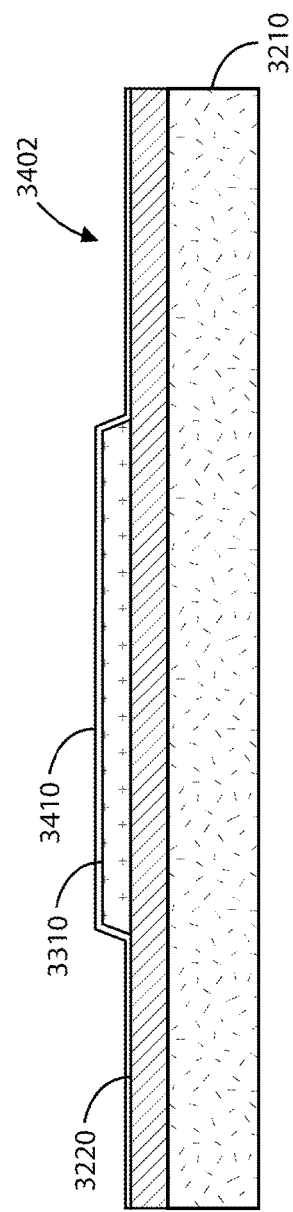

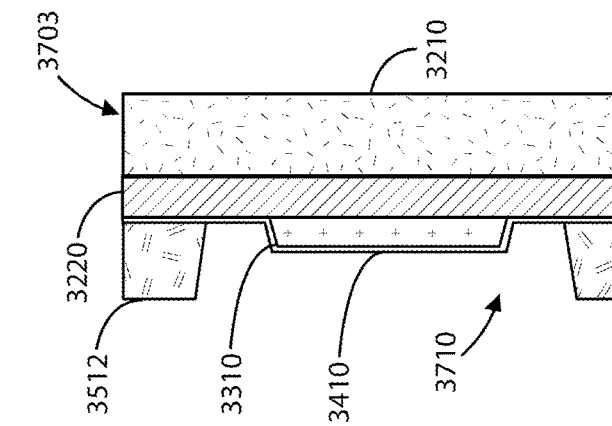
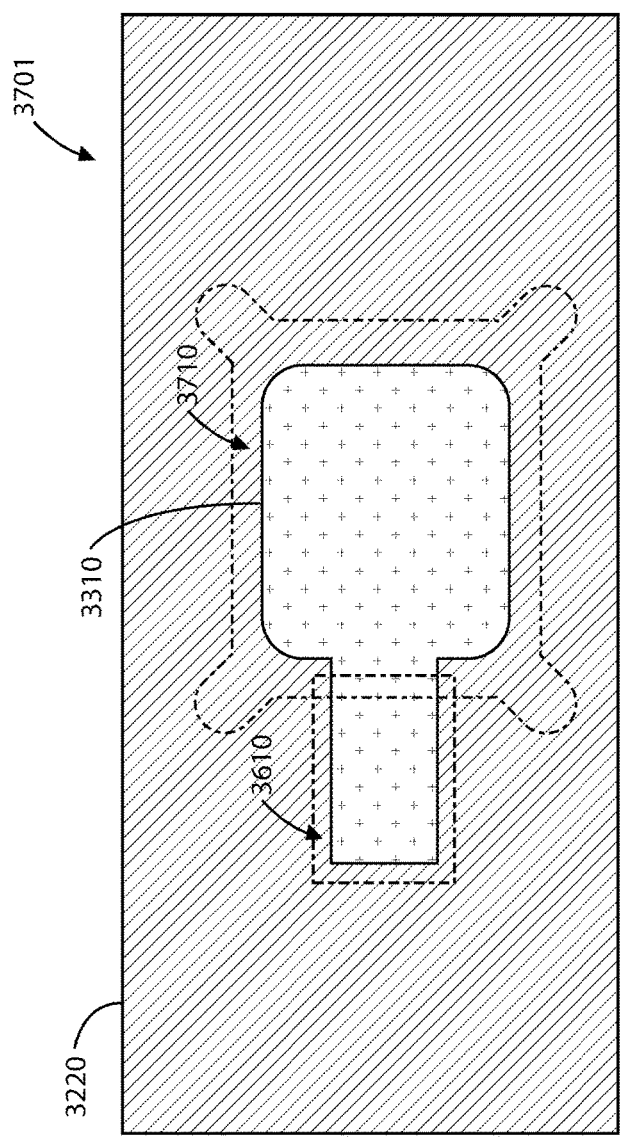
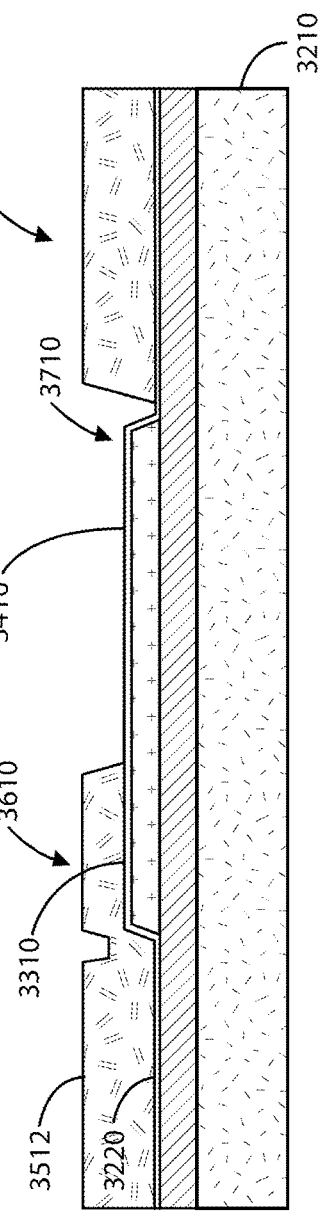
FIG. 37A
FIG. 37B
FIG. 37C

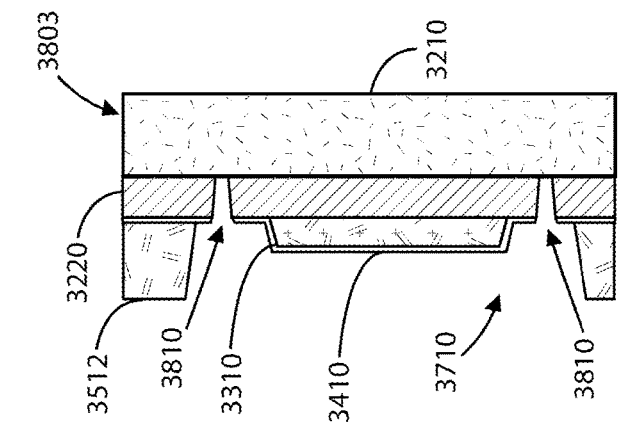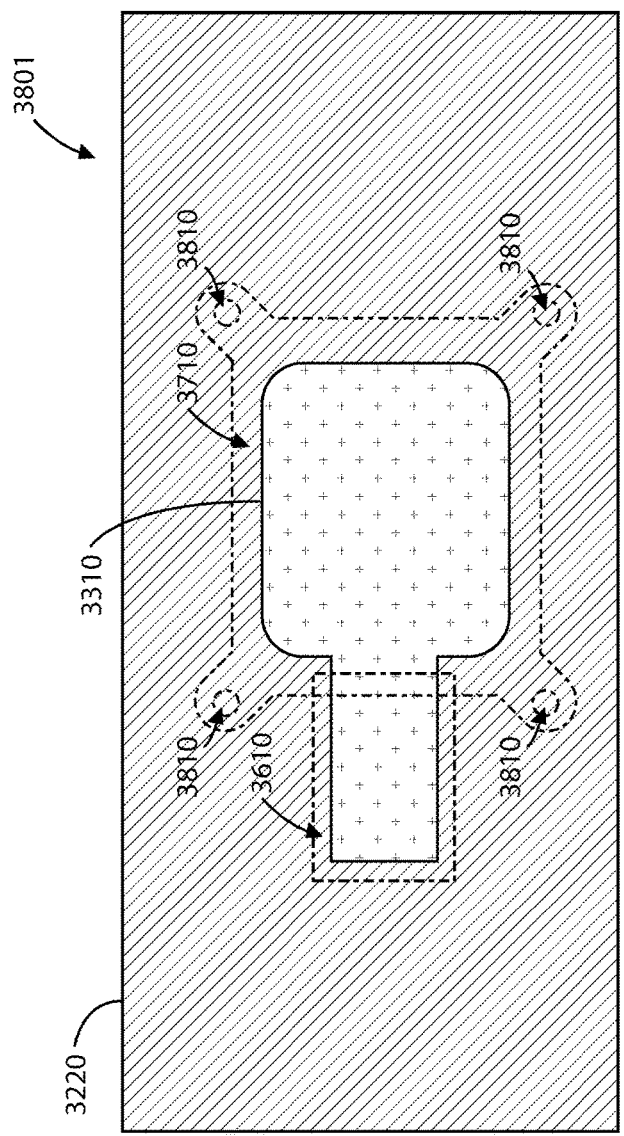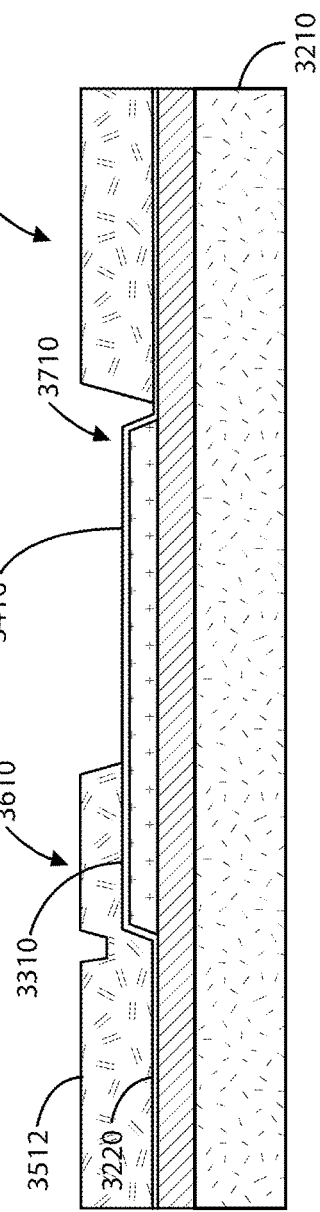

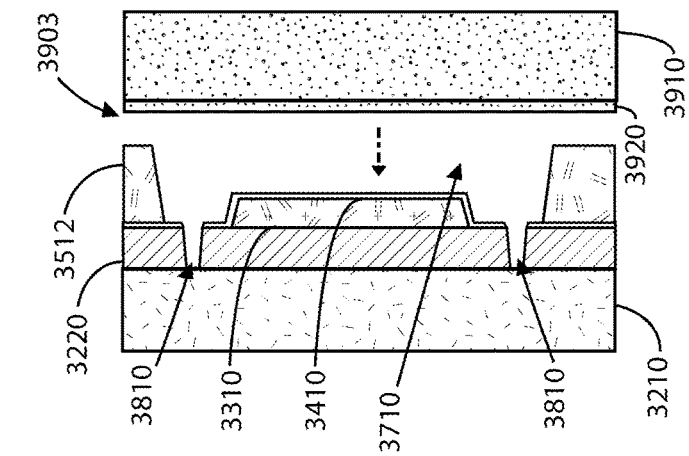
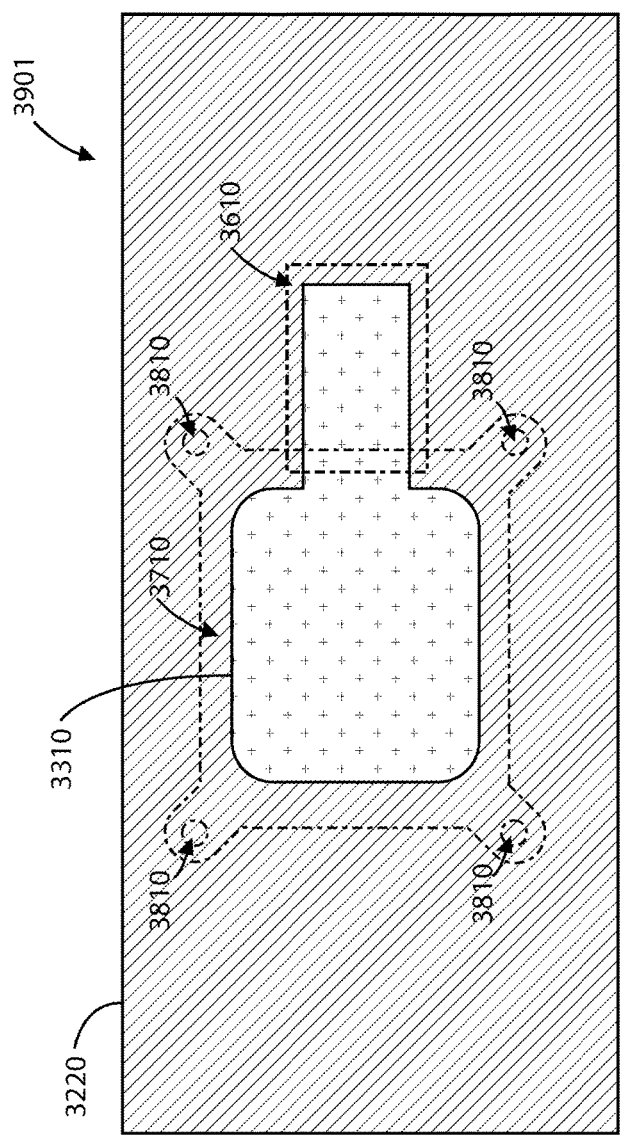
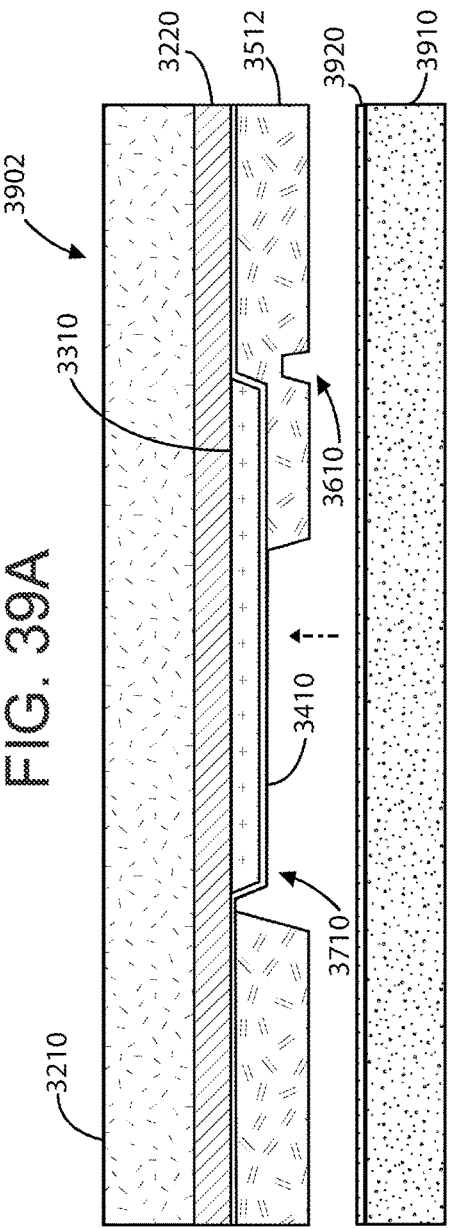

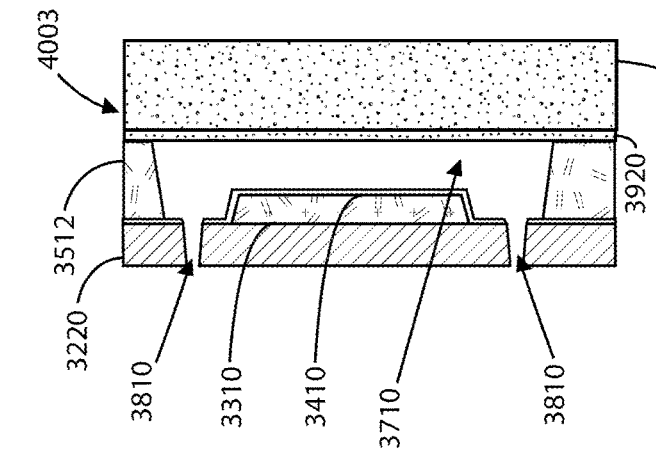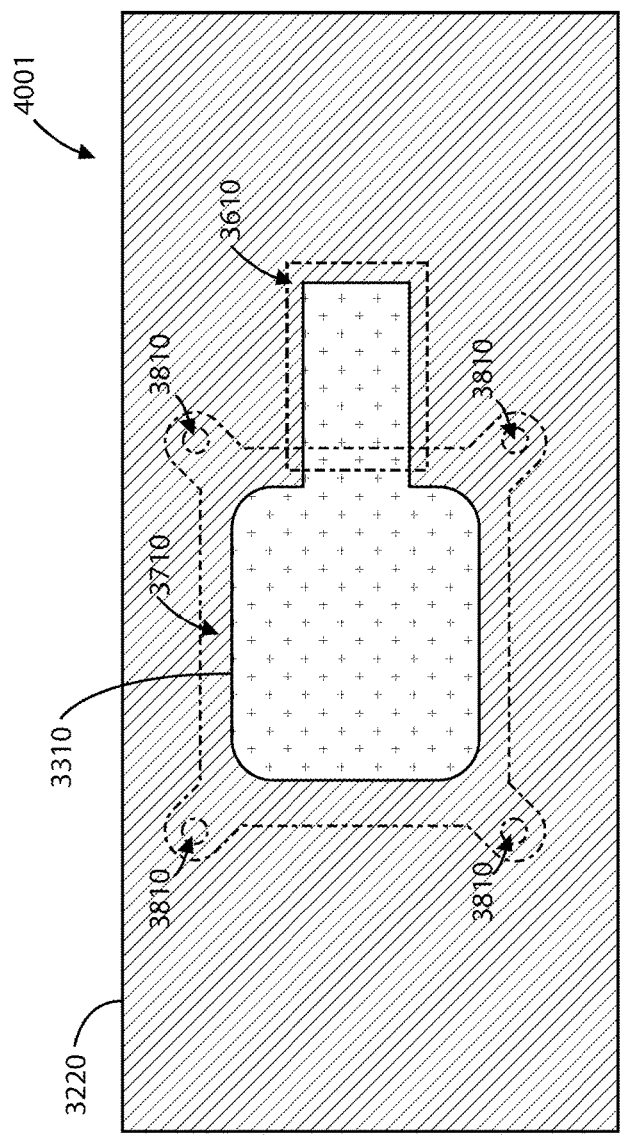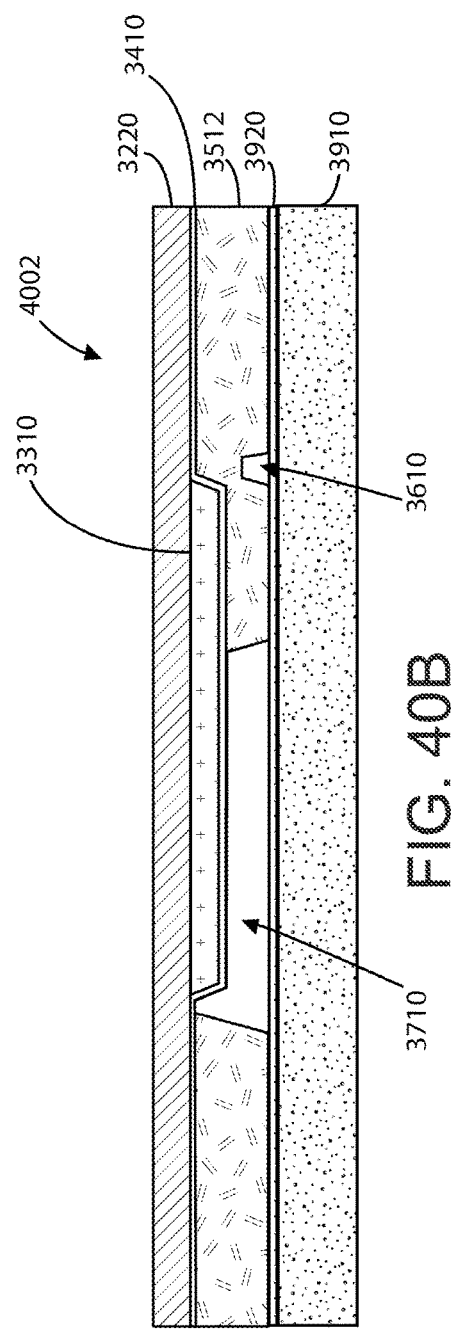

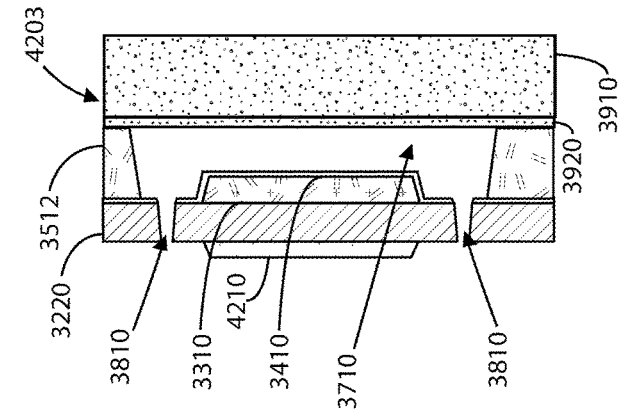
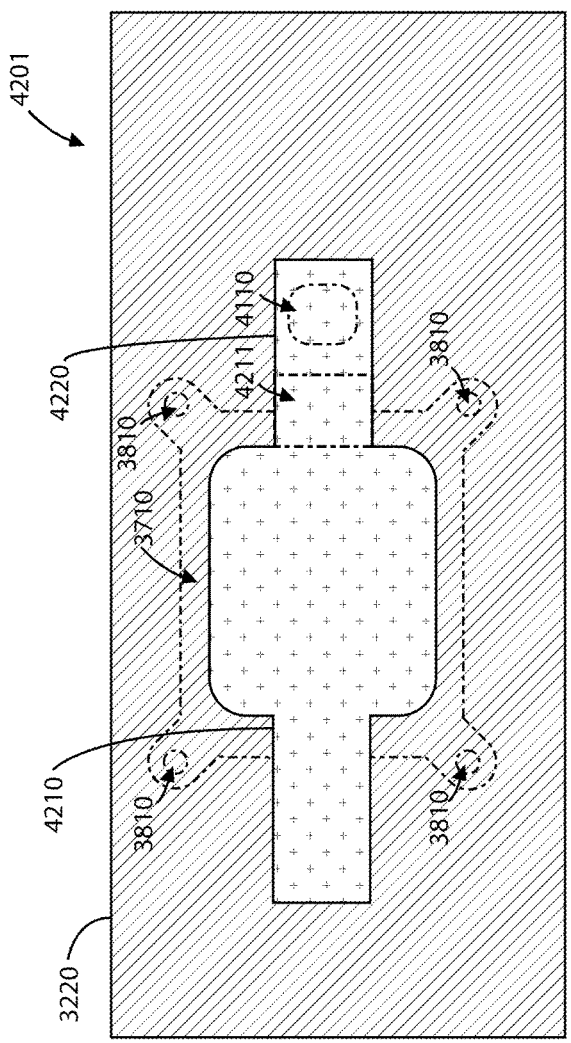
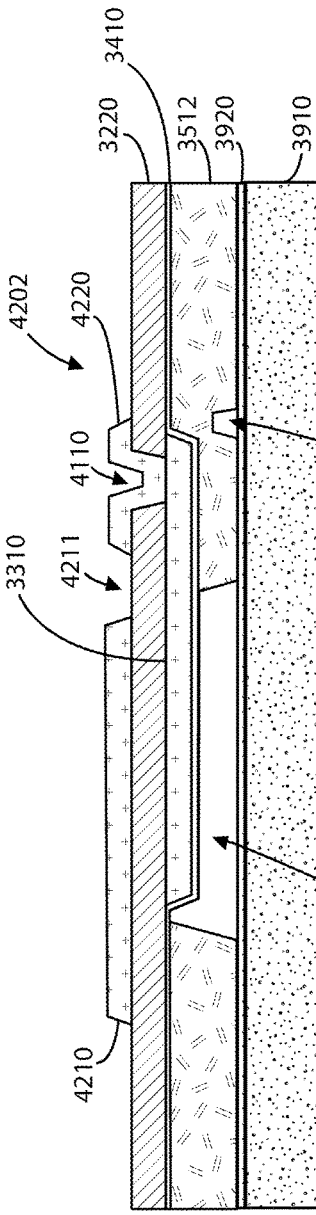
FIG. 42C
FIG. 42A
FIG. 42B

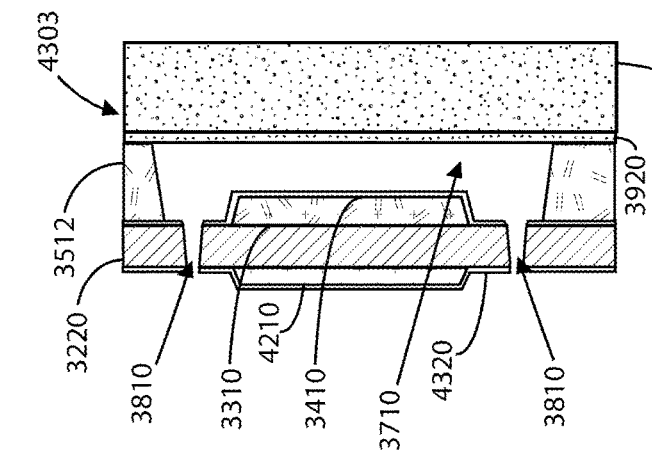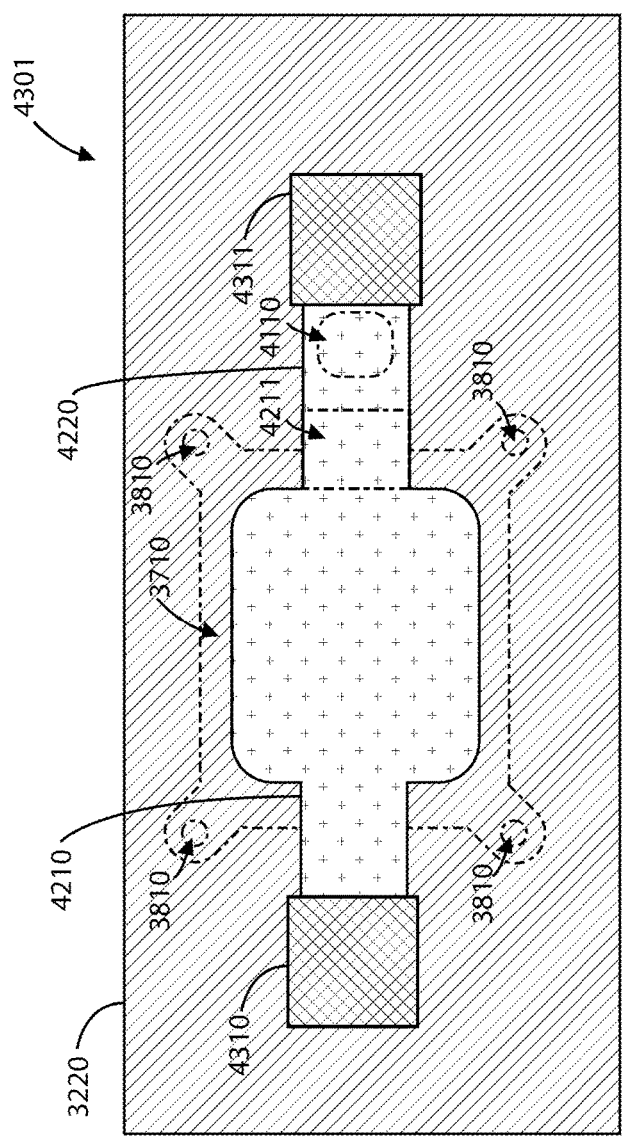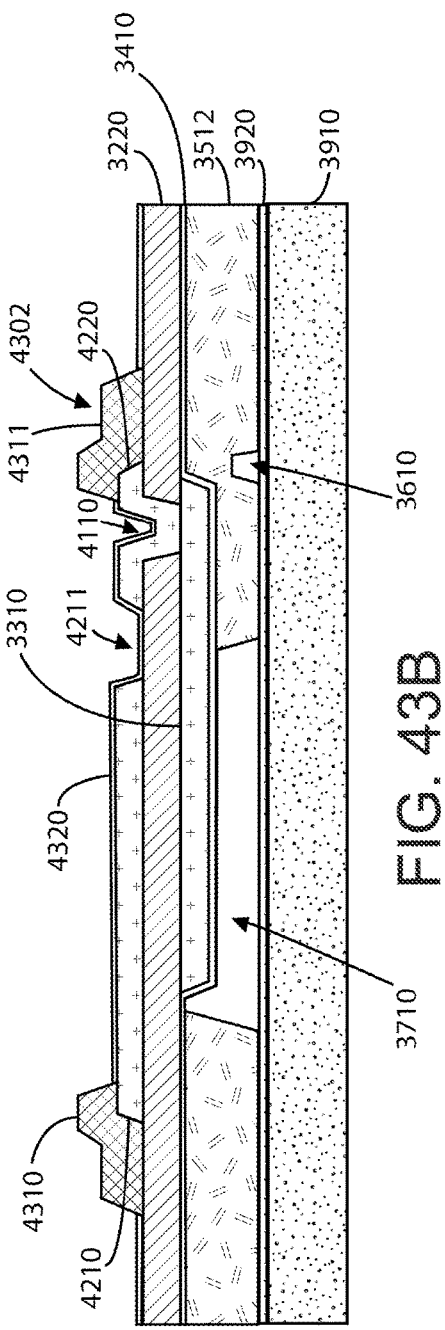

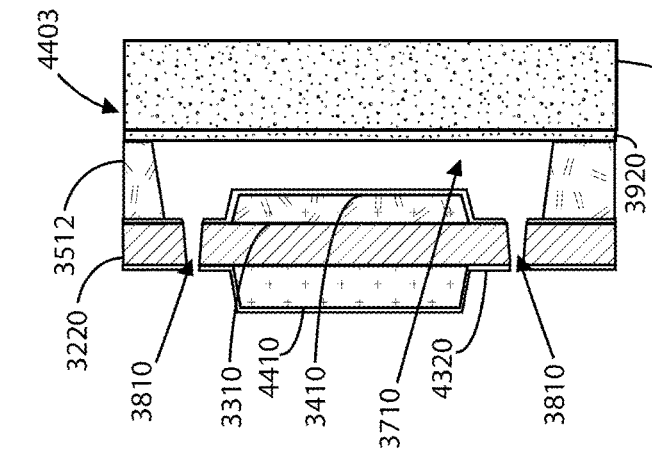
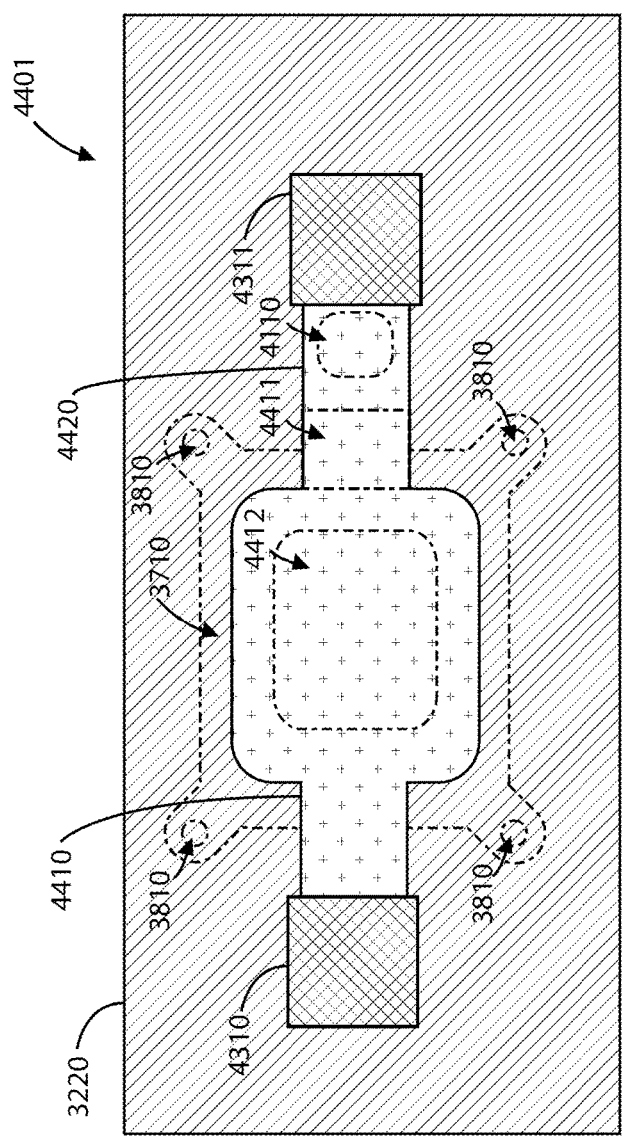
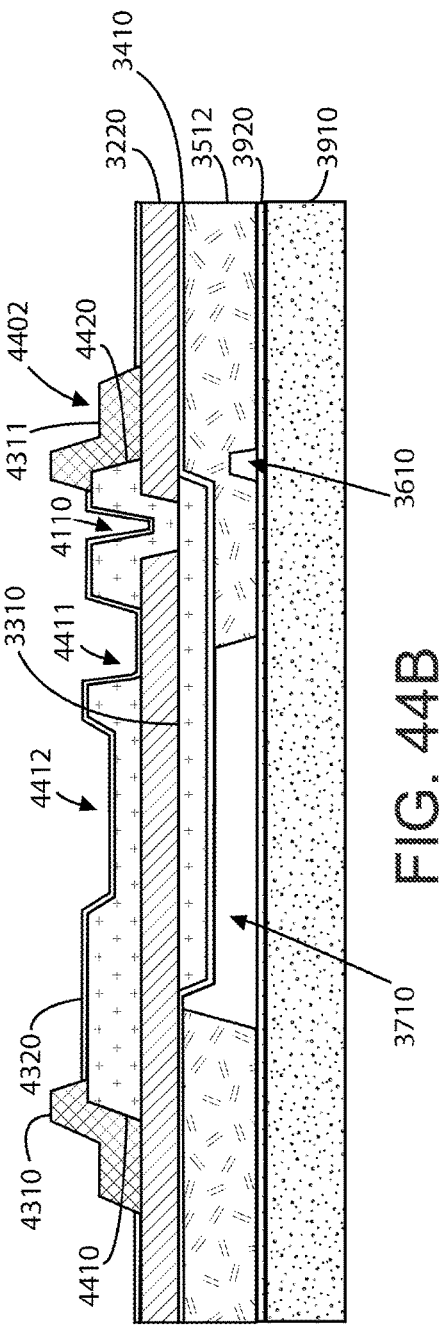
FIG. 44A
FIG. 44B
FIG. 44C

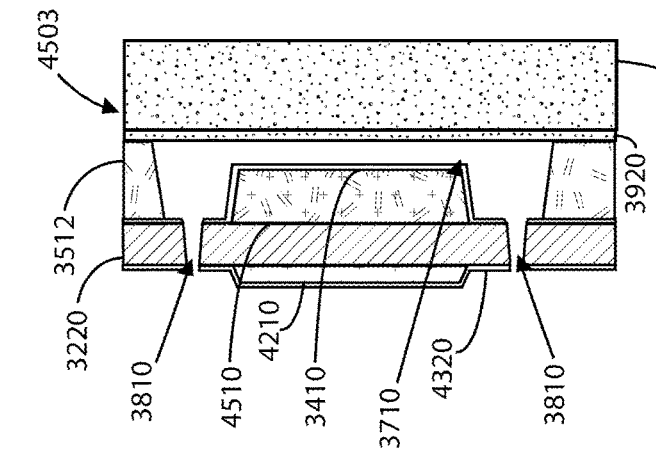
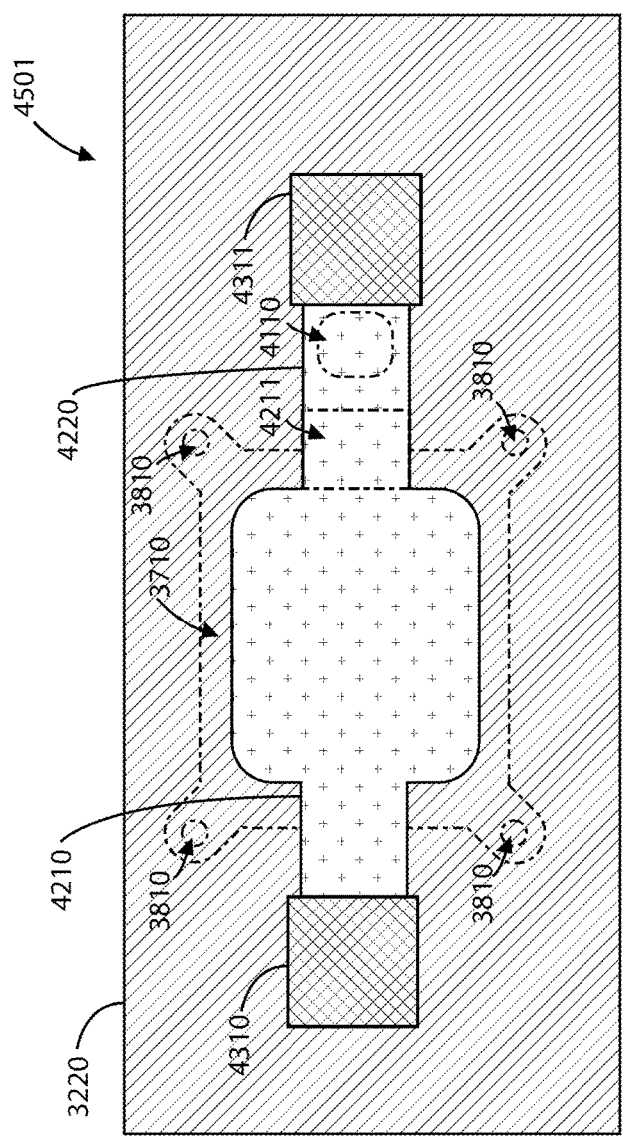
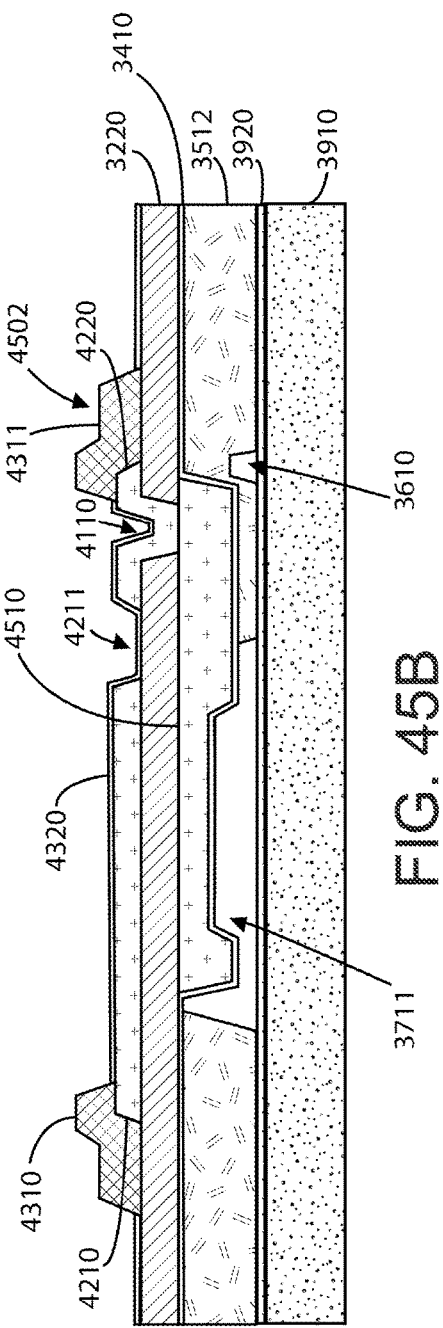

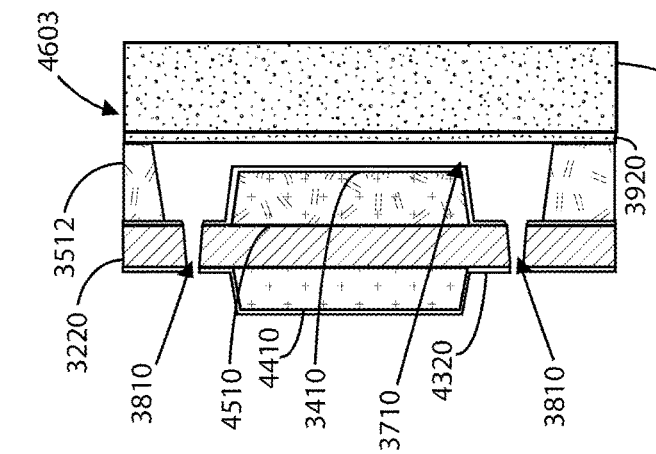
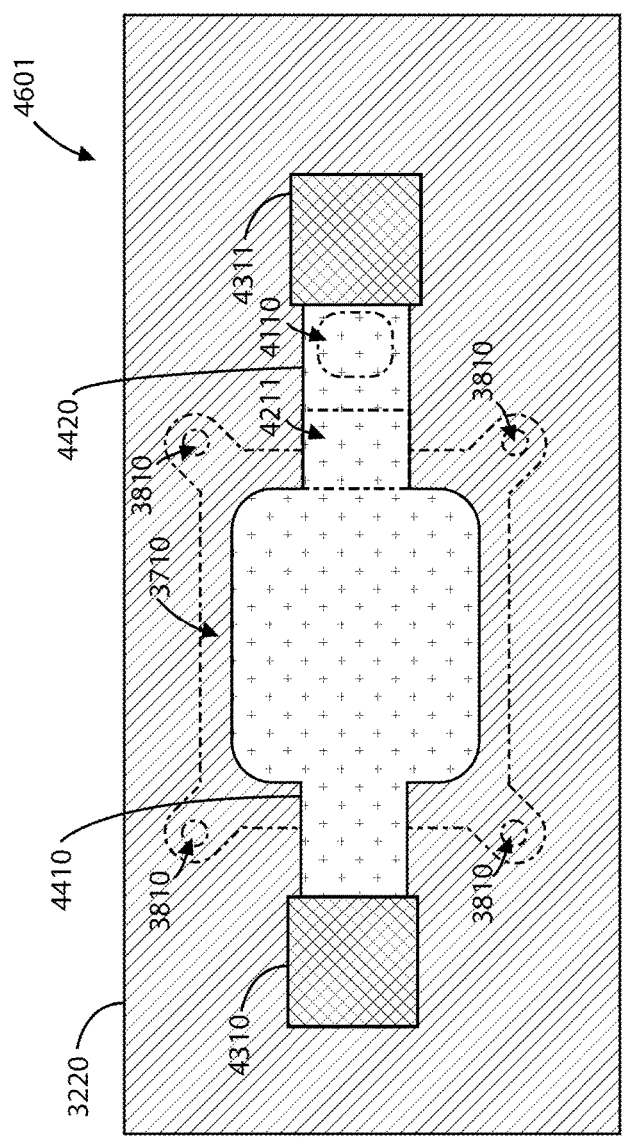
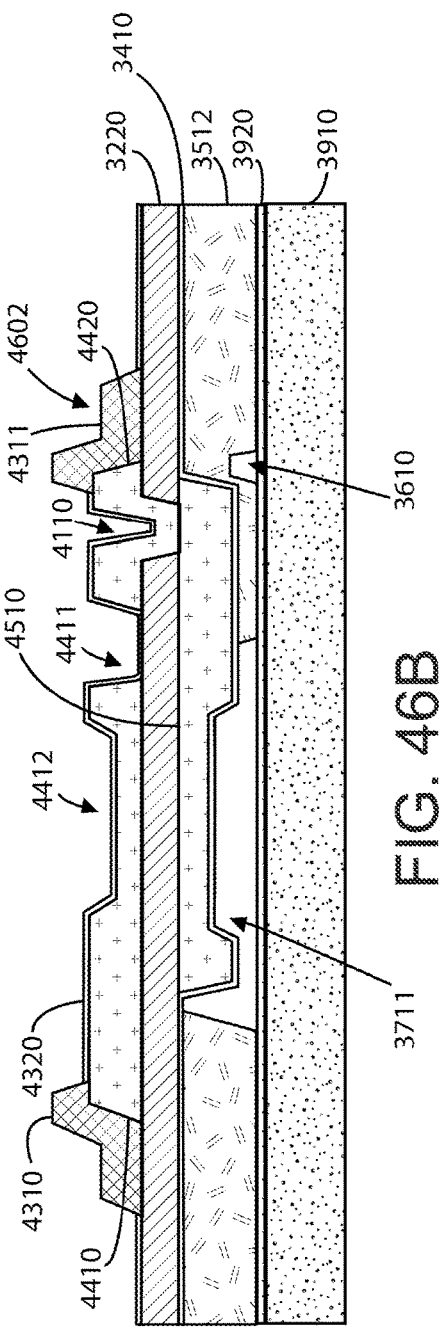

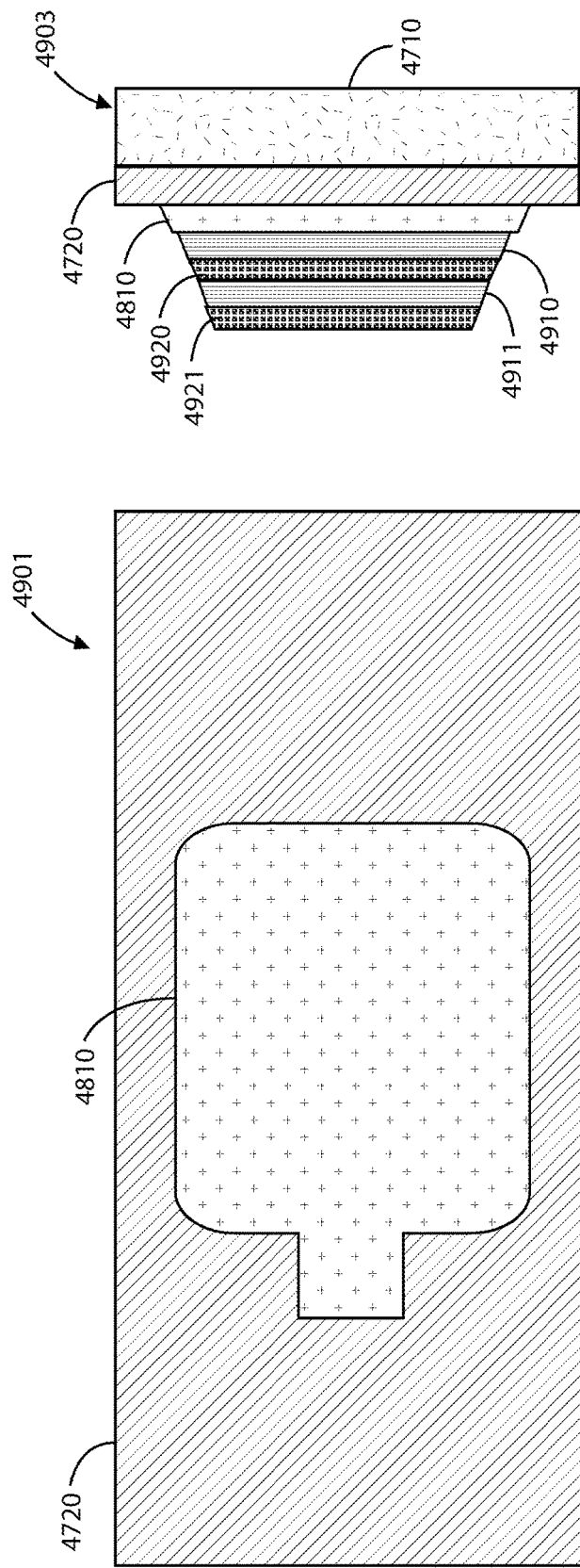
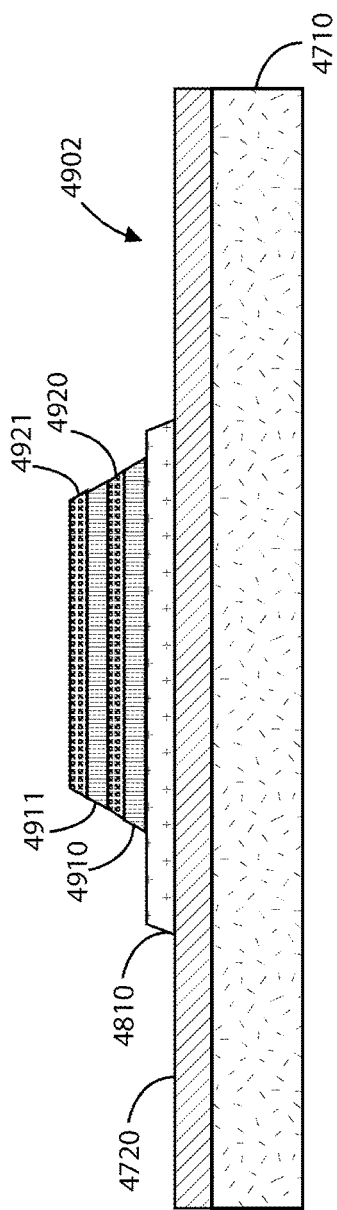
FIG. 49A
FIG. 49B
FIG. 49C

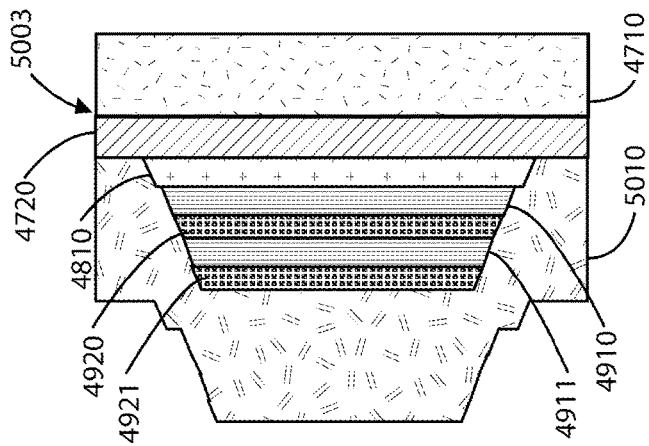
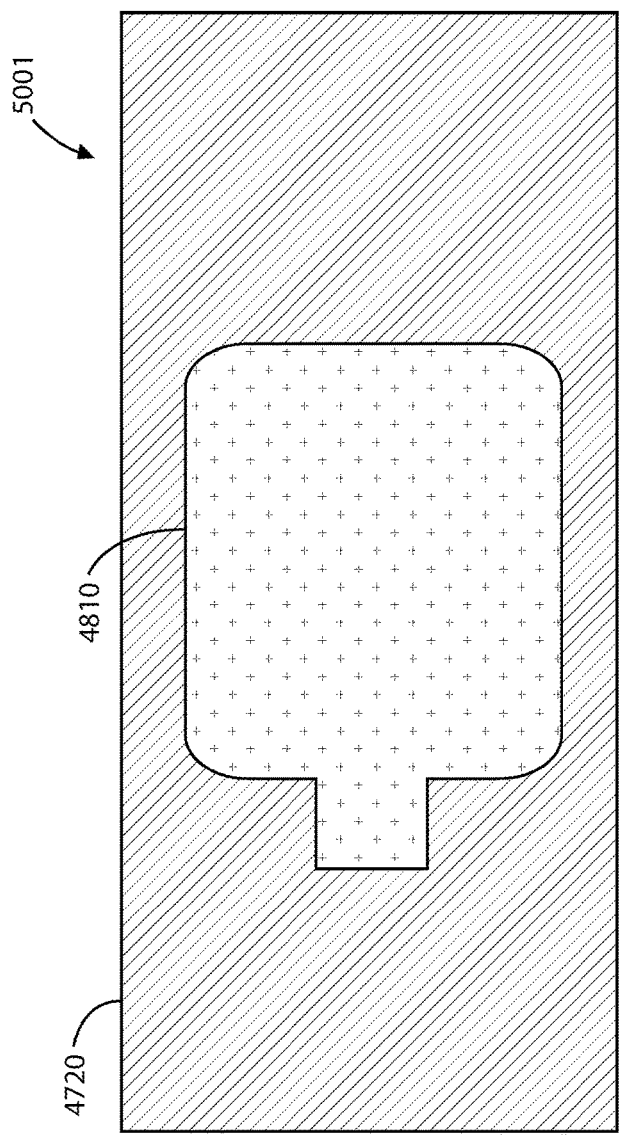
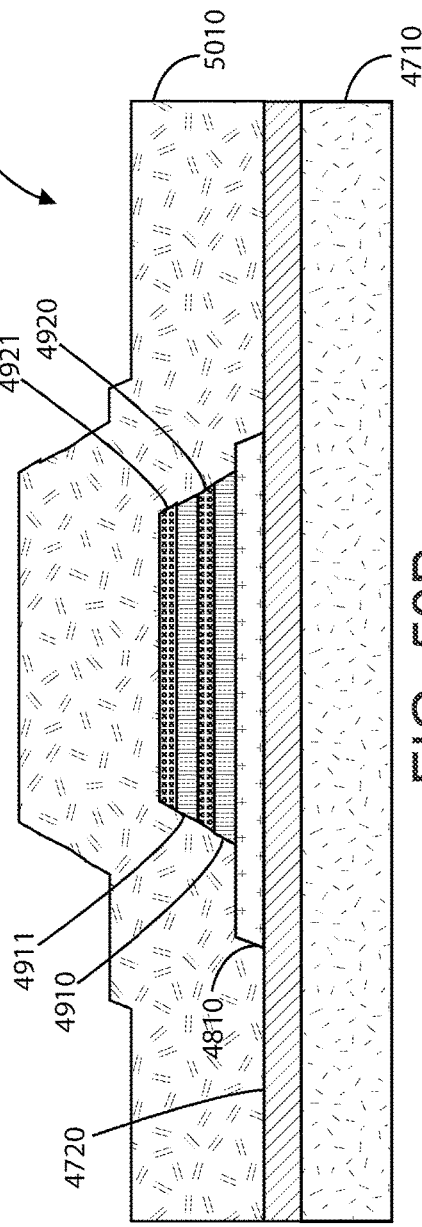

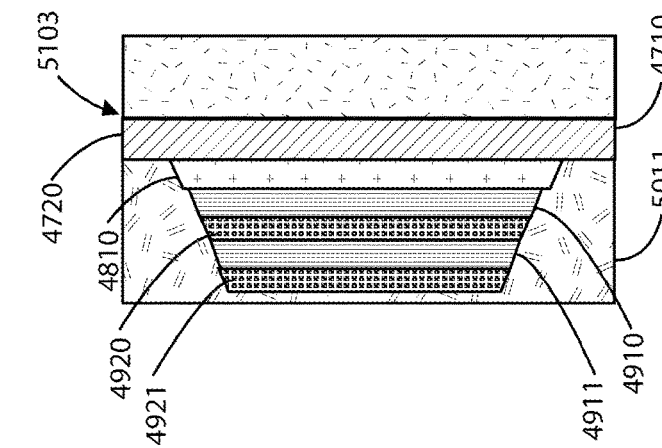
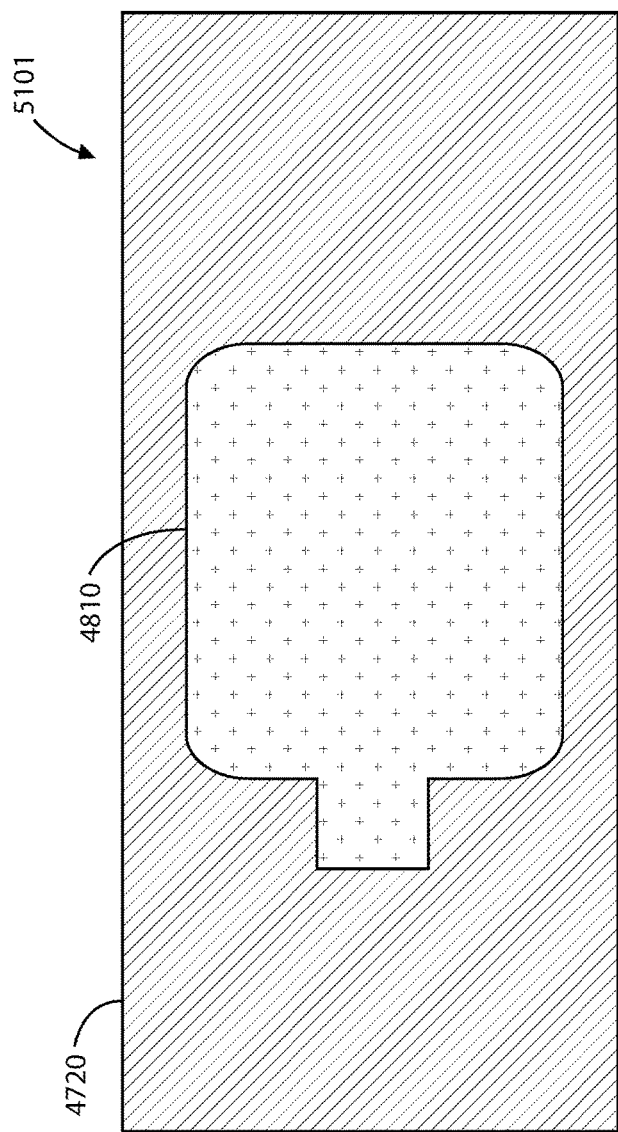
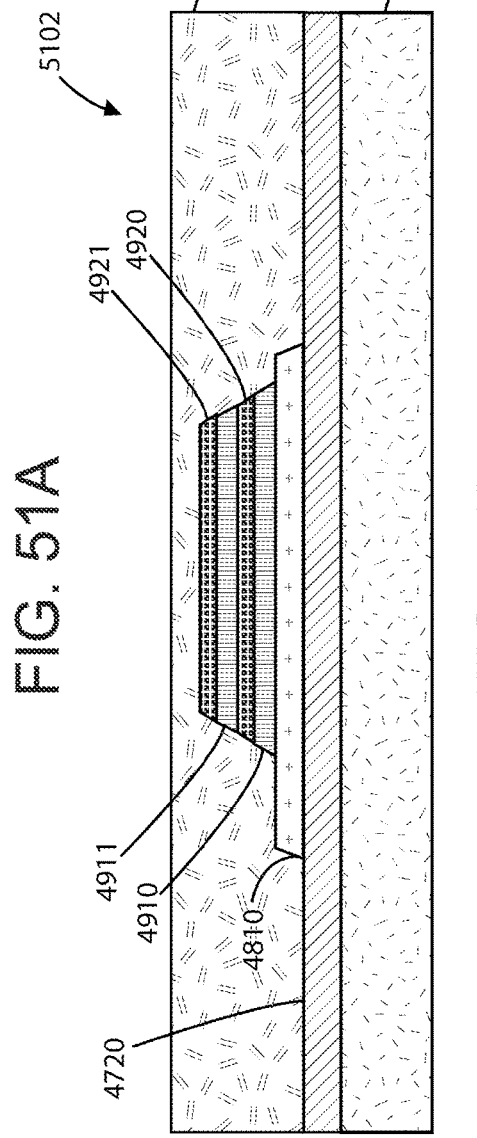

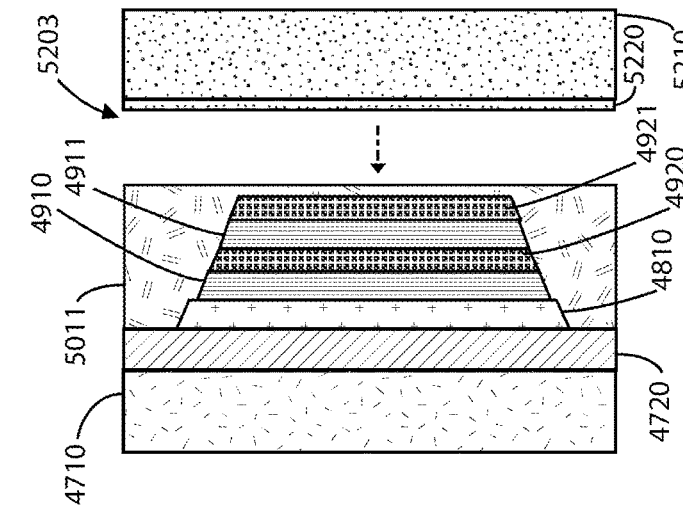
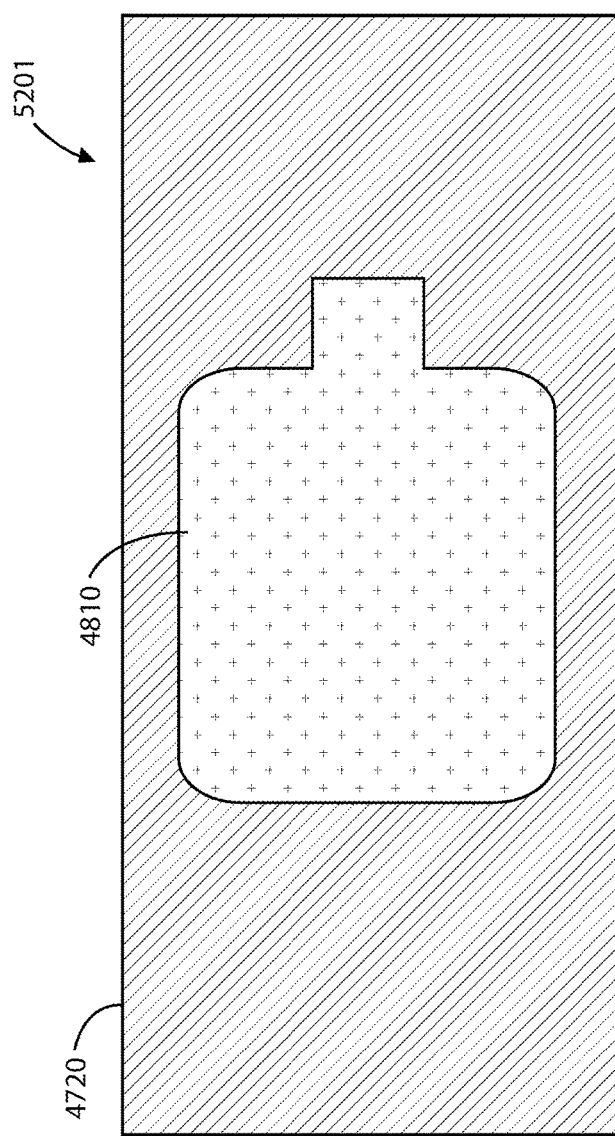
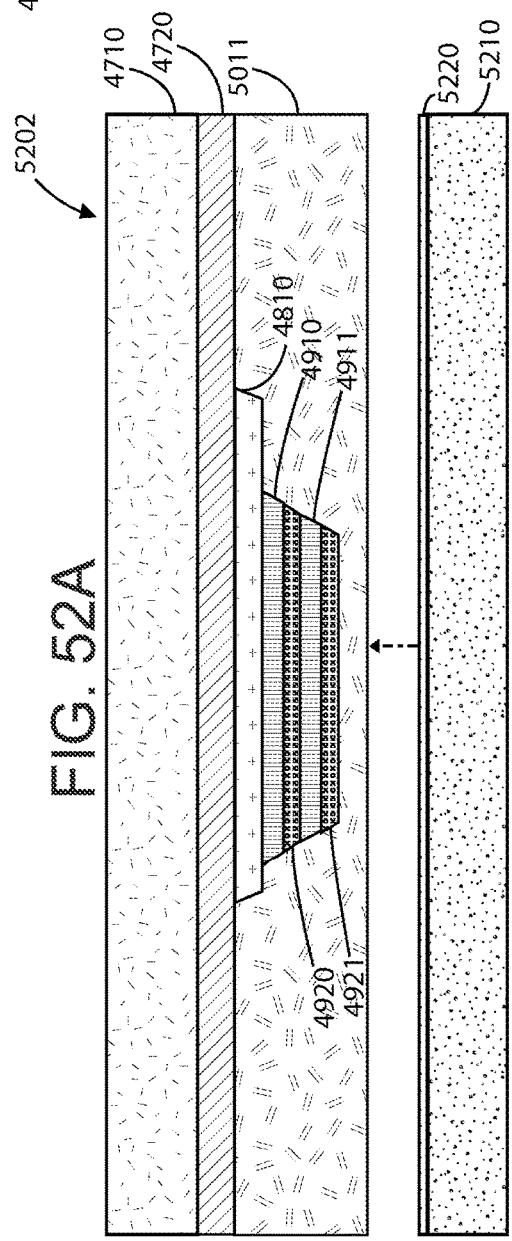
FIG. 52A
FIG. 52B
FIG. 52C

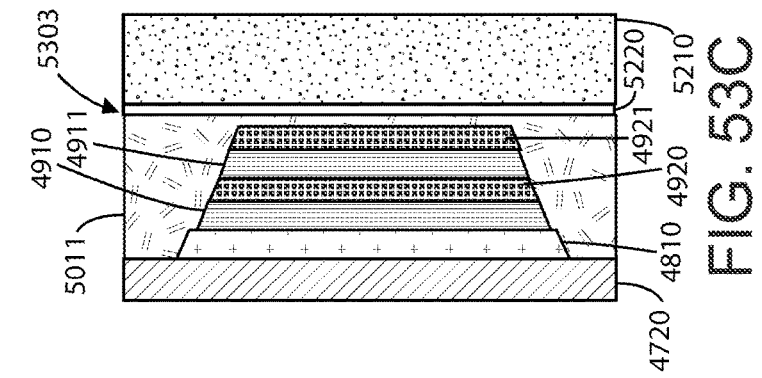
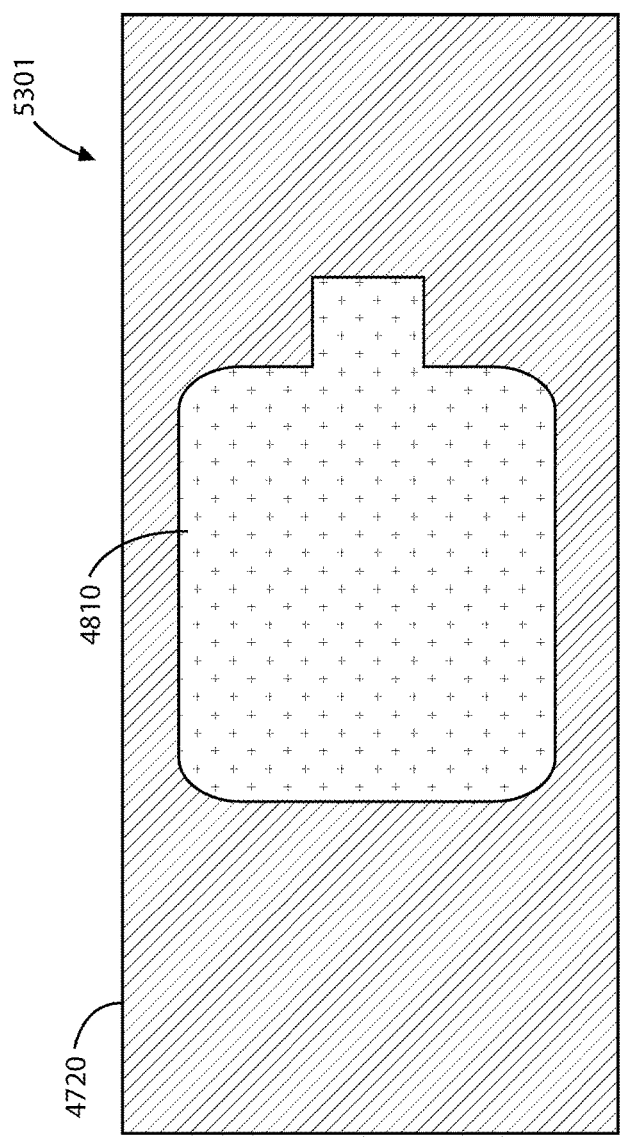
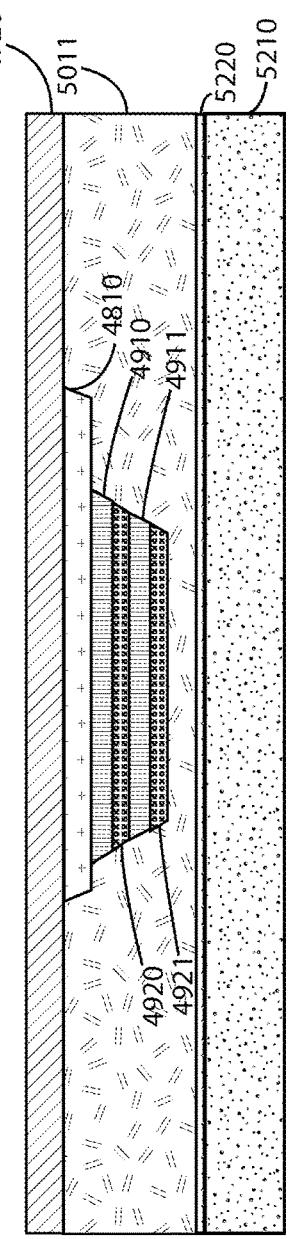

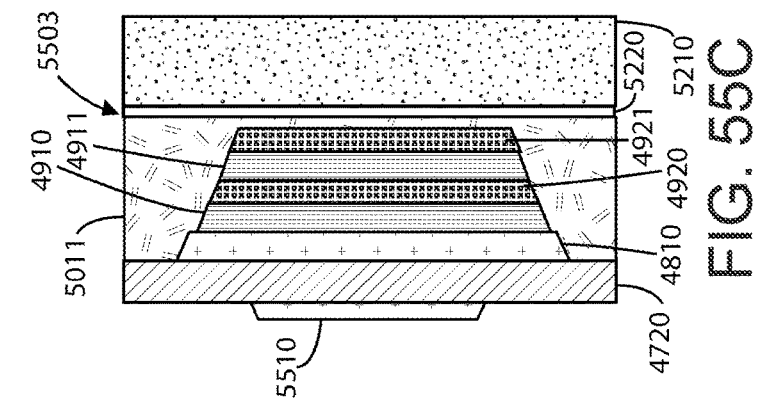
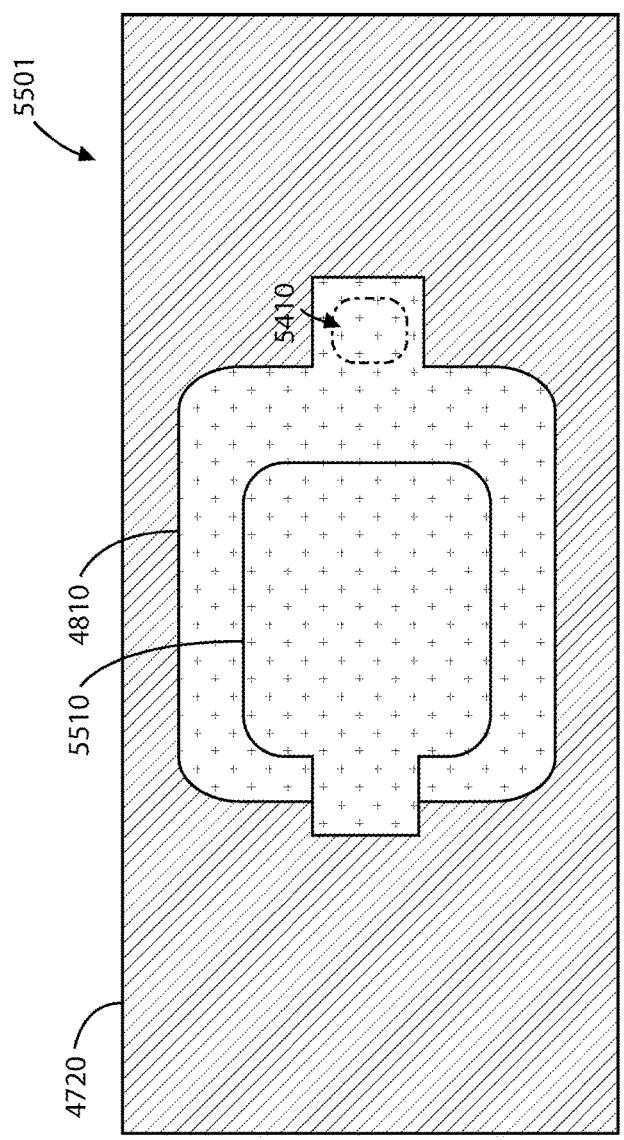
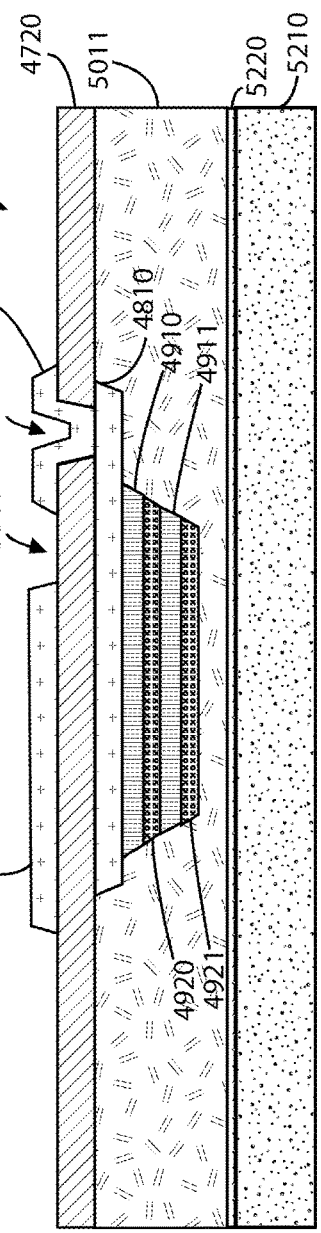

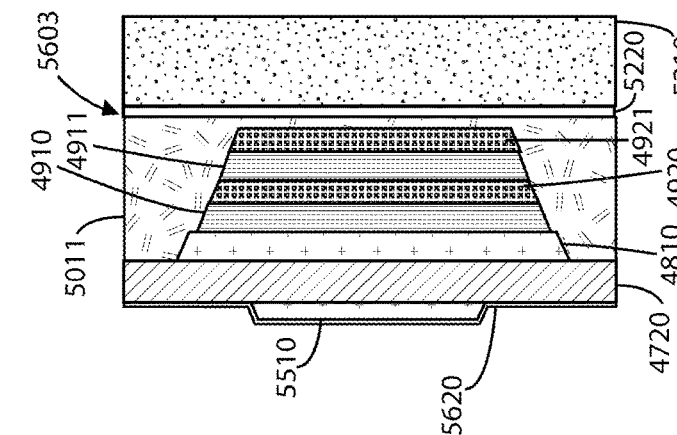
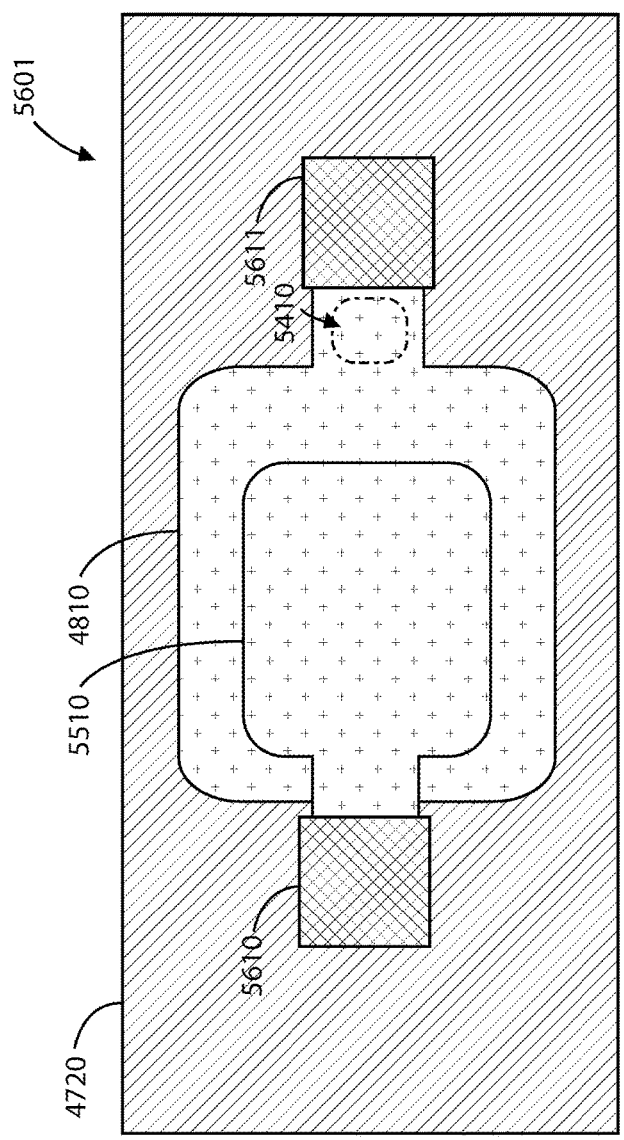
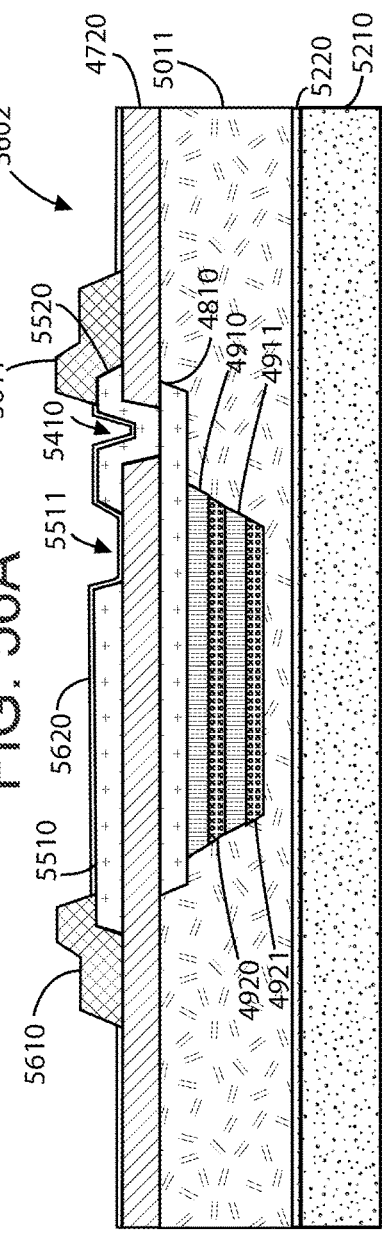

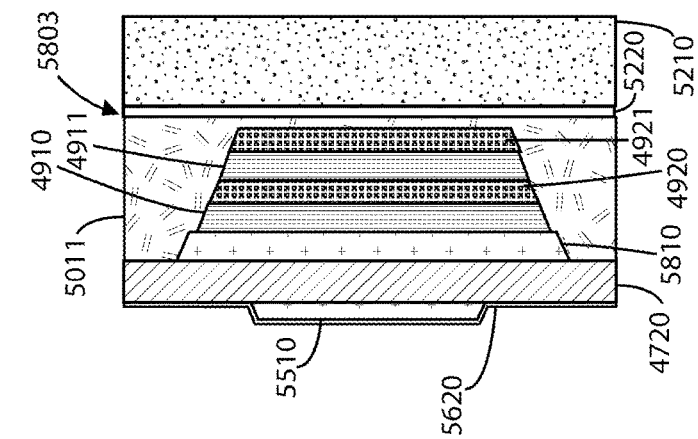
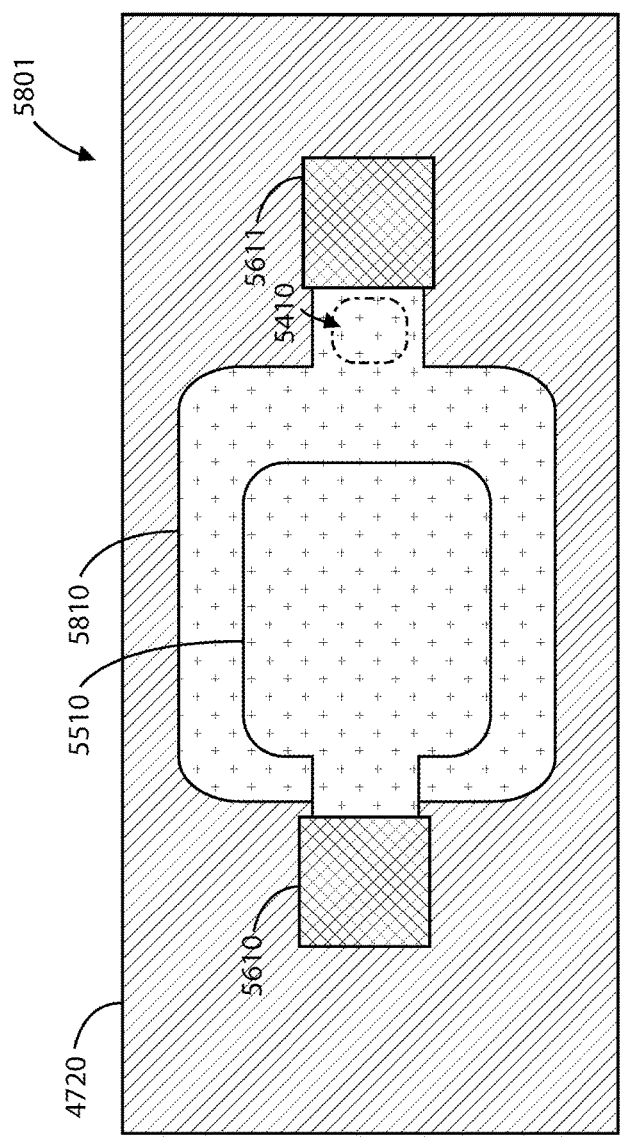
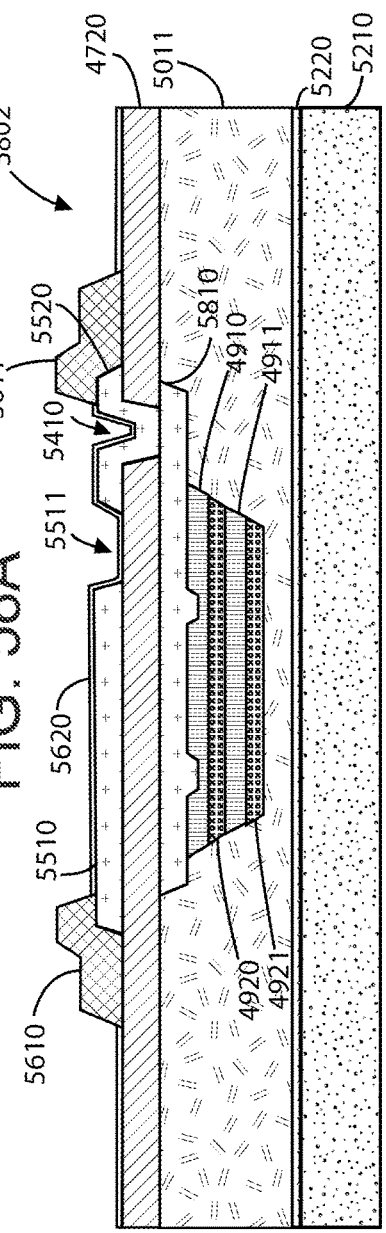
FIG. 58A
FIG. 58B
FIG. 58C

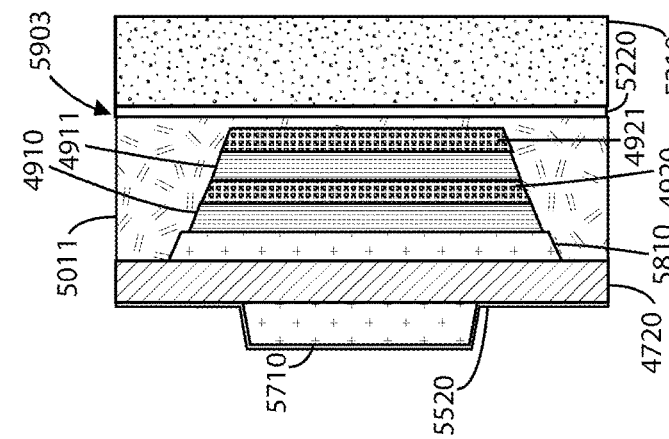
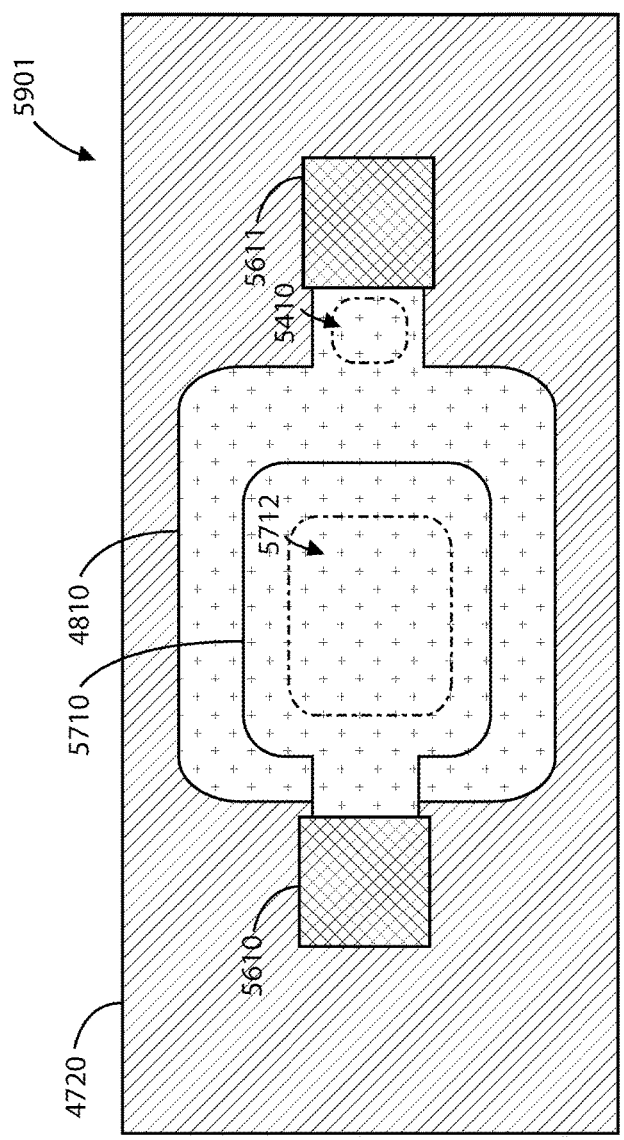
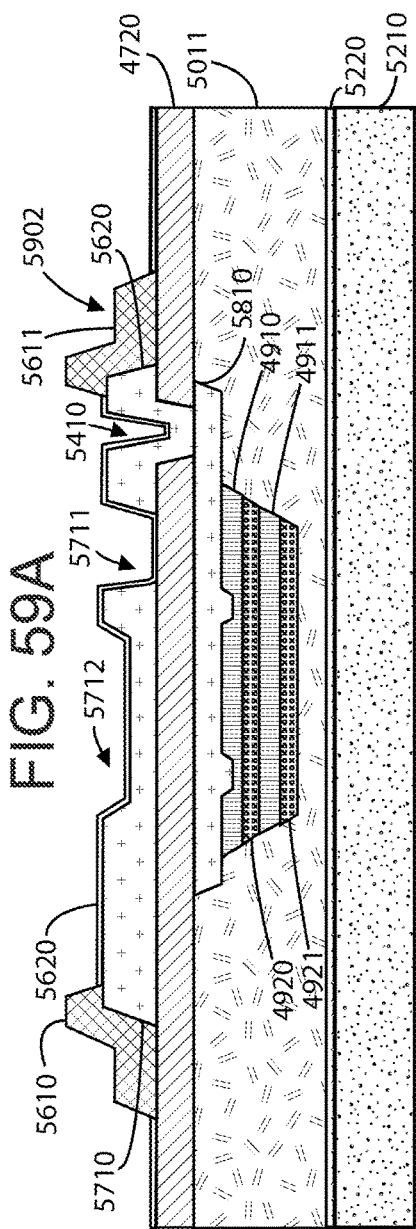
FIG. 59C
FIG. 59A
FIG. 59B

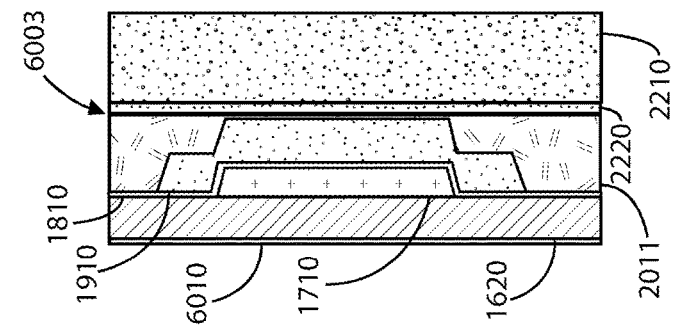
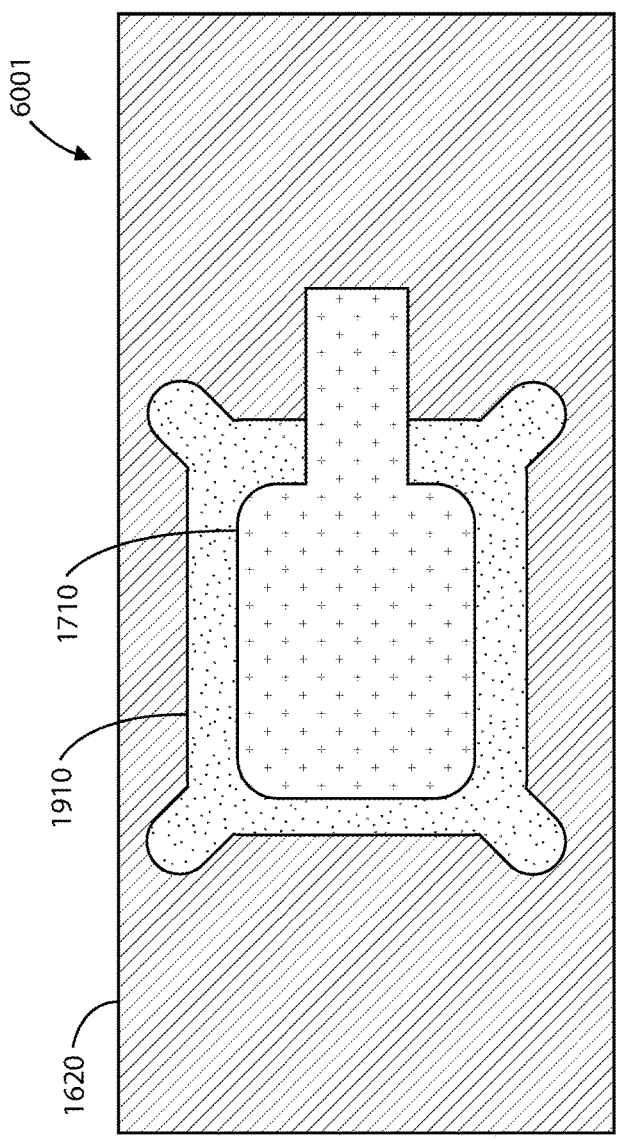
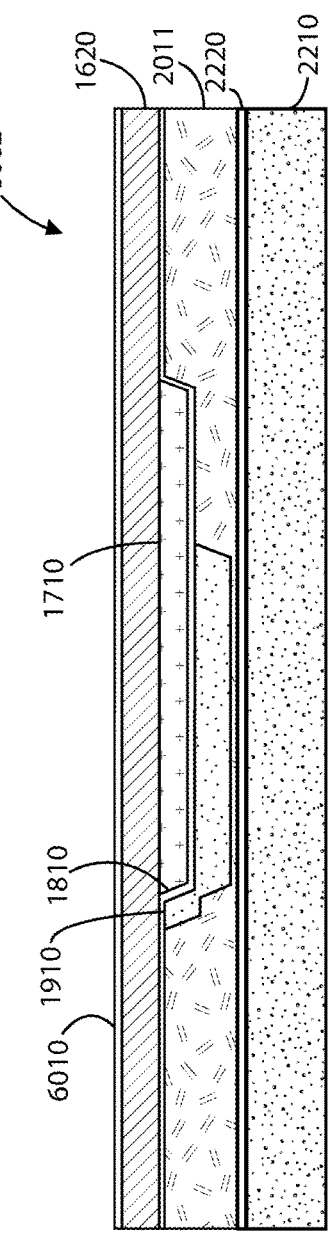

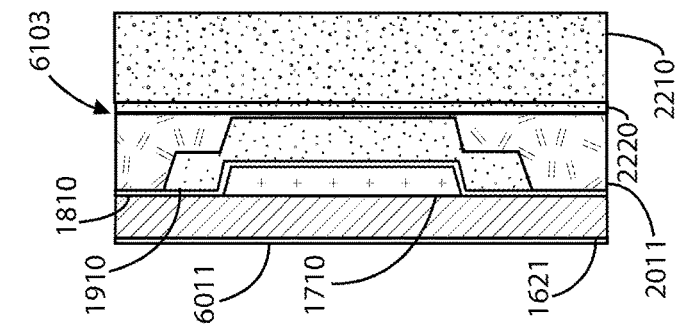
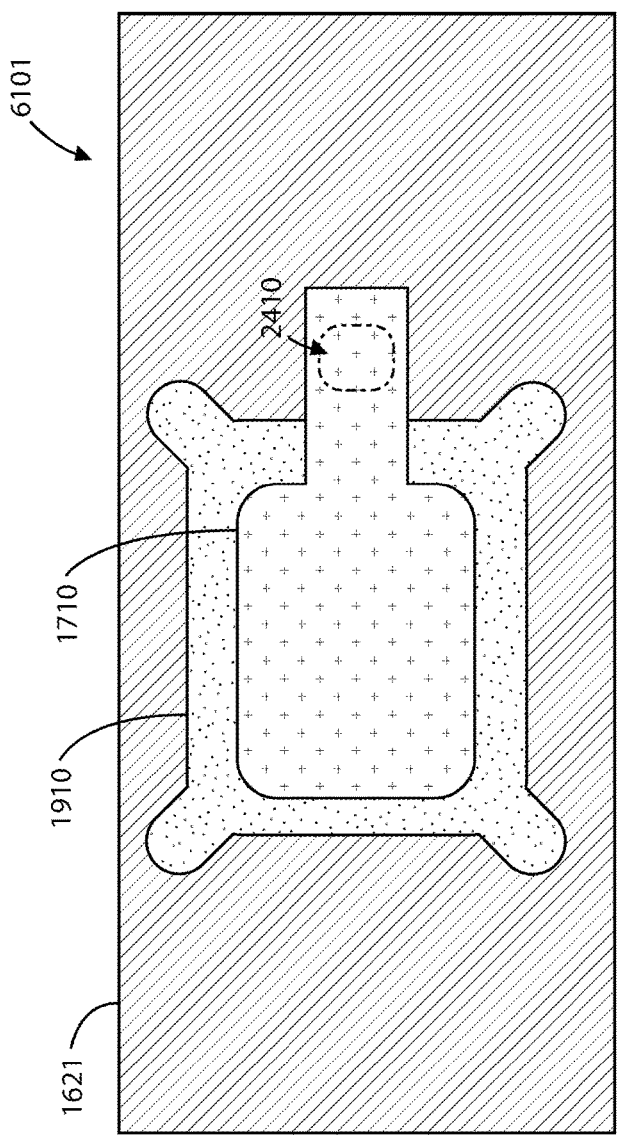
FIG. 61A
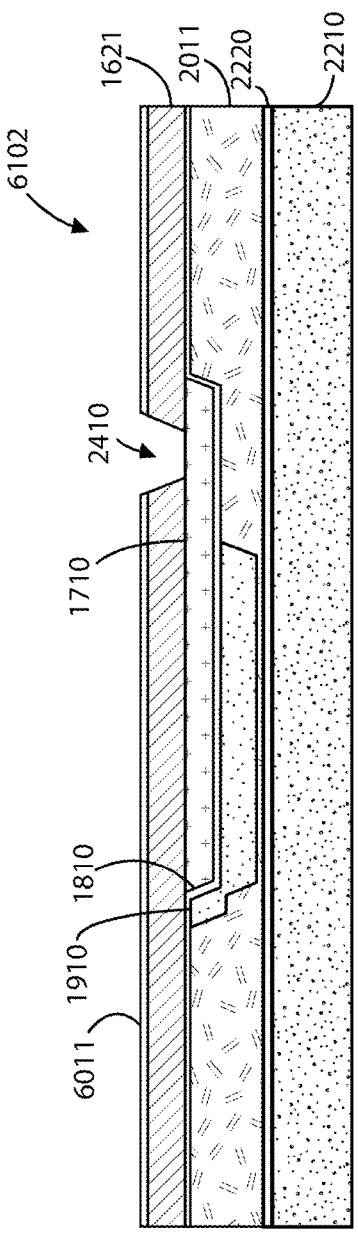
FIG. 61B
FIG. 61C

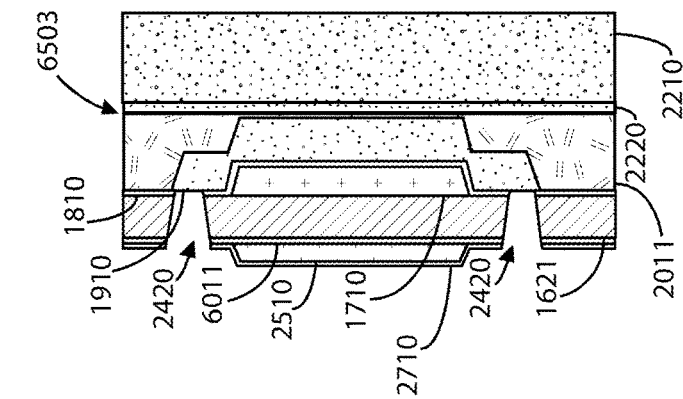
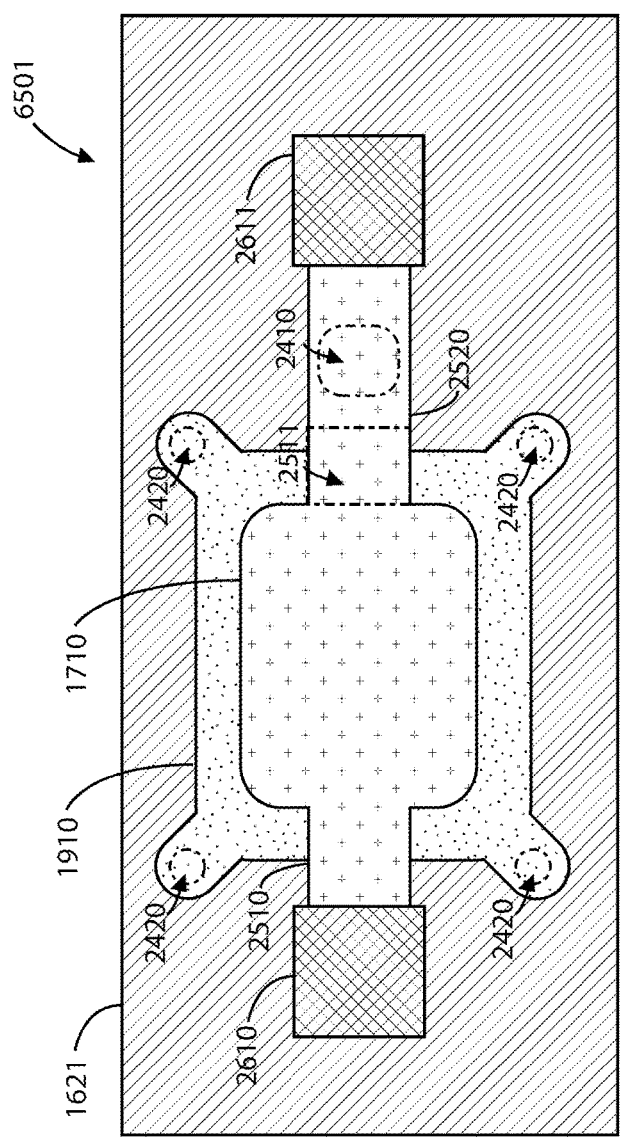
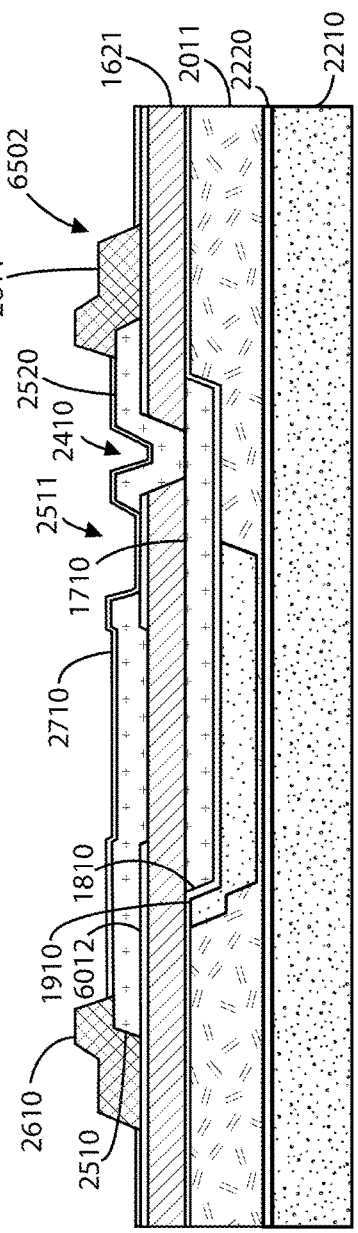
FIG. 65C
FIG. 65A
FIG. 65B

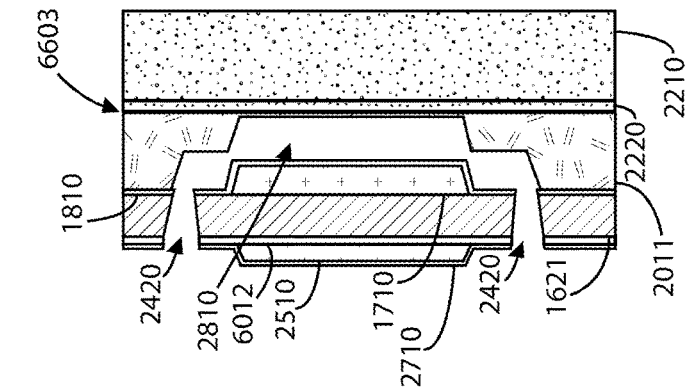
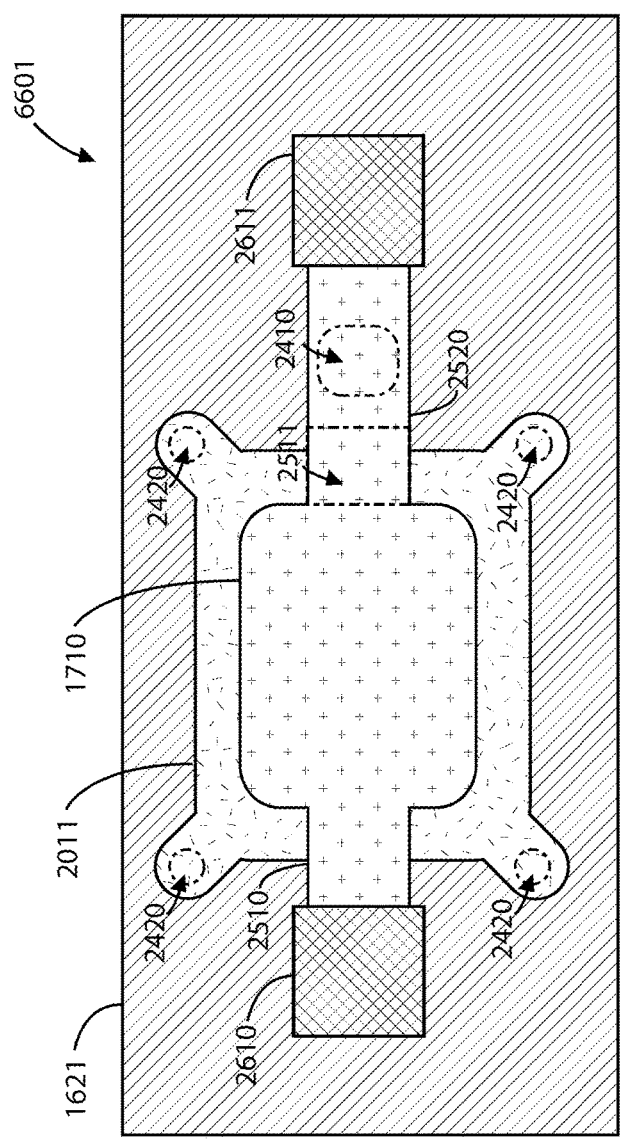
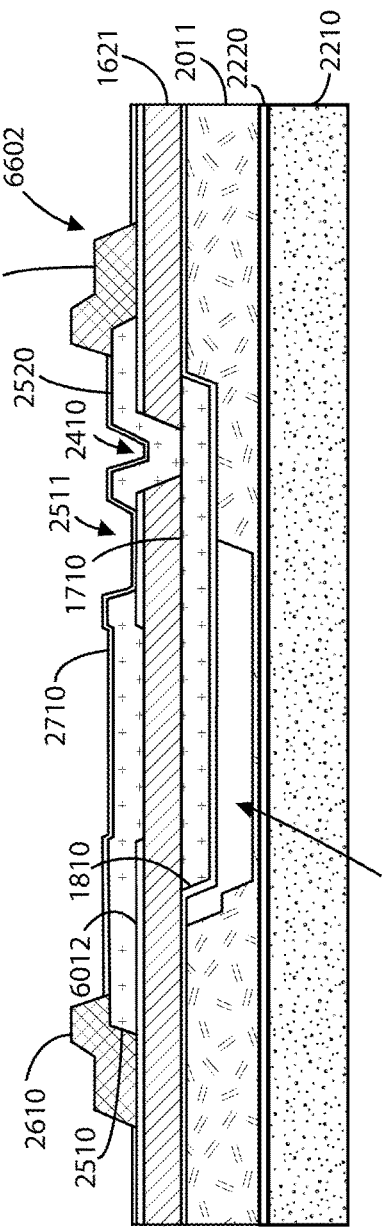

PIEZOELECTRIC ACOUSTIC RESONATOR WITH DIELECTRIC PROTECTIVE LAYER MANUFACTURED WITH PIEZOELECTRIC THIN FILM TRANSFER PROCESS

CROSS-REFERENCES TO RELATED APPLICATIONS

The present application is a continuation-in-part application of U.S. patent application Ser. No. 16/433,849, titled "PIEZOELECTRIC ACOUSTIC RESONATOR MANUFACTURED WITH PIEZOELECTRIC THIN FILM TRANSFER PROCESS," filed Jun. 6, 2019, which is a continuation of U.S. patent application Ser. No. 15/784,919 filed Oct. 16, 2017, now U.S. Pat. No. 10,355,659, which is a continuation-in-part application of U.S. patent application Ser. No. 15/068,510 filed Mar. 11, 2016, now U.S. Pat. No. 10,217,930.

BACKGROUND OF THE INVENTION

The present invention relates generally to electronic devices. More particularly, the present invention provides techniques related to a method of manufacture and a structure for bulk acoustic wave resonator devices, single crystal bulk acoustic wave resonator devices, single crystal filter and resonator devices, and the like. Merely by way of example, the invention has been applied to a single crystal resonator device for a communication device, mobile device, computing device, among others.

Mobile telecommunication devices have been successfully deployed world-wide. Over a billion mobile devices, including cell phones and smartphones, were manufactured in a single year and unit volume continues to increase year-over-year. With ramp of 4G/LTE in about 2012, and explosion of mobile data traffic, data rich content is driving the growth of the smartphone segment—which is expected to reach 2B per annum within the next few years. Coexistence of new and legacy standards and thirst for higher data rate requirements is driving RF complexity in smartphones. Unfortunately, limitations exist with conventional RF technology that is problematic, and may lead to drawbacks in the future.

With 4G LTE and 5G growing more popular by the day, wireless data communication demands high performance RF filters with frequencies around 5 GHz and higher. Bulk acoustic wave resonators (BAWR) using crystalline piezoelectric thin films are leading candidates for meeting such demands. Current BAWRs using polycrystalline piezoelectric thin films are adequate for bulk acoustic wave (BAW) filters operating at frequencies ranging from 1 to 3 GHz; however, the quality of the polycrystalline piezoelectric films degrades quickly as the thicknesses decrease below around 0.5 um, which is required for resonators and filters operating at frequencies around 5 GHz and above. Single crystalline or epitaxial piezoelectric thin films grown on compatible crystalline substrates exhibit good crystalline quality and high piezoelectric performance even down to very thin thicknesses, e.g., 0.4 um. Even so, there are challenges to using and transferring single crystal piezoelectric thin films in the manufacture of BAWR and BAW filters.

From the above, it is seen that techniques for improving methods of manufacture and structures for acoustic resonator devices are highly desirable.

BRIEF SUMMARY OF THE INVENTION

According to the present invention, techniques generally related to electronic devices are provided. More particularly, the present invention provides techniques related to a method of manufacture and structure for bulk acoustic wave resonator devices, single crystal resonator devices, single crystal filter and resonator devices, and the like. Merely by way of example, the invention has been applied to a single crystal resonator device for a communication device, mobile device, computing device, among others.

In an example, the present invention provides a method and structure for a transfer process using a sacrificial layer for single crystal acoustic resonator devices. In this example, a BAWR with an air reflection cavity is formed. A single crystalline or epitaxial piezoelectric thin film is grown on a crystalline substrate. A first electrode is deposited on the surface of the piezoelectric film and patterned. A first passivation layer or etch-protection layer is deposited over the patterned first electrode layer. A sacrificial layer is deposited over the passivation layer and is then etched. A support layer is deposited over the sacrificial layer. The support layer is planarized or polished and then bonded to a substrate wafer. The crystalline substrate is removed via grinding and/or etching to expose the second surface of the single crystalline piezoelectric film. The piezoelectric film is etched to form VIA's and etch access holes for the sacrificial layer. A second electrode is deposited over the second surface of the piezoelectric film. A second passivation layer is deposited over the second electrode layer and patterned. A contact layer for proving and electrical connection to other circuits is deposited and patterned. The sacrificial layer can then be etched to make the air reflection cavity at one side of the BAW resonator.

In an example, the present invention provides a method and structure for a cavity bond transfer process for single crystal acoustic resonator devices. In this example, a BAW resonator with an air reflection cavity is formed. The process is similar to that previously described, except that the air cavity is etched inside the support layer after deposition of the support layer rather than using a sacrificial layer.

In an example, the present invention provides a method and structure for a solidly mounted transfer process for single crystal acoustic resonator devices. In this example, a BAW resonator with a reflector structure (e.g., Bragg-type reflector) is formed with single crystalline or epitaxial piezoelectric film. Compared to the previous examples, the reflector structure is deposited and patterned after the patterning of the first electrode and the first passivation layer. The support layer is deposited over the reflector structure and is planarized for bonding. The reflector structure can be multilayer with alternating low and high impedance layers.

In each of the preceding examples, energy confinement structures can be formed on the first electrode, second electrode, or both. In an example, these energy confinement structures are mass loaded areas surrounding the resonator area. The resonator area is the area where the first electrode, the piezoelectric layer, and the second electrode overlap. The larger mass load in the energy confinement structures lowers a cut-off frequency of the resonator. The cut-off frequency is the lower or upper limit of the frequency at which the acoustic wave can propagate in a direction parallel to the surface of the piezoelectric film. Therefore, the cut-off frequency is the resonance frequency in which the wave is travelling along the thickness direction and thus is determined by the total stack structure of the resonator along the vertical direction. In piezoelectric films (e.g., AlN), acoustic waves with lower frequency than the cut-off frequency can propagate in a parallel direction along the surface of the film, i.e., the acoustic wave exhibits a high-band-cut-off type dispersion characteristic. In this case, the mass loaded area surrounding the resonator provides a barrier preventing the acoustic wave from propagating outside the resonator. By doing so, this feature increases the quality factor (Q) of the resonator and improves the performance of the resonator and, consequently, the filter.

In addition, the top single crystalline piezoelectric layer can be replaced by a polycrystalline piezoelectric film. In such films, the lower part that is close to the interface with the substrate has poor crystalline quality with smaller grain sizes and a wider distribution of the piezoelectric polarization orientation than the upper part of the film close to the surface. This is due to the polycrystalline growth of the piezoelectric film, i.e., the nucleation and initial film have random crystalline orientations. Considering AlN as a piezoelectric material, the growth rate along the c-axis or the polarization orientation is higher than other crystalline orientations that increase the proportion of the grains with the c-axis perpendicular to the growth surface as the film grows thicker. In a typical polycrystalline AlN film with about a 1 um thickness, the upper part of the film close to the surface has better crystalline quality and better alignment in terms of piezoelectric polarization. By using the thin film transfer process contemplated in the present invention, it is possible to use the upper portion of the polycrystalline film in high frequency BAW resonators with very thin piezoelectric films. This can be done by removing a portion of the piezoelectric layer during or after the growth substrate removal process.

In an example, the present invention provides a method for fabricating a bulk acoustic wave resonator device. This method can include providing a piezoelectric substrate having a substrate surface region. This piezoelectric substrate can have a piezoelectric layer formed overlying a seed substrate. A topside metal electrode can be formed overlying a portion of the substrate surface region. The method can include forming a topside micro-trench within a portion of the piezoelectric layer and forming one or more bond pads overlying one or more portions of the piezoelectric layer. A topside metal can be formed overlying a portion of the piezoelectric layer. This topside metal can include a topside metal plug, or a bottom side metal plug, formed within the topside micro-trench and electrically coupled to at least one of the bond pads.

In an example, the method can include thinning the seed substrate to form a thinned seed substrate. A first backside trench can be formed within the thinned seed substrate and underlying the topside metal electrode. A second backside trench can be formed within the thinned seed substrate and underlying the topside micro-trench. Also, the method includes forming a backside metal electrode underlying one or more portions of the thinned seed substrate, within the first backside trench, and underlying the topside metal electrode; and forming a backside metal plug underlying one or more portions of the thinned substrate, within the second backside trench, and underlying the topside micro-trench. The backside metal plug can be electrically coupled to the topside metal plug and the backside metal electrode. The topside micro-trench, the topside metal plug, the second backside trench, and the backside metal plug form a micro-via. In a specific example, both backside trenches can be combined in one trench, where the shared backside trench can include the backside metal electrode underlying the topside metal electrode and the backside metal plug underlying the topside micro-trench.

According to an example, the present invention provides for a method of manufacture and resulting acoustic resonator device using dielectric protection layers (DPL). These DPLs can be configured as embedded oxide layers, or the like. In an example, the DPL protects the piezoelectric layer from etching processes that can produce rough surfaces and reduces parasitic capacitance around the perimeter of the resonator when the DPL's dielectric constant is lower than that of the piezoelectric layer. The DPL can also improve the temperature coefficient of frequency (TCF) of the acoustic resonator device. In an example, the DPLs can have a thickness ranging from about 50 Angstroms to about 10,000 Angstroms, and can include silicon dioxide ($SiO_2$), silicon nitride (SiN), aluminum nitride (AlN), aluminum oxide ($Al_2O_3$), silicon oxycarbide (SiOC), or other oxide materials and the like. The DPLs can be configured between the top electrode and the piezoelectric layer, between the bottom electrode and the piezoelectric layer, or both. A portion of the DPL within the resonator region (i.e., the region where the top electrode, the bottom electrode, and the piezoelectric layer overlap) can be removed such that the piezoelectric layer is in direct contact with the top or bottom electrode. These layers can be used in combination with any of the previously discussed methods of manufacture of acoustic resonator devices.

One or more benefits are achieved over pre-existing techniques using the invention. In particular, the present device can be manufactured in a relatively simple and cost effective manner while using conventional materials and/or methods according to one of ordinary skill in the art. Using the present method, one can create a reliable single crystal based acoustic filter or resonator using multiple ways of three-dimensional stacking through a wafer level process. Such filters or resonators can be implemented in an RF filter device, an RF filter system, or the like. Depending upon the embodiment, one or more of these benefits may be achieved.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIGS. 4D and 4E are simplified diagrams illustrating an alternative method for conducting the method step of forming a topside micro-trench as described in FIG. 4A.

FIGS. 9B and 9C are simplified diagrams illustrating an alternative method for conducting the method step of forming backside trenches, as described in FIG. 9A, and simultaneously singulating a seed substrate according to an embodiment of the present invention.

FIGS. 16A-16C through FIGS. 31A-31C are simplified diagrams illustrating various cross-sectional views of a single crystal acoustic resonator device and of method steps for a transfer process using a sacrificial layer for single crystal acoustic resonator devices according to an example of the present invention.

FIGS. 32A-32C through FIGS. 46A-46C are simplified diagrams illustrating various cross-sectional views of a single crystal acoustic resonator device and of method steps for a cavity bond transfer process for single crystal acoustic resonator devices according to an example of the present invention.

FIGS. 59A-59C are simplified diagrams illustrating various cross-sectional views of a single crystal acoustic resonator device and of method steps for a solidly mounted transfer process for single crystal acoustic resonator devices according to an example of the present invention.

FIGS. 60A-60C through FIGS. 66A-66C are simplified diagrams illustrating a method of manufacturing an acoustic resonator device configured with dielectric protection layers (DPLs) according to examples of the present invention.

DETAILED DESCRIPTION OF THE INVENTION

According to the present invention, techniques generally related to electronic devices are provided. More particularly, the present invention provides techniques related to a method of manufacture and structure for bulk acoustic wave resonator devices, single crystal resonator devices, single crystal filter and resonator devices, and the like. Merely by way of example, the invention has been applied to a single crystal resonator device for a communication device, mobile device, computing device, among others.

Figure 1A:
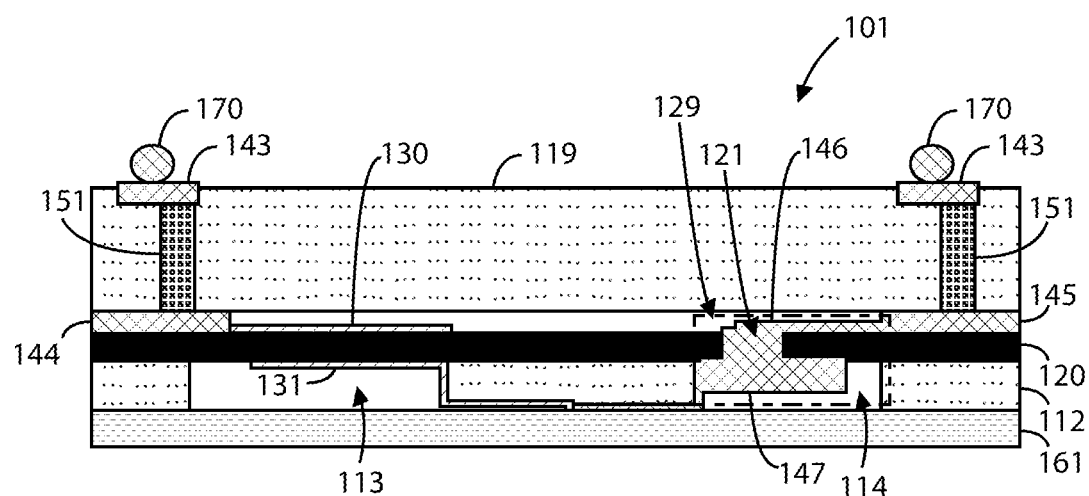
FIG. 1A is a simplified diagram illustrating an acoustic resonator device having topside interconnections according to an example of the present invention.

FIG. 1A is a simplified diagram illustrating an acoustic resonator device 101 having topside interconnections according to an example of the present invention. As shown, device 101 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 101 is depicted with a single micro-via 129, device 101 may have multiple micro-vias. A topside metal electrode 130 is formed overlying the piezoelectric layer 120. A top cap structure is bonded to the piezoelectric layer 120. This top cap structure includes an interposer substrate 119 with one or more through-vias 151 that are connected to one or more top bond pads 143, one or more bond pads 144, and topside metal 145 with topside metal plug 146. Solder balls 170 are electrically coupled to the one or more top bond pads 143.

The thinned substrate 112 has the first and second backside trenches 113, 114. A backside metal electrode 131 is formed underlying a portion of the thinned seed substrate 112, the first backside trench 113, and the topside metal electrode 130. The backside metal plug 147 is formed underlying a portion of the thinned seed substrate 112, the second backside trench 114, and the topside metal 145. This backside metal plug 147 is electrically coupled to the topside metal plug 146 and the backside metal electrode 131. A backside cap structure 161 is bonded to the thinned seed substrate 112, underlying the first and second backside trenches 113, 114. Further details relating to the method of manufacture of this device will be discussed starting from FIG. 2.

Figure 1B:
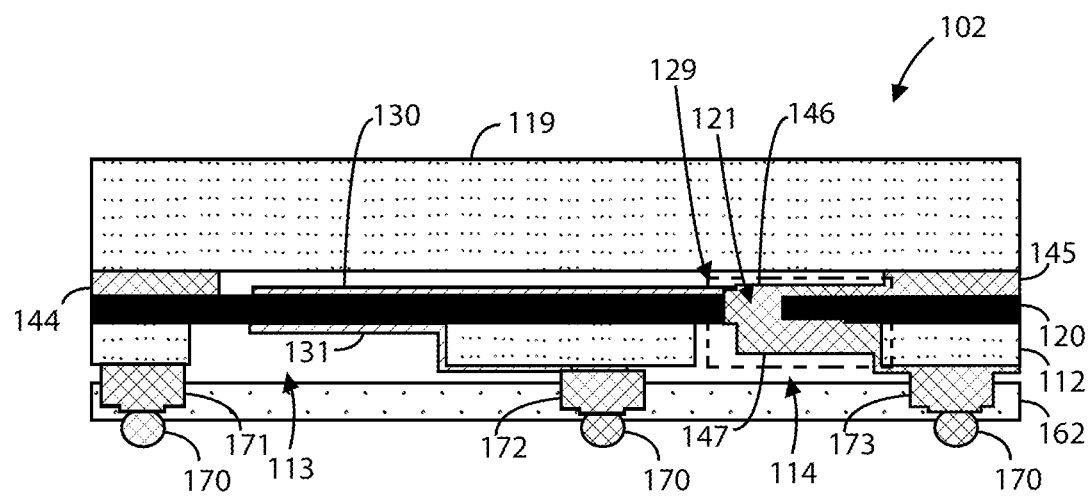
FIG. 1B is a simplified diagram illustrating an acoustic resonator device having bottom-side interconnections according to an example of the present invention.

FIG. 1B is a simplified diagram illustrating an acoustic resonator device 102 having backside interconnections according to an example of the present invention. As shown, device 101 includes a thinned seed substrate 112 with an overlying piezoelectric layer 120, which has a micro-via 129. The micro-via 129 can include a topside micro-trench 121, a topside metal plug 146, a backside trench 114, and a backside metal plug 147. Although device 102 is depicted with a single micro-via 129, device 102 may have multiple micro-vias. A topside metal electrode 130 is formed overlying the piezoelectric layer 120. A top cap structure is bonded to the piezoelectric layer 120. This top cap structure 119 includes bond pads which are connected to one or more bond pads 144 and topside metal 145 on piezoelectric layer 120. The topside metal 145 includes a topside metal plug 146.

The thinned substrate 112 has the first and second backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal plug 146. This backside metal plug 147 is electrically coupled to the topside metal plug 146. A backside cap structure 162 is bonded to the thinned seed substrate 112, underlying the first and second backside trenches. One or more backside bond pads (171, 172, 173) are formed within one or more portions of the backside cap structure 162. Solder balls 170 are electrically coupled to the one or more backside bond pads 171-173. Further details relating to the method of manufacture of this device will be discussed starting from FIG. 14A.

Figure 1C:
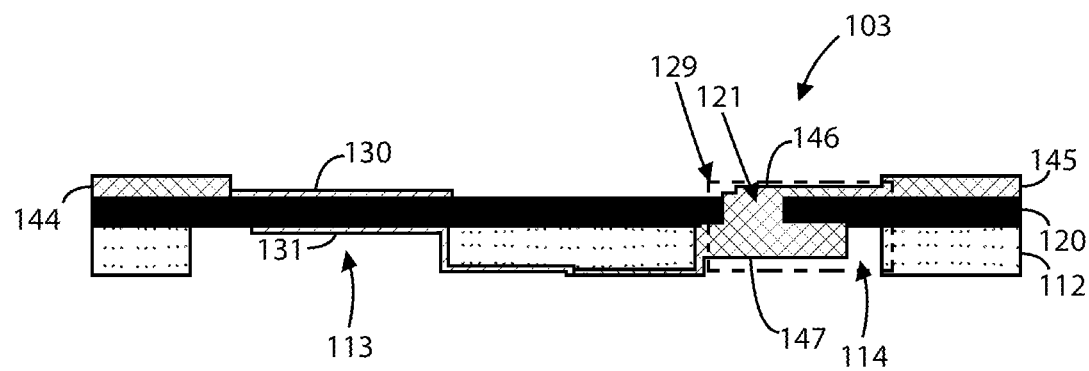
FIG. 1C is a simplified diagram illustrating an acoustic resonator device having interposer/cap-free structure interconnections according to an example of the present invention.

FIG. 1C is a simplified diagram illustrating an acoustic resonator device having interposer/cap-free structure interconnections according to an example of the present invention. As shown, device 103 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 103 is depicted with a single micro-via 129, device 103 may have multiple micro-vias. A topside metal electrode 130 is formed overlying the piezoelectric layer 120. The thinned substrate 112 has the first and second backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal 145. This backside metal plug 147 is electrically coupled to the topside metal plug 146 and the backside metal electrode 131. Further details relating to the method of manufacture of this device will be discussed starting from FIG. 2.

Figure 1D:
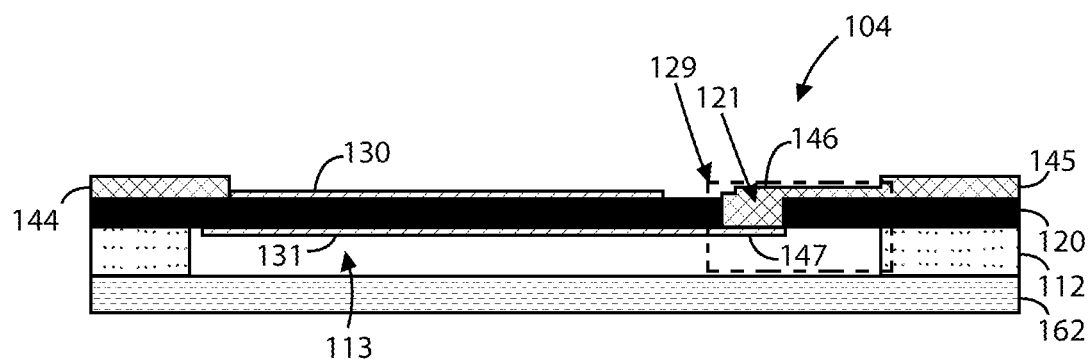
FIG. 1D is a simplified diagram illustrating an acoustic resonator device having interposer/cap-free structure interconnections with a shared backside trench according to an example of the present invention.

FIG. 1D is a simplified diagram illustrating an acoustic resonator device having interposer/cap-free structure interconnections with a shared backside trench according to an example of the present invention. As shown, device 104 includes a thinned seed substrate 112 with an overlying single crystal piezoelectric layer 120, which has a micro-via 129. The micro-via 129 can include a topside micro-trench 121, a topside metal plug 146, and a backside metal 147. Although device 104 is depicted with a single micro-via 129, device 104 may have multiple micro-vias. A topside metal electrode 130 is formed overlying the piezoelectric layer 120. The thinned substrate 112 has a first backside trench 113. A backside metal electrode 131 is formed underlying a portion of the thinned seed substrate 112, the first backside trench 113, and the topside metal electrode 130. A backside metal 147 is formed underlying a portion of the thinned seed substrate 112, the second backside trench 114, and the topside metal 145. This backside metal 147 is electrically coupled to the topside metal plug 146 and the backside metal electrode 131. Further details relating to the method of manufacture of this device will be discussed starting from FIG. 2.

Figure 2:
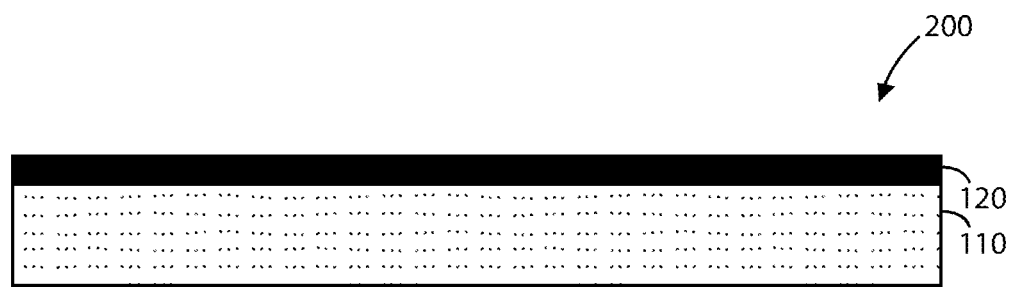
FIGS. 2 and 3 are simplified diagrams illustrating steps for a method of manufacture for an acoustic resonator device according to an example of the present invention.
Figure 3:
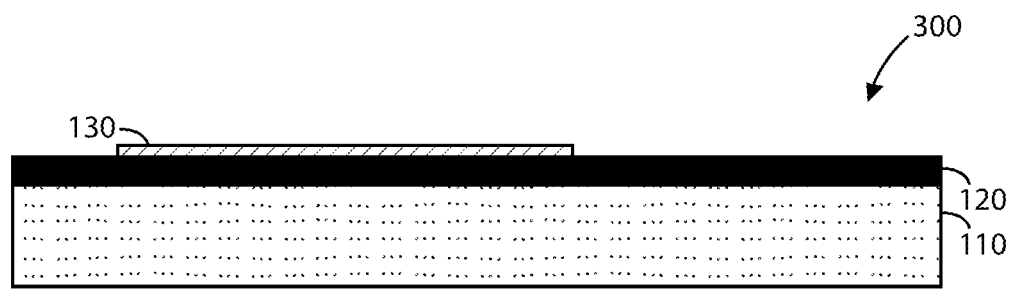

FIGS. 2 and 3 are simplified diagrams illustrating steps for a method of manufacture for an acoustic resonator device according to an example of the present invention. This method illustrates the process for fabricating an acoustic resonator device similar to that shown in FIG. 1A. FIG. 2 can represent a method step of providing a partially processed piezoelectric substrate. As shown, device 102 includes a seed substrate 110 with a piezoelectric layer 120 formed overlying. In a specific example, the seed substrate can include silicon, silicon carbide, aluminum oxide, or single crystal aluminum gallium nitride materials, or the like. The piezoelectric layer 120 can include a piezoelectric single crystal layer or a thin film piezoelectric single crystal layer.

FIG. 3 can represent a method step of forming a top side metallization or top resonator metal electrode 130. In a specific example, the topside metal electrode 130 can include a molybdenum, aluminum, ruthenium, or titanium material, or the like and combinations thereof. This layer can be deposited and patterned on top of the piezoelectric layer by a lift-off process, a wet etching process, a dry etching process, a metal printing process, a metal laminating process, or the like. The lift-off process can include a sequential process of lithographic patterning, metal deposition, and lift-off steps to produce the topside metal layer. The wet/dry etching processes can includes sequential processes of metal deposition, lithographic patterning, metal deposition, and metal etching steps to produce the topside metal layer. Those of ordinary skill in the art will recognize other variations, modifications, and alternatives.

Figure 4A:
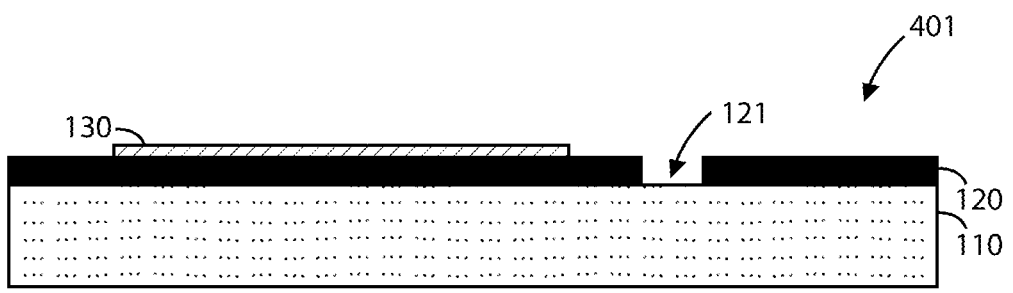
FIG. 4A is a simplified diagram illustrating a step for a method creating a topside micro-trench according to an example of the present invention.
Figure 4B:
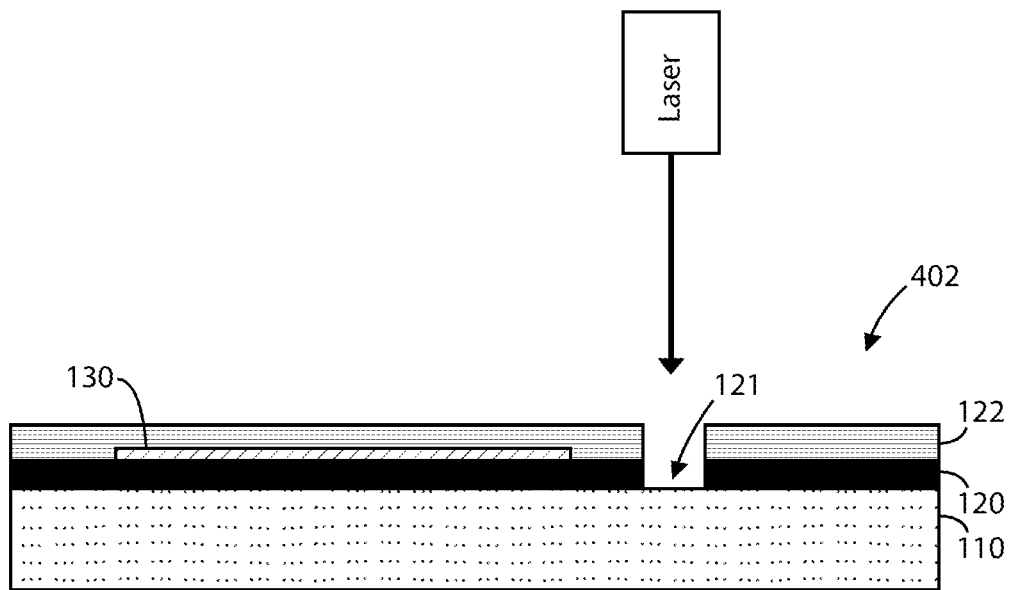
FIGS. 4B and 4C are simplified diagrams illustrating alternative methods for conducting the method step of forming a topside micro-trench as described in FIG. 4A.
Figure 4C:
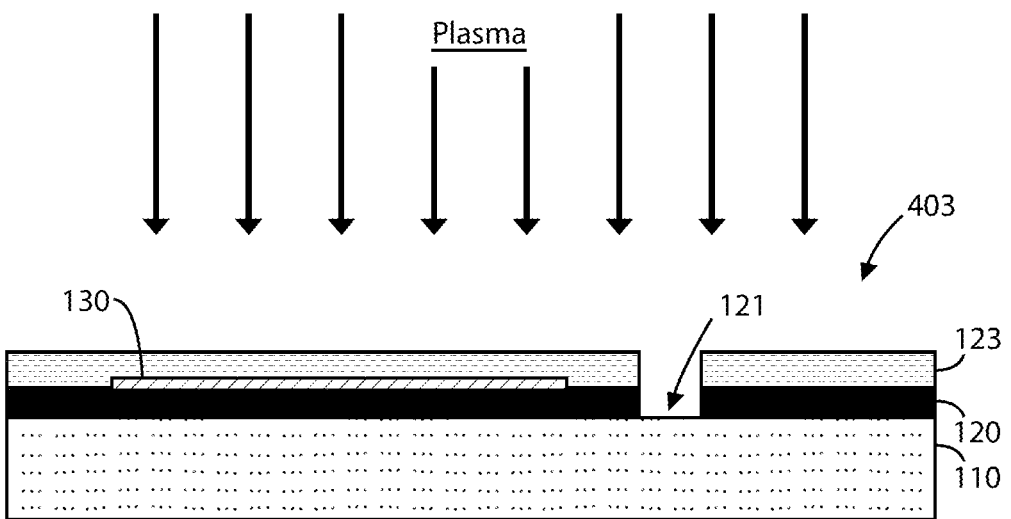

FIG. 4A is a simplified diagram illustrating a step for a method of manufacture for an acoustic resonator device 401 according to an example of the present invention. This figure can represent a method step of forming one or more topside micro-trenches 121 within a portion of the piezoelectric layer 120. This topside micro-trench 121 can serve as the main interconnect junction between the top and bottom sides of the acoustic membrane, which will be developed in later method steps. In an example, the topside micro-trench 121 is extends all the way through the piezoelectric layer 120 and stops in the seed substrate 110. This topside micro-trench 121 can be formed through a dry etching process, a laser drilling process, or the like. FIGS. 4B and 4C describe these options in more detail.

FIGS. 4B and 4C are simplified diagrams illustrating alternative methods for conducting the method step as described in FIG. 4A. As shown, FIG. 4B represents a method step of using a laser drill, which can quickly and accurately form the topside micro-trench 121 in the piezoelectric layer 120. In an example, the laser drill can be used to form nominal 50 um holes, or holes between 10 um and 500 um in diameter, through the piezoelectric layer 120 and stop in the seed substrate 110 below the interface between layers 120 and 110. A protective layer 122 can be formed overlying the piezoelectric layer 120 and the topside metal electrode 130. This protective layer 122 can serve to protect the device from laser debris and to provide a mask for the etching of the topside micro-via 121. In a specific example, the laser drill can be an 11W high power diode-pumped UV laser, or the like. This mask 122 can be subsequently removed before proceeding to other steps. The mask may also be omitted from the laser drilling process, and air flow can be used to remove laser debris.

FIG. 4C can represent a method step of using a dry etching process to form the topside micro-trench 121 in the piezoelectric layer 120. As shown, a lithographic masking layer 123 can be forming overlying the piezoelectric layer 120 and the topside metal electrode 130. The topside micro-trench 121 can be formed by exposure to plasma, or the like.

FIGS. 4D and 4E are simplified diagrams illustrating an alternative method for conducting the method step as described in FIG. 4A. These figures can represent the method step of manufacturing multiple acoustic resonator devices simultaneously. In FIG. 4D, two devices are shown on Die #1 and Die #2, respectively. FIG. 4E shows the process of forming a micro-via 121 on each of these dies while also etching a scribe line 124 or dicing line. In an example, the etching of the scribe line 124 singulates and relieves stress in the piezoelectric single crystal layer 120.

Figure 5:
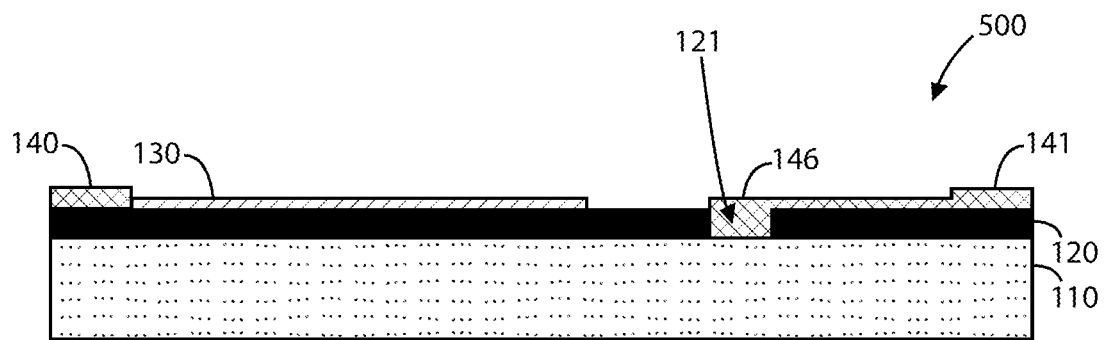
FIGS. 5 to 8 are simplified diagrams illustrating steps for a method of manufacture for an acoustic resonator device according to an example of the present invention.

FIGS. 5 to 8 are simplified diagrams illustrating steps for a method of manufacture for an acoustic resonator device according to an example of the present invention. FIG. 5 can represent the method step of forming one or more bond pads 140 and forming a topside metal 141 electrically coupled to at least one of the bond pads 140. The topside metal 141 can include a topside metal plug 146 formed within the topside micro-trench 121. In a specific example, the topside metal plug 146 fills the topside micro-trench 121 to form a topside portion of a micro-via.

In an example, the bond pads 140 and the topside metal 141 can include a gold material or other interconnect metal material depending upon the application of the device. These metal materials can be formed by a lift-off process, a wet etching process, a dry etching process, a screen-printing process, an electroplating process, a metal printing process, or the like. In a specific example, the deposited metal materials can also serve as bond pads for a cap structure, which will be described below.

Figure 6:
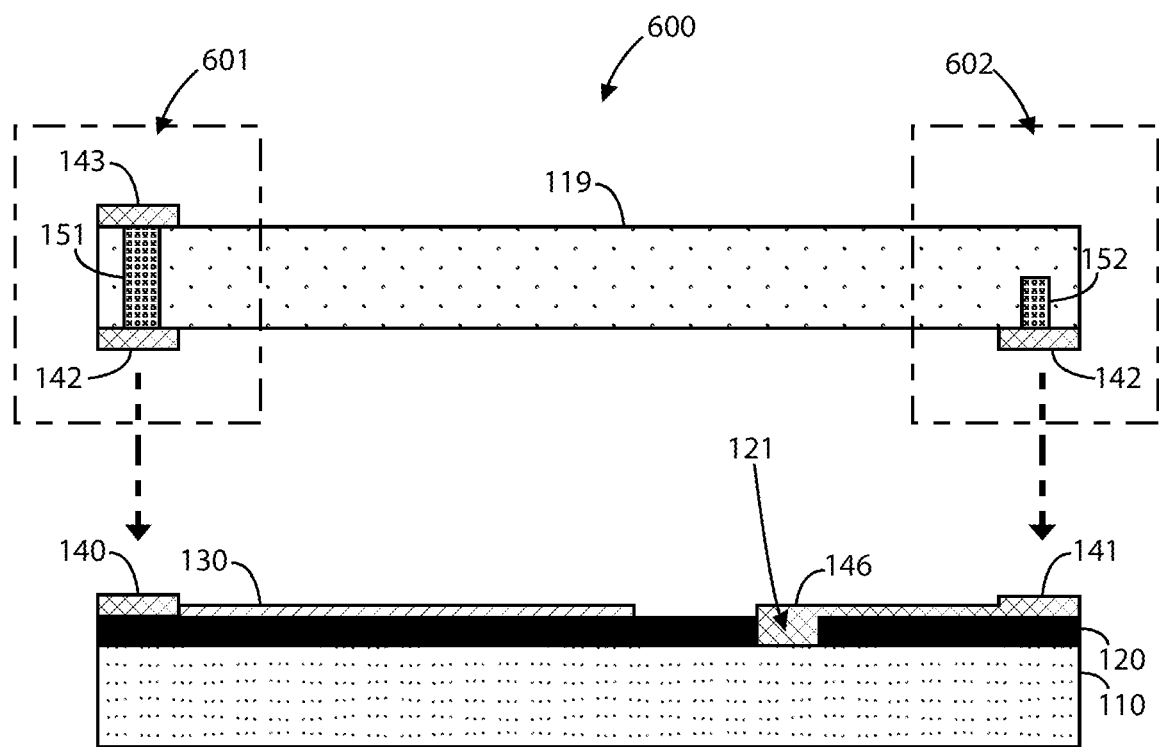

FIG. 6 can represent a method step for preparing the acoustic resonator device for bonding, which can be a hermetic bonding. As shown, a top cap structure is positioned above the partially processed acoustic resonator device as described in the previous figures. The top cap structure can be formed using an interposer substrate 119 in two configurations: fully processed interposer version 601 (through glass via) and partially processed interposer version 602 (blind via version). In the 601 version, the interposer substrate 119 includes through-via structures 151 that extend through the interposer substrate 119 and are electrically coupled to bottom bond pads 142 and top bond pads 143. In the 602 version, the interposer substrate 119 includes blind via structures 152 that only extend through a portion of the interposer substrate 119 from the bottom side. These blind via structures 152 are also electrically coupled to bottom bond pads 142. In a specific example, the interposer substrate can include a silicon, glass, smart-glass, or other like material.

Figure 7:
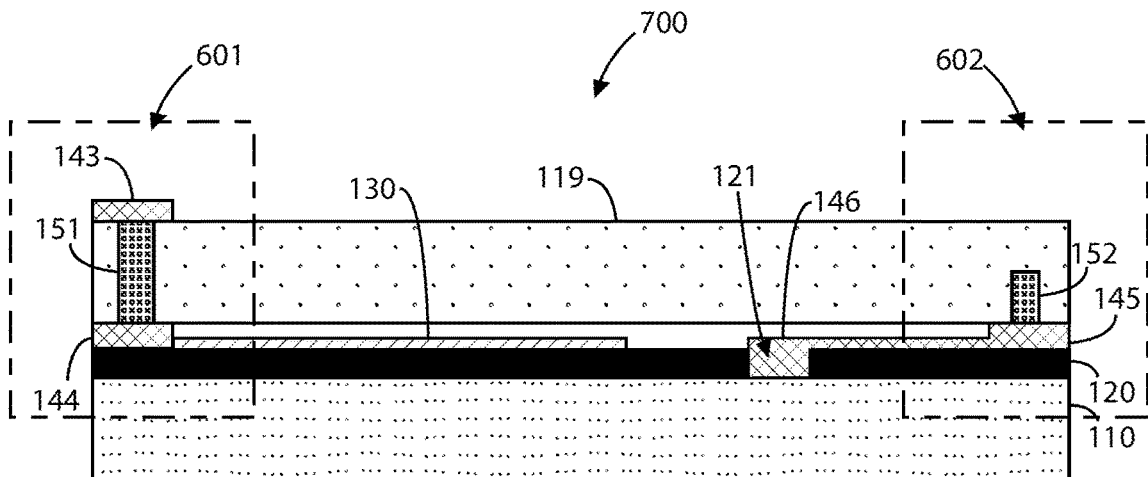
Figure 8:
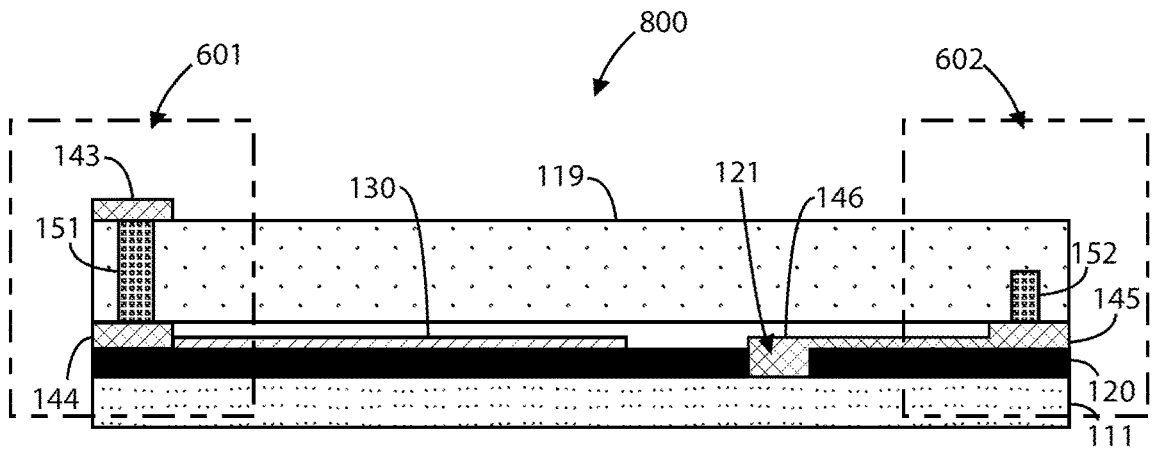

FIG. 7 can represent a method step of bonding the top cap structure to the partially processed acoustic resonator device. As shown, the interposer substrate 119 is bonded to the piezoelectric layer by the bond pads (140, 142) and the topside metal 141, which are now denoted as bond pad 144 and topside metal 145. This bonding process can be done using a compression bond method or the like. FIG. 8 can represent a method step of thinning the seed substrate 110, which is now denoted as thinned seed substrate 111. This substrate thinning process can include grinding and etching processes or the like. In a specific example, this process can include a wafer backgrinding process followed by stress removal, which can involve dry etching, CMP polishing, or annealing processes.

Figure 9A:
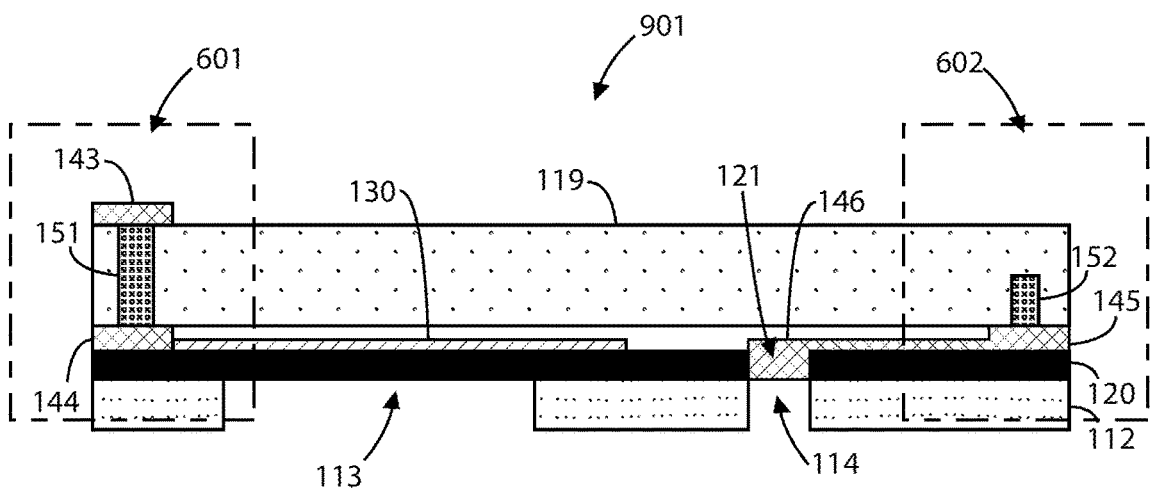
FIG. 9A is a simplified diagram illustrating a method step for forming backside trenches according to an example of the present invention.

FIG. 9A is a simplified diagram illustrating a step for a method of manufacture for an acoustic resonator device 901 according to an example of the present invention. FIG. 9A can represent a method step for forming backside trenches 113 and 114 to allow access to the piezoelectric layer from the backside of the thinned seed substrate 111. In an example, the first backside trench 113 can be formed within the thinned seed substrate 111 and underlying the topside metal electrode 130. The second backside trench 114 can be formed within the thinned seed substrate 111 and underlying the topside micro-trench 121 and topside metal plug 146. This substrate is now denoted thinned substrate 112. In a specific example, these trenches 113 and 114 can be formed using deep reactive ion etching (DRIE) processes, Bosch processes, or the like. The size, shape, and number of the trenches may vary with the design of the acoustic resonator device. In various examples, the first backside trench may be formed with a trench shape similar to a shape of the topside metal electrode or a shape of the backside metal electrode. The first backside trench may also be formed with a trench shape that is different from both a shape of the topside metal electrode and the backside metal electrode.

FIGS. 9B and 9C are simplified diagrams illustrating an alternative method for conducting the method step as described in FIG. 9A. Like FIGS. 4D and 4E, these figures can represent the method step of manufacturing multiple acoustic resonator devices simultaneously. In FIG. 9B, two devices with cap structures are shown on Die #1 and Die #2, respectively. FIG. 9C shows the process of forming backside trenches (113, 114) on each of these dies while also etching a scribe line 115 or dicing line. In an example, the etching of the scribe line 115 provides an optional way to singulate the backside wafer 112.

Figure 10:
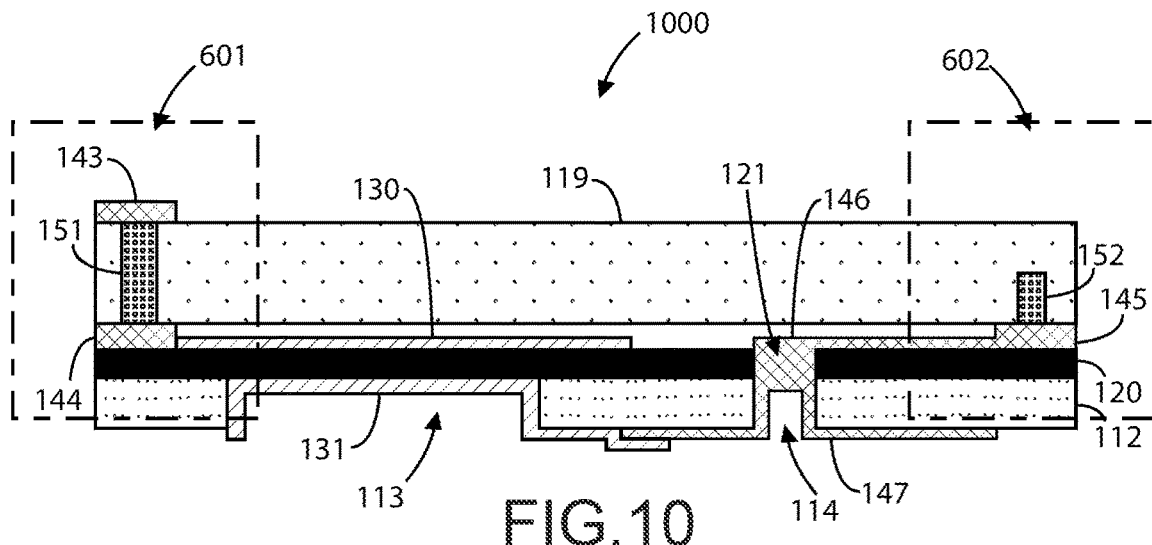
FIG. 10 is a simplified diagram illustrating a method step forming backside metallization and electrical interconnections between top and bottom sides of a resonator according to an example of the present invention.

FIG. 10 is a simplified diagram illustrating a step for a method of manufacture for an acoustic resonator device 1000 according to an example of the present invention. This figure can represent a method step of forming a backside metal electrode 131 and a backside metal plug 147 within the backside trenches of the thinned seed substrate 112. In an example, the backside metal electrode 131 can be formed underlying one or more portions of the thinned substrate 112, within the first backside trench 113, and underlying the topside metal electrode 130. This process completes the resonator structure within the acoustic resonator device. The backside metal plug 147 can be formed underlying one or more portions of the thinned substrate 112, within the second backside trench 114, and underlying the topside micro-trench 121. The backside metal plug 147 can be electrically coupled to the topside metal plug 146 and the backside metal electrode 131. In a specific example, the backside metal electrode 130 can include a molybdenum, aluminum, ruthenium, or titanium material, or the like and combinations thereof. The backside metal plug can include a gold material, low resistivity interconnect metals, electrode metals, or the like. These layers can be deposited using the deposition methods described previously.

Figure 11A:
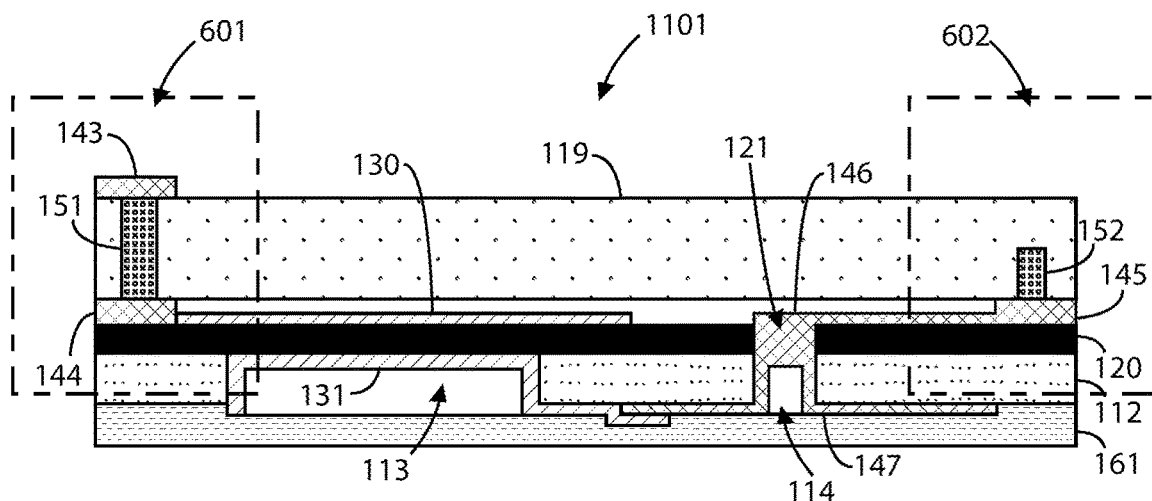
FIGS. 11A and 11B are simplified diagrams illustrating alternative steps for a method of manufacture for an acoustic resonator device according to an example of the present invention.
Figure 11B:
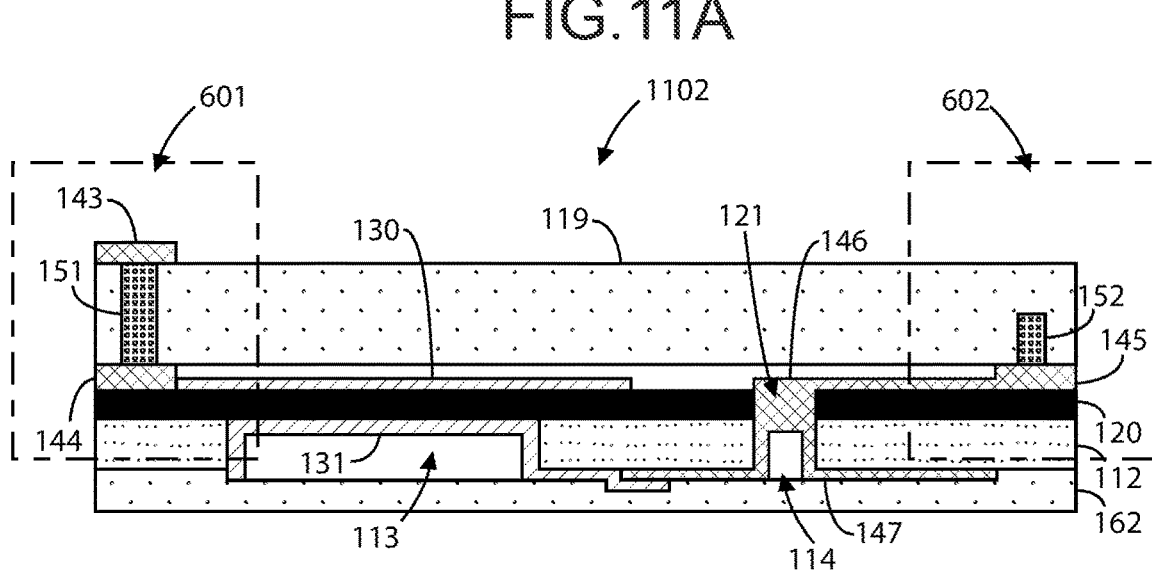

FIGS. 11A and 11B are simplified diagrams illustrating alternative steps for a method of manufacture for an acoustic resonator device according to an example of the present invention. These figures show methods of bonding a backside cap structure underlying the thinned seed substrate 112. In FIG. 11A, the backside cap structure is a dry film cap 161, which can include a permanent photo-imageable dry film such as a solder mask, polyimide, or the like. Bonding this cap structure can be cost-effective and reliable, but may not produce a hermetic seal. In FIG. 11B, the backside cap structure is a substrate 162, which can include a silicon, glass, or other like material. Bonding this substrate can provide a hermetic seal, but may cost more and require additional processes. Depending upon application, either of these backside cap structures can be bonded underlying the first and second backside vias.

Figure 12A:
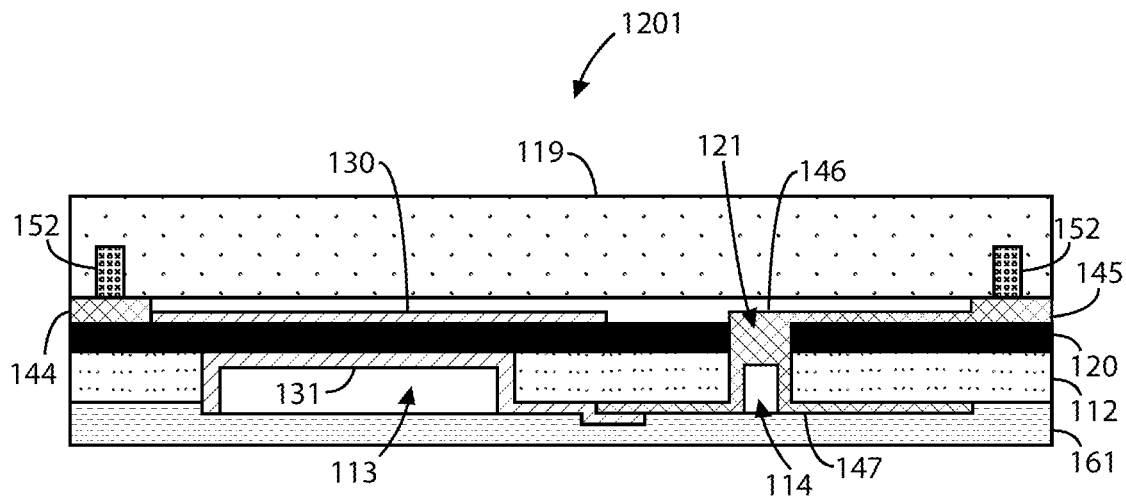
FIGS. 12A to 12E are simplified diagrams illustrating steps for a method of manufacture for an acoustic resonator device using a blind via interposer according to an example of the present invention.
Figure 12B:
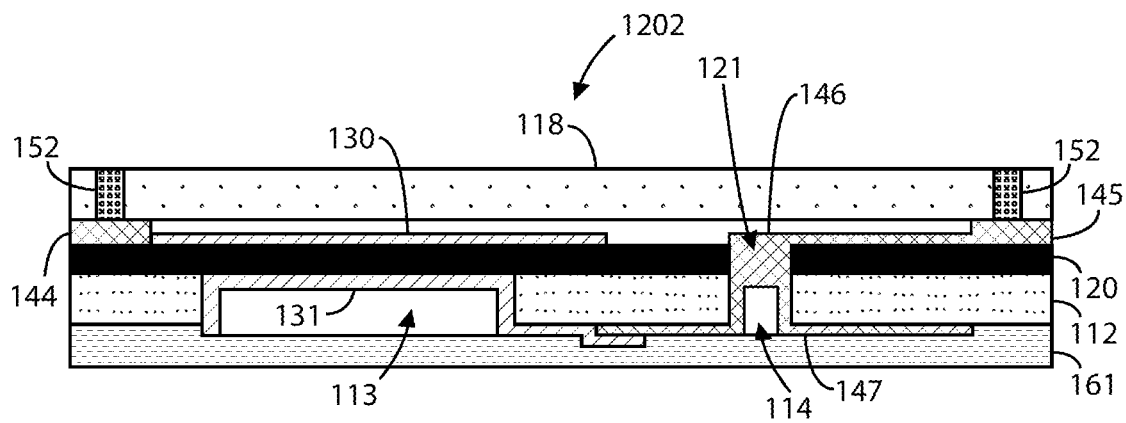
Figure 12C:
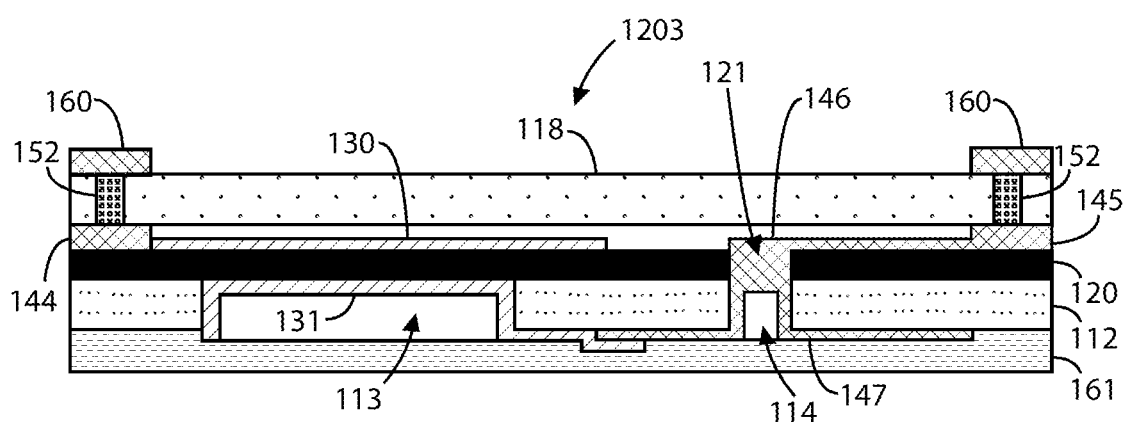
Figure 12D:
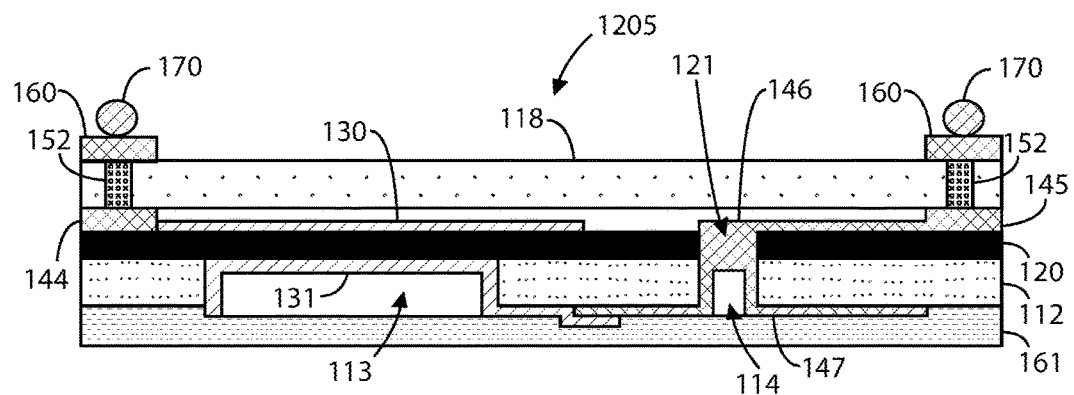
Figure 12E:
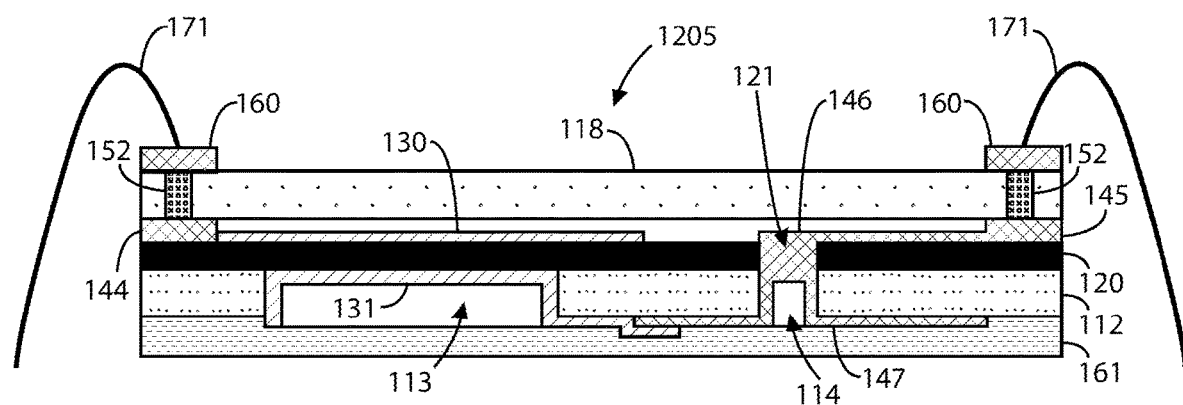

FIGS. 12A to 12E are simplified diagrams illustrating steps for a method of manufacture for an acoustic resonator device according to an example of the present invention. More specifically, these figures describe additional steps for processing the blind via interposer "602" version of the top cap structure. FIG. 12A shows an acoustic resonator device 1201 with blind vias 152 in the top cap structure. In FIG. 12B, the interposer substrate 119 is thinned, which forms a thinned interposer substrate 118, to expose the blind vias 152. This thinning process can be a combination of a grinding process and etching process as described for the thinning of the seed substrate. In FIG. 12C, a redistribution layer (RDL) process and metallization process can be applied to create top cap bond pads 160 that are formed overlying the blind vias 152 and are electrically coupled to the blind vias 152. As shown in FIG. 12D, a ball grid array (BGA) process can be applied to form solder balls 170 overlying and electrically coupled to the top cap bond pads 160. This process leaves the acoustic resonator device ready for wire bonding 171, as shown in FIG. 12E.

Figure 13:
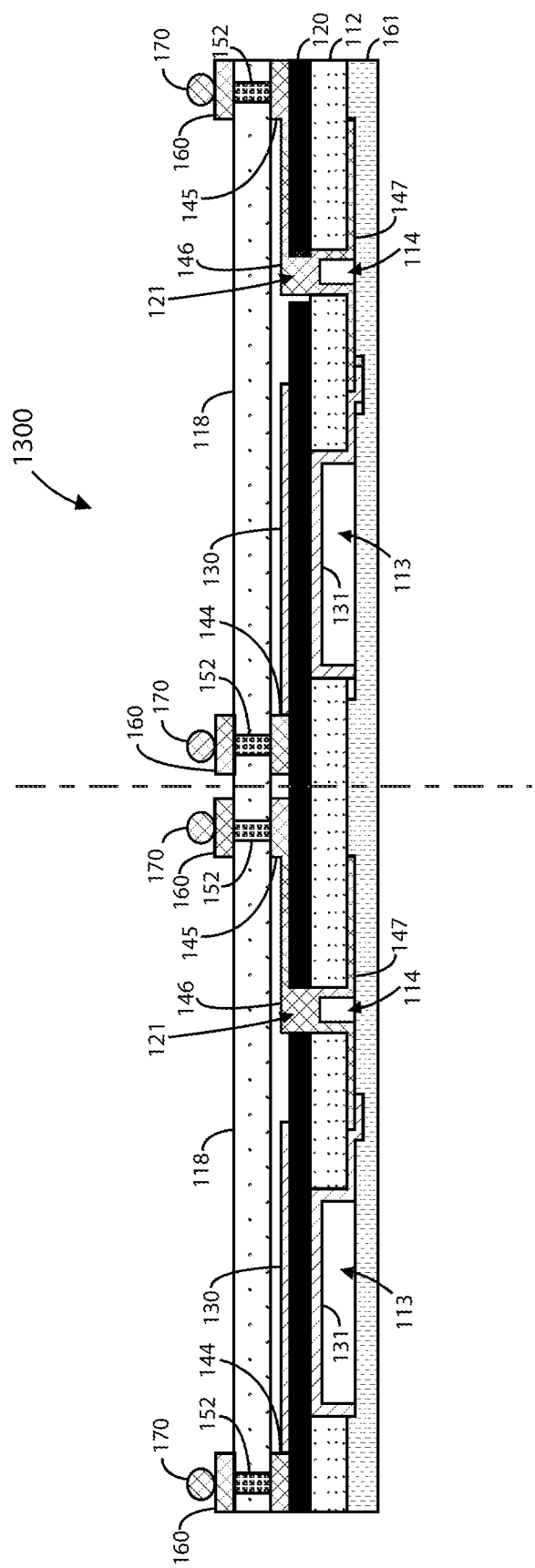
FIG. 13 is a simplified diagram illustrating a step for a method of manufacture for an acoustic resonator device according to an example of the present invention.

FIG. 13 is a simplified diagram illustrating a step for a method of manufacture for an acoustic resonator device according to an example of the present invention. As shown, device 1300 includes two fully processed acoustic resonator devices that are ready to singulation to create separate devices. In an example, the die singulation process can be done using a wafer dicing saw process, a laser cut singulation process, or other processes and combinations thereof.

Figure 14A:
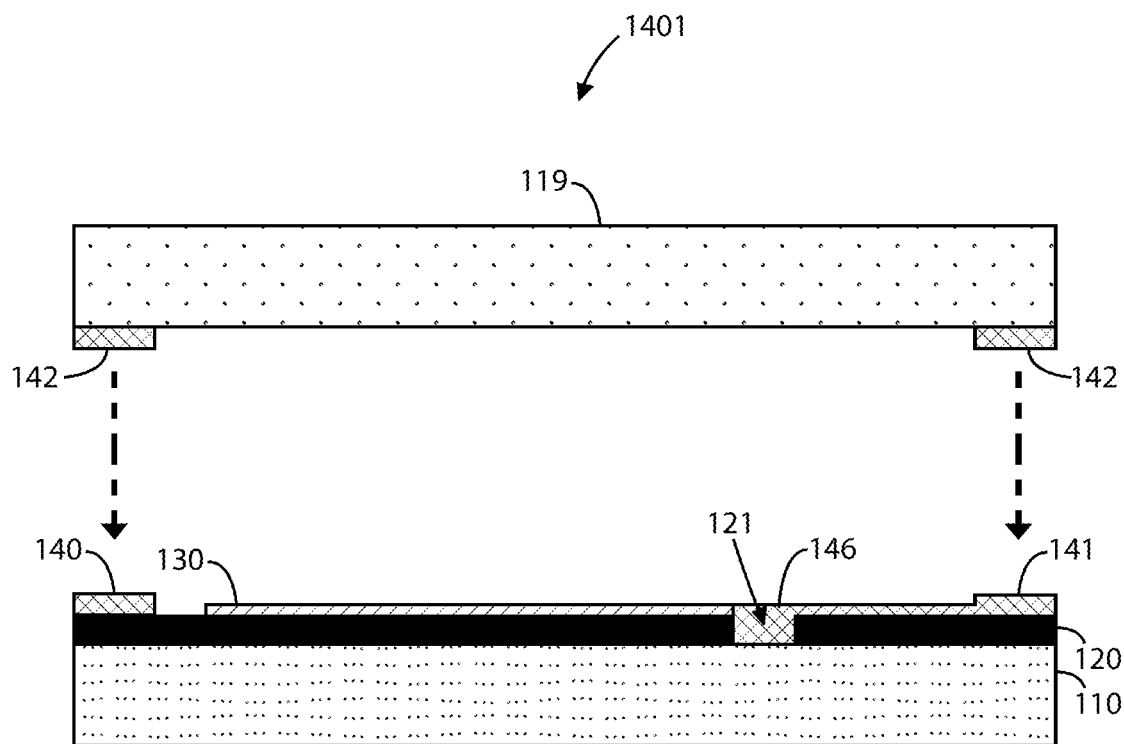
FIGS. 14A to 14G are simplified diagrams illustrating method steps for a cap wafer process for an acoustic resonator device according to an example of the present invention.

FIGS. 14A to 14G are simplified diagrams illustrating steps for a method of manufacture for an acoustic resonator device according to an example of the present invention. This method illustrates the process for fabricating an acoustic resonator device similar to that shown in FIG. 1B. The method for this example of an acoustic resonator can go through similar steps as described in FIGS. 1-5. FIG. 14A shows where this method differs from that described previously. Here, the top cap structure substrate 119 and only includes one layer of metallization with one or more bottom bond pads 142. Compared to FIG. 6, there are no via structures in the top cap structure because the interconnections will be formed on the bottom side of the acoustic resonator device.

Figure 14B:
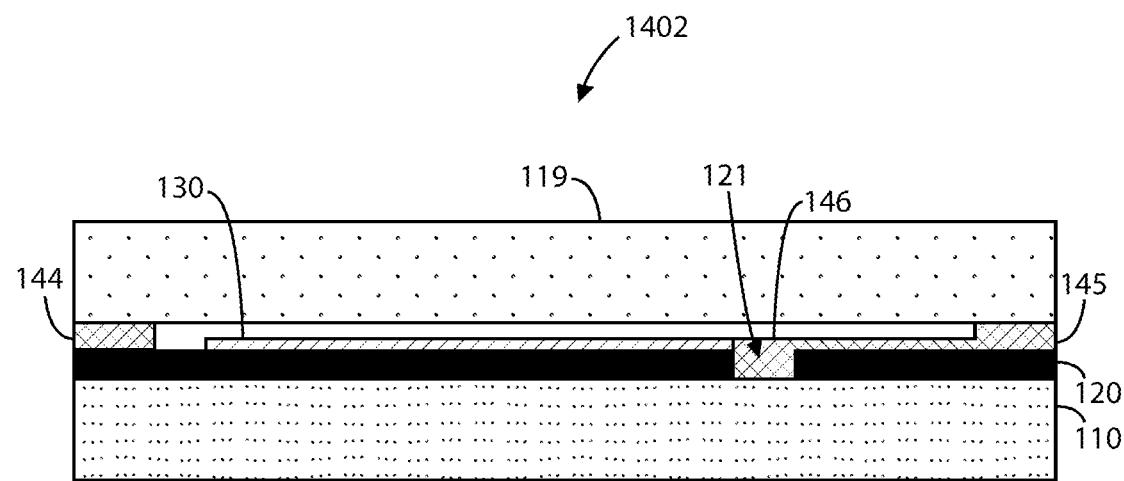
Figure 14C:
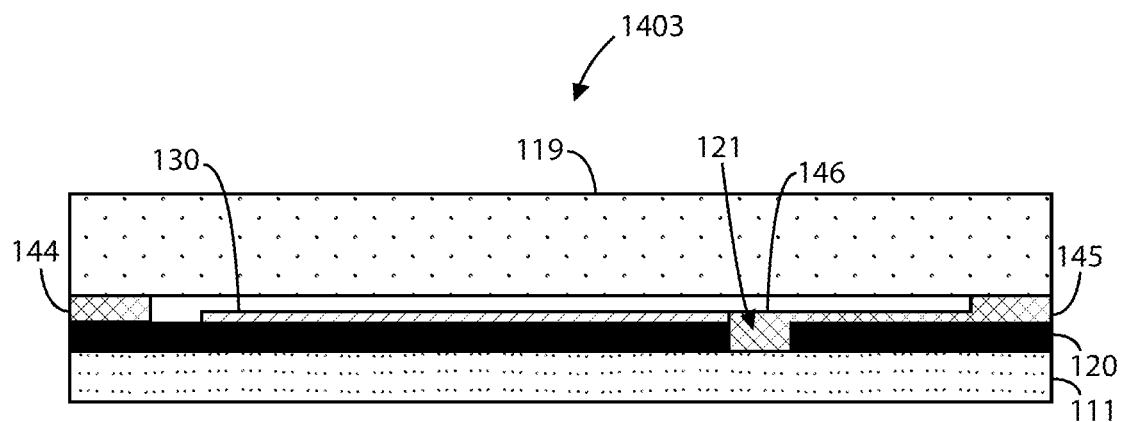
Figure 14D:
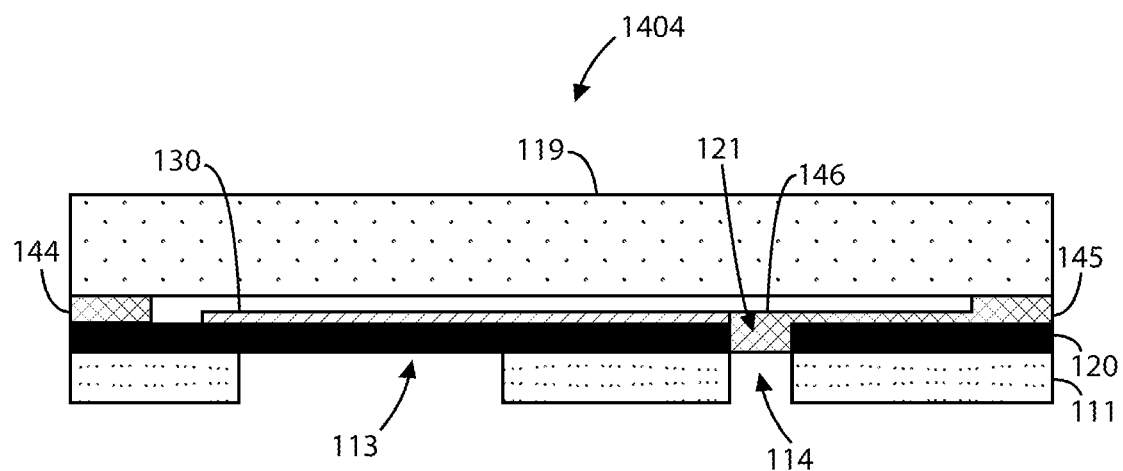
Figure 14E:
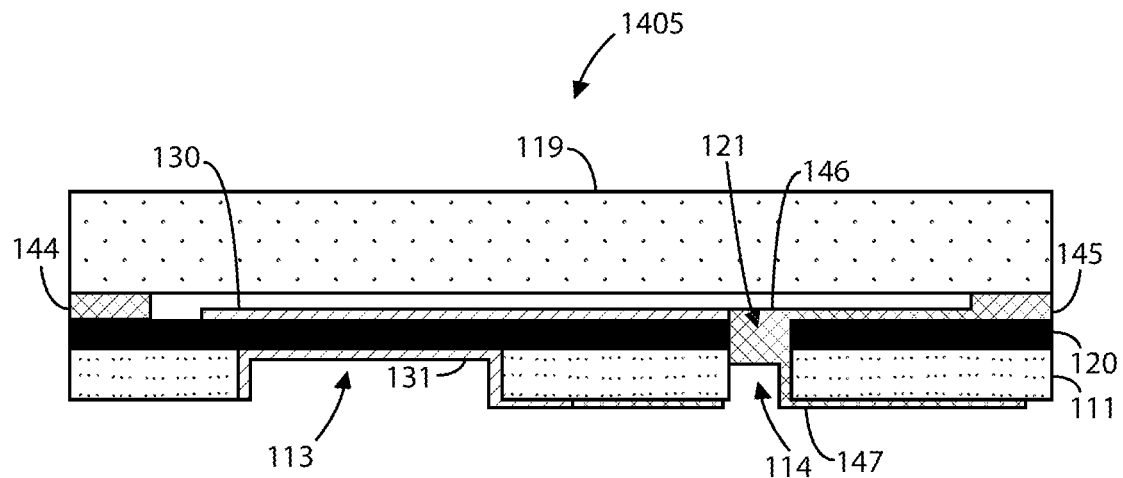
Figure 14F:
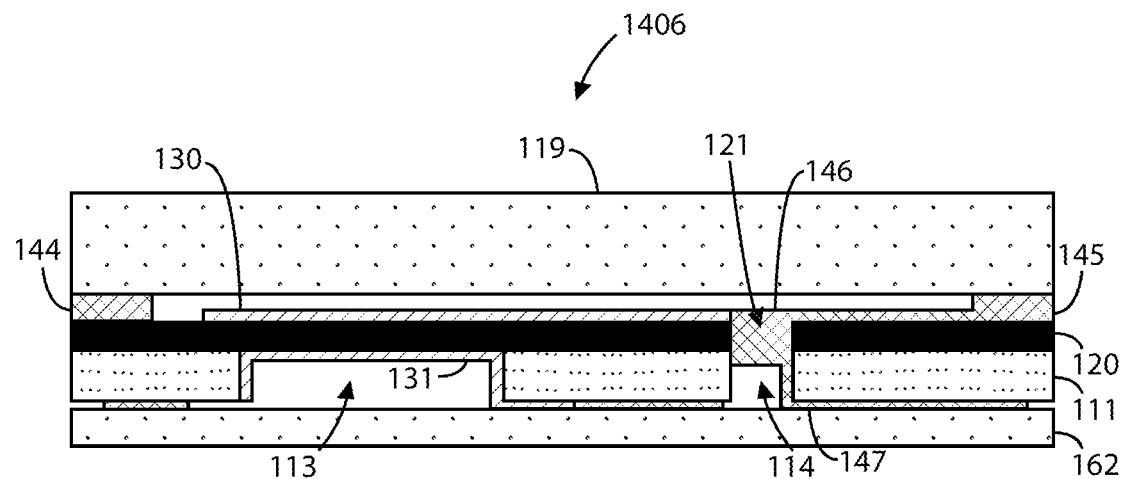

FIGS. 14B to 14F depict method steps similar to those described in the first process flow. FIG. 14B can represent a method step of bonding the top cap structure to the piezoelectric layer 120 through the bond pads (140, 142) and the topside metal 141, now denoted as bond pads 144 and topside metal 145 with topside metal plug 146. FIG. 14C can represent a method step of thinning the seed substrate 110, which forms a thinned seed substrate 111, similar to that described in FIG. 8. FIG. 14D can represent a method step of forming first and second backside trenches, similar to that described in FIG. 9A. FIG. 14E can represent a method step of forming a backside metal electrode 131 and a backside metal plug 147, similar to that described in FIG. 10. FIG. 14F can represent a method step of bonding a backside cap structure 162, similar to that described in FIGS. 11A and 11B.

Figure 14G:
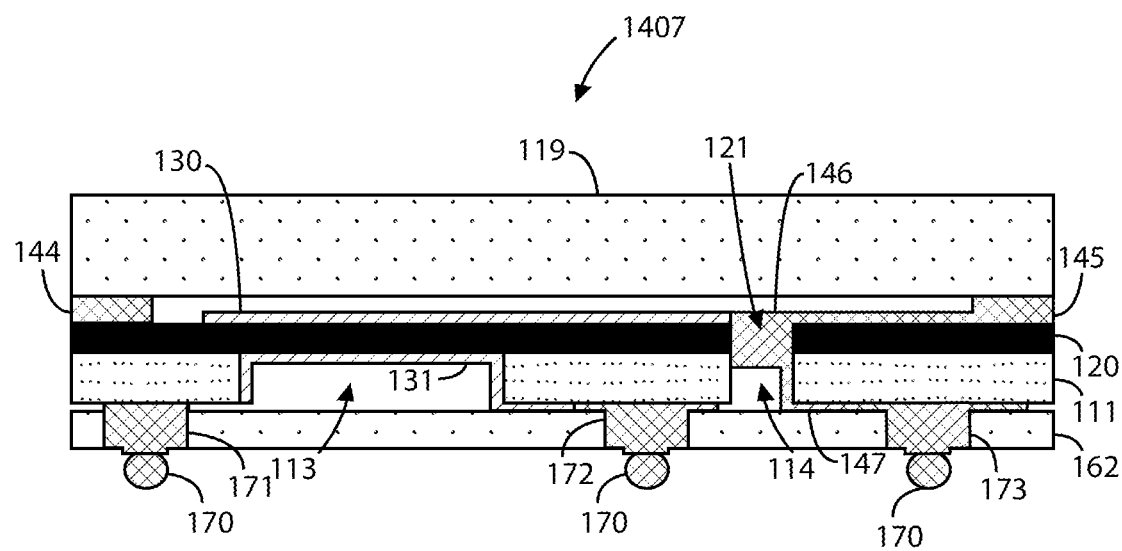

FIG. 14G shows another step that differs from the previously described process flow. Here, the backside bond pads 171, 172, and 173 are formed within the backside cap structure 162. In an example, these backside bond pads 171-173 can be formed through a masking, etching, and metal deposition processes similar to those used to form the other metal materials. A BGA process can be applied to form solder balls 170 in contact with these backside bond pads 171-173, which prepares the acoustic resonator device 1407 for wire bonding.

Figure 15A:
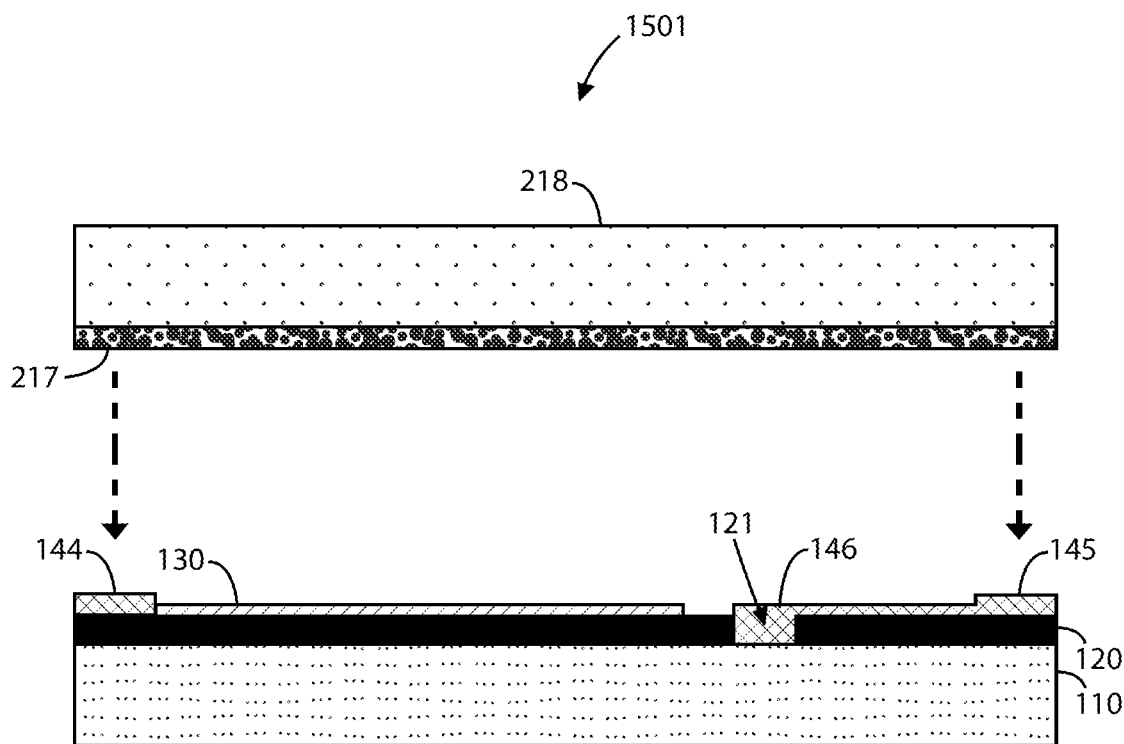
FIGS. 15A-15E are simplified diagrams illustrating method steps for making an acoustic resonator device with shared backside trench, which can be implemented in both interposer/cap and interposer free versions, according to examples of the present invention.

FIGS. 15A to 15E are simplified diagrams illustrating steps for a method of manufacture for an acoustic resonator device according to an example of the present invention. This method illustrates the process for fabricating an acoustic resonator device similar to that shown in FIG. 1B. The method for this example can go through similar steps as described in FIG. 1-5. FIG. 15A shows where this method differs from that described previously. A temporary carrier 218 with a layer of temporary adhesive 217 is attached to the substrate. In a specific example, the temporary carrier 218 can include a glass wafer, a silicon wafer, or other wafer and the like.

Figure 15B:
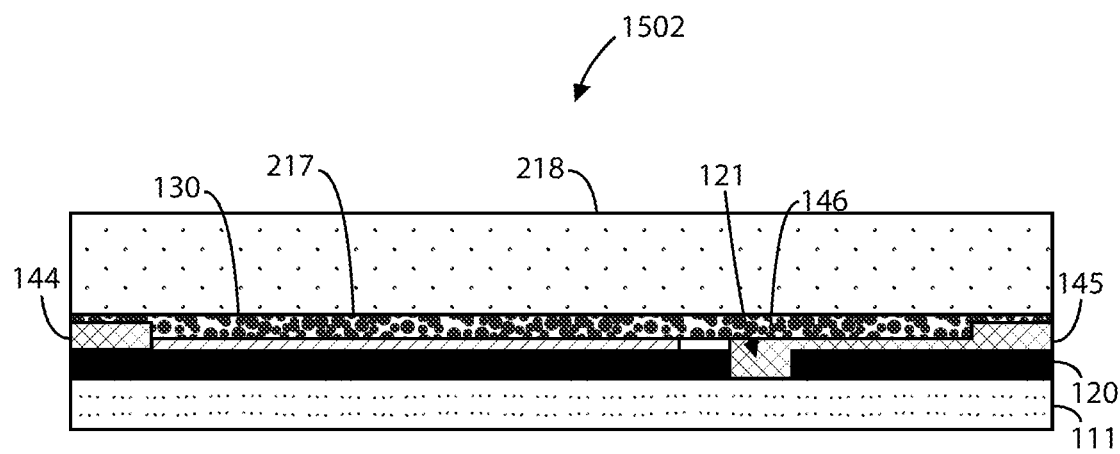

FIGS. 15B to 15F depict method steps similar to those described in the first process flow. FIG. 15B can represent a method step of thinning the seed substrate 110, which forms a thinned substrate 111, similar to that described in FIG. 8.

In a specific example, the thinning of the seed substrate 110 can include a back side grinding process followed by a stress removal process. The stress removal process can include a dry etch, a Chemical Mechanical Planarization (CMP), and annealing processes.

Figure 15C:
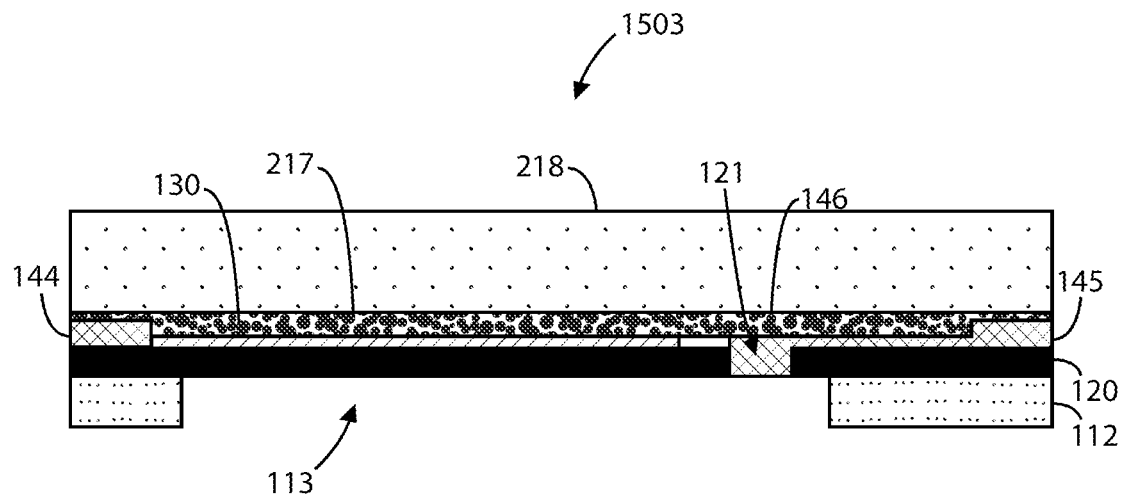

FIG. 15C can represent a method step of forming a shared backside trench 113, similar to the techniques described in FIG. 9A. The main difference is that the shared backside trench is configured underlying both topside metal electrode 130, topside micro-trench 121, and topside metal plug 146. In an example, the shared backside trench 113 is a backside resonator cavity that can vary in size, shape (all possible geometric shapes), and side wall profile (tapered convex, tapered concave, or right angle). In a specific example, the forming of the shared backside trench 113 can include a litho-etch process, which can include a back-to-front alignment and dry etch of the backside substrate 111. The piezoelectric layer 120 can serve as an etch stop layer for the forming of the shared backside trench 113.

Figure 15D:
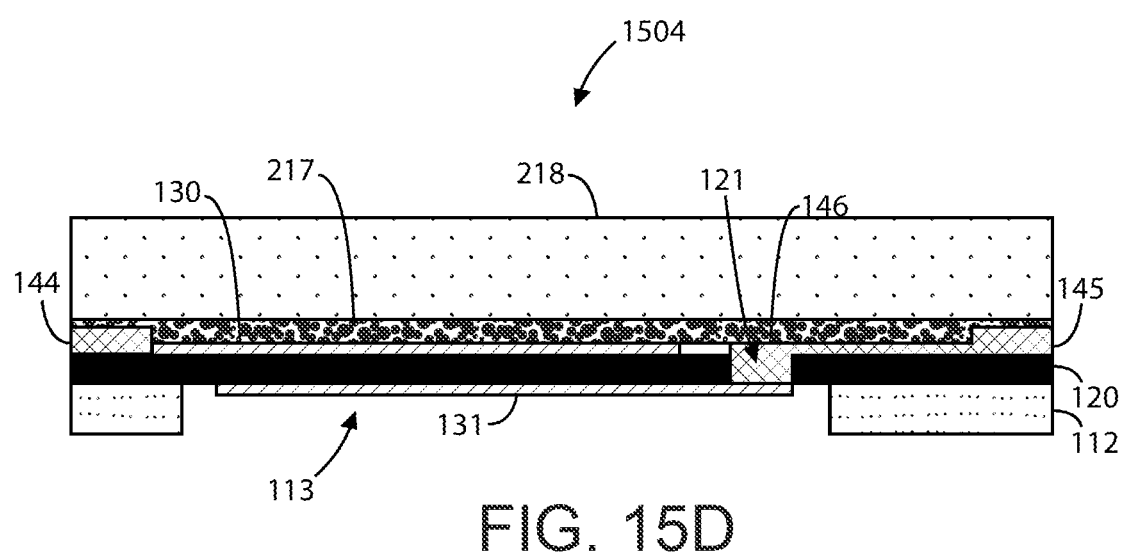

FIG. 15D can represent a method step of forming a backside metal electrode 131 and a backside metal 147, similar to that described in FIG. 10. In an example, the forming of the backside metal electrode 131 can include a deposition and patterning of metal materials within the shared backside trench 113. Here, the backside metal 131 serves as an electrode and the backside plug/connect metal 147 within the micro-via 121. The thickness, shape, and type of metal can vary as a function of the resonator/filter design. As an example, the backside electrode 131 and via plug metal 147 can be different metals. In a specific example, these backside metals 131, 147 can either be deposited and patterned on the surface of the piezoelectric layer 120 or rerouted to the backside of the substrate 112. In an example, the backside metal electrode may be patterned such that it is configured within the boundaries of the shared backside trench such that the backside metal electrode does not come in contact with one or more side-walls of the seed substrate created during the forming of the shared backside trench.

Figure 15E:
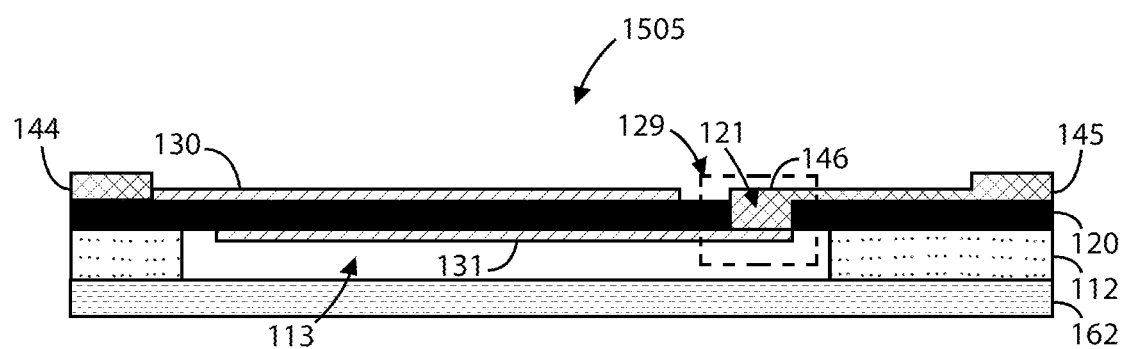

FIG. 15E can represent a method step of bonding a backside cap structure 162, similar to that described in FIGS. 11A and 11B, following a de-bonding of the temporary carrier 218 and cleaning of the topside of the device to remove the temporary adhesive 217. Those of ordinary skill in the art will recognize other variations, modifications, and alternatives of the methods steps described previously.

As used herein, the term "substrate" can mean the bulk substrate or can include overlying growth structures such as an aluminum, gallium, or ternary compound of aluminum and gallium and nitrogen containing epitaxial region, or functional regions, combinations, and the like.

One or more benefits are achieved over pre-existing techniques using the invention. In particular, the present device can be manufactured in a relatively simple and cost effective manner while using conventional materials and/or methods according to one of ordinary skill in the art. Using the present method, one can create a reliable single crystal based acoustic resonator using multiple ways of three-dimensional stacking through a wafer level process. Such filters or resonators can be implemented in an RF filter device, an RF filter system, or the like. Depending upon the embodiment, one or more of these benefits may be achieved. Of course, there can be other variations, modifications, and alternatives.

With 4G LTE and 5G growing more popular by the day, wireless data communication demands high performance RF filters with frequencies around 5 GHz and higher. Bulk acoustic wave resonators (BAWR), widely used in such filters operating at frequencies around 3 GHz and lower, are leading candidates for meeting such demands. Current bulk acoustic wave resonators use polycrystalline piezoelectric AlN thin films where each grain's c-axis is aligned perpendicular to the film's surface to allow high piezoelectric performance whereas the grains' a- or b-axis are randomly distributed. This peculiar grain distribution works well when the piezoelectric film's thickness is around 1 um and above, which is the perfect thickness for bulk acoustic wave (BAW) filters operating at frequencies ranging from 1 to 3 GHz. However, the quality of the polycrystalline piezoelectric films degrades quickly as the thicknesses decrease below around 0.5 um, which is required for resonators and filters operating at frequencies around 5 GHz and above.

Single crystalline or epitaxial piezoelectric thin films grown on compatible crystalline substrates exhibit good crystalline quality and high piezoelectric performance even down to very thin thicknesses, e.g., 0.4 um. The present invention provides manufacturing processes and structures for high quality bulk acoustic wave resonators with single crystalline or epitaxial piezoelectric thin films for high frequency BAW filter applications.

BAWRs require a piezoelectric material, e.g., AlN, in crystalline form, i.e., polycrystalline or single crystalline. The quality of the film heavy depends on the chemical, crystalline, or topographical quality of the layer on which the film is grown. In conventional BAWR processes (including film bulk acoustic resonator (FBAR) or solidly mounted resonator (SMR) geometry), the piezoelectric film is grown on a patterned bottom electrode, which is usually made of molybdenum (Mo), tungsten (W), or ruthenium (Ru). The surface geometry of the patterned bottom electrode significantly influences the crystalline orientation and crystalline quality of the piezoelectric film, requiring complicated modification of the structure.

Thus, the present invention uses single crystalline piezoelectric films and thin film transfer processes to produce a BAWR with enhanced ultimate quality factor and electromechanical coupling for RF filters. Such methods and structures facilitate methods of manufacturing and structures for RF filters using single crystalline or epitaxial piezoelectric films to meet the growing demands of contemporary data communication.

In an example, the present invention provides transfer structures and processes for acoustic resonator devices, which provides a flat, high-quality, single-crystal piezoelectric film for superior acoustic wave control and high Q in high frequency. As described above, polycrystalline piezoelectric layers limit Q in high frequency. Also, growing epitaxial piezoelectric layers on patterned electrodes affects the crystalline orientation of the piezoelectric layer, which limits the ability to have tight boundary control of the resulting resonators. Embodiments of the present invention, as further described below, can overcome these limitations and exhibit improved performance and cost-efficiency.

FIGS. 16A-16C through FIGS. 31A-31C illustrate a method of fabrication for an acoustic resonator device using a transfer structure with a sacrificial layer. In these figure series described below, the "A" figures show simplified diagrams illustrating top cross-sectional views of single crystal resonator devices according to various embodiments of the present invention. The "B" figures show simplified diagrams illustrating lengthwise cross-sectional views of the same devices in the "A" figures. Similarly, the "C" figures show simplified diagrams illustrating widthwise cross-sectional views of the same devices in the "A" figures. In some cases, certain features are omitted to highlight other features and the relationships between such features. Those of ordinary skill in the art will recognize variations, modifications, and alternatives to the examples shown in these figure series.

Figure 16C:
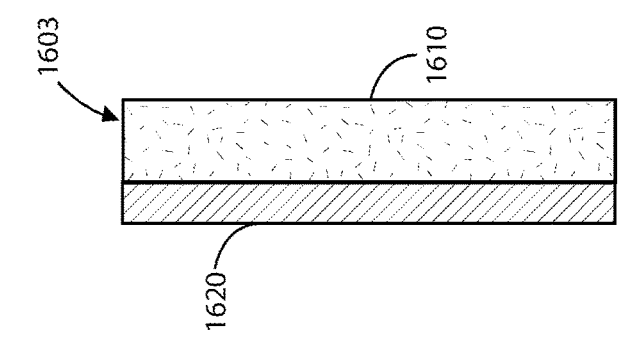
Figure 16A:
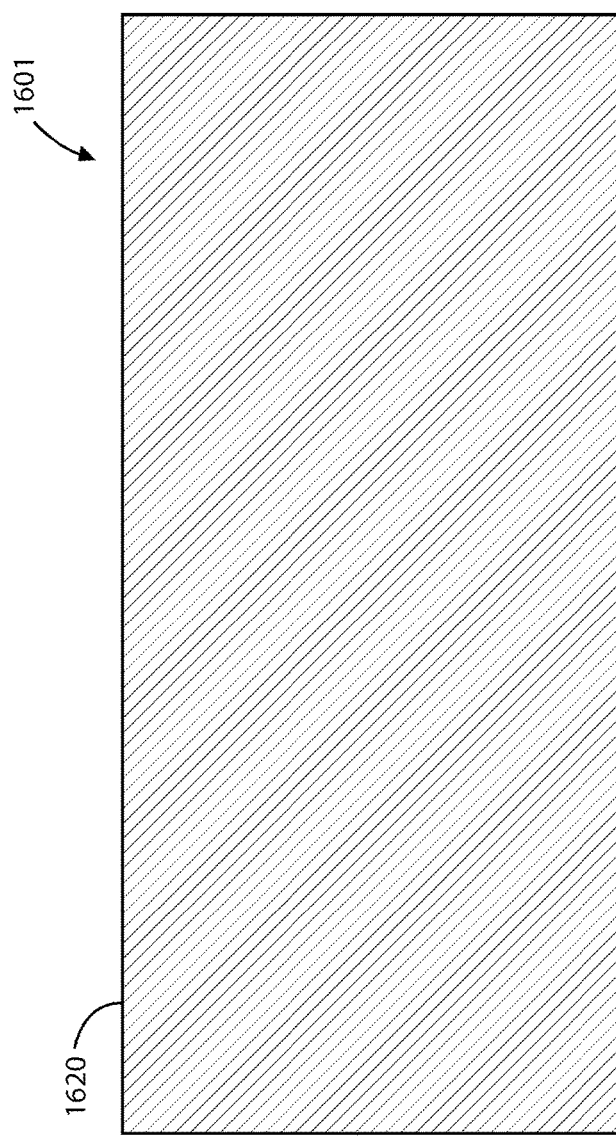
Figure 16B:
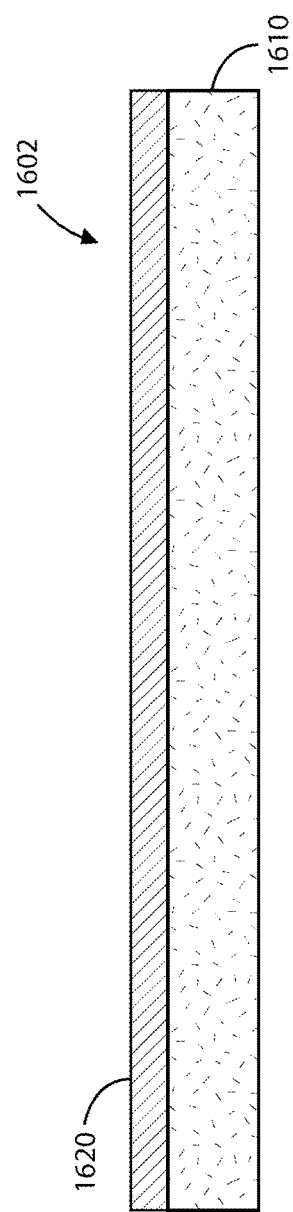

FIGS. 16A-16C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a piezoelectric film 1620 overlying a growth substrate 1610. In an example, the growth substrate 1610 can include silicon (S), silicon carbide (SiC), or other like materials. The piezoelectric film 1620 can be an epitaxial film including aluminum nitride (AlN), aluminum scandium nitride (AlScN), gallium nitride (GaN), or other like materials. Additionally, this piezoelectric substrate can be subjected to a thickness trim.

Figure 17C:
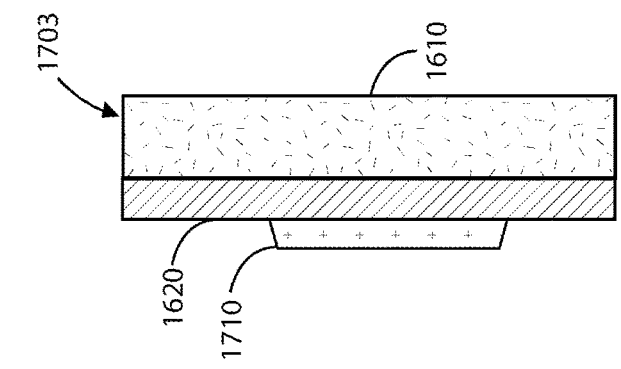
Figure 17A:
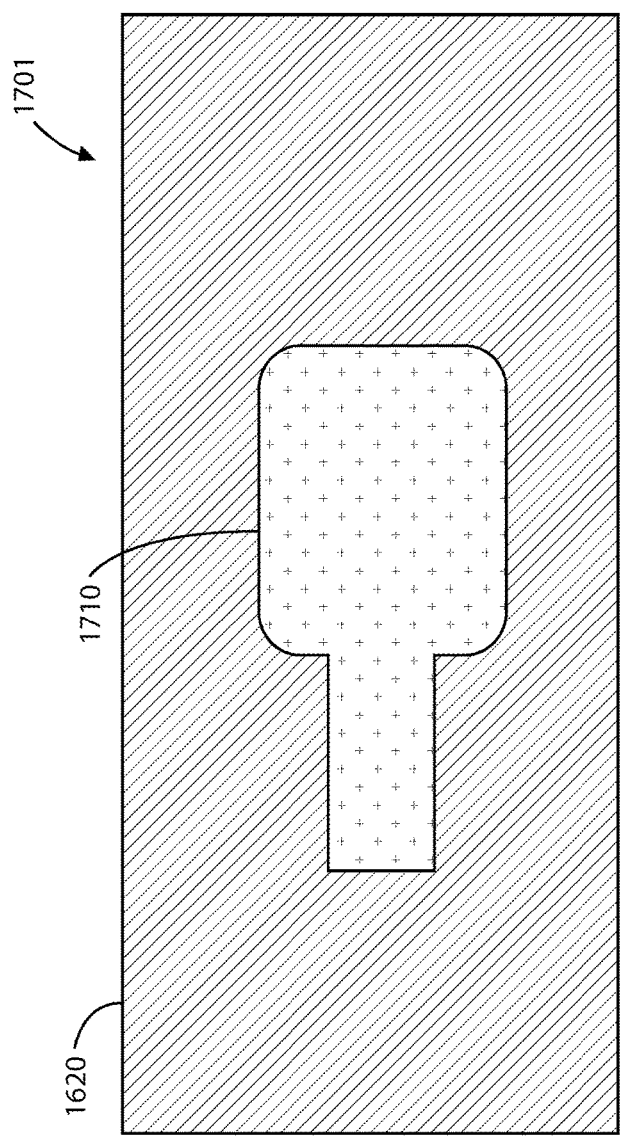
Figure 17B:
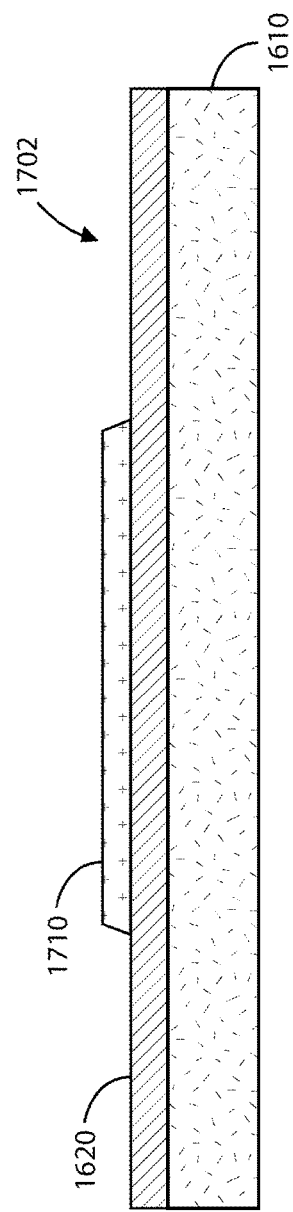

FIGS. 17A-17C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a first electrode 1710 overlying the surface region of the piezoelectric film 1620. In an example, the first electrode 1710 can include molybdenum (Mo), ruthenium (Ru), tungsten (W), or other like materials. In a specific example, the first electrode 1710 can be subjected to a dry etch with a slope. As an example, the slope can be about 60 degrees.

Figure 18C:
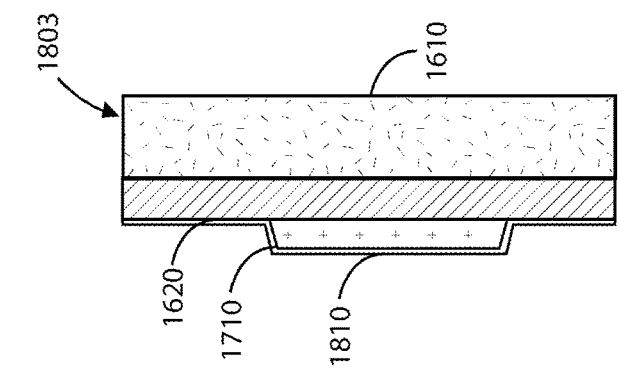
Figure 18A:
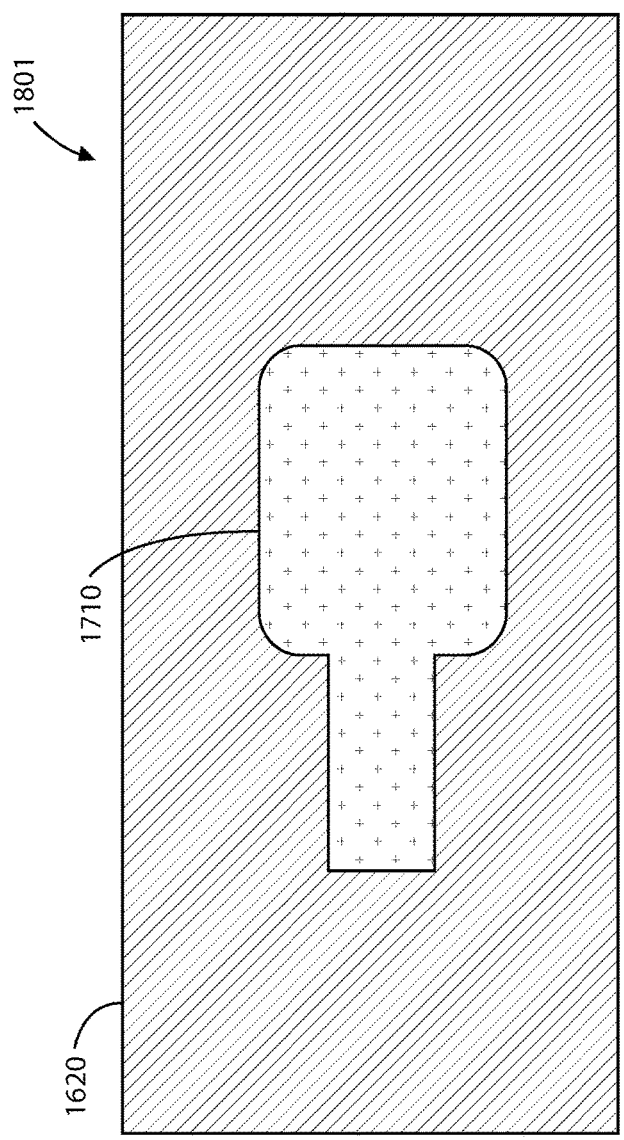
Figure 18B:
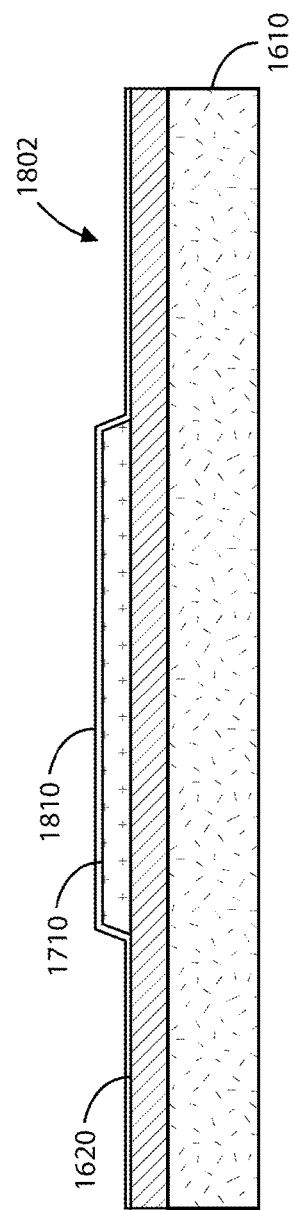

FIGS. 18A-18C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a first passivation layer 1810 overlying the first electrode 1710 and the piezoelectric film 1620. In an example, the first passivation layer 1810 can include silicon nitride (SiN), silicon oxide (SiO), or other like materials. In a specific example, the first passivation layer 1810 can have a thickness ranging from about 50 nm to about 100 nm.

Figure 19C:
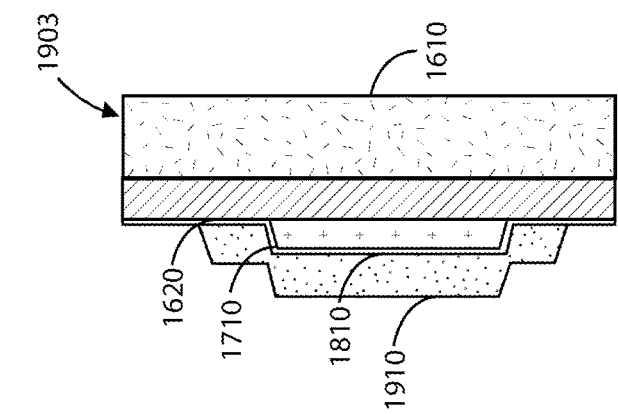
Figure 19A:
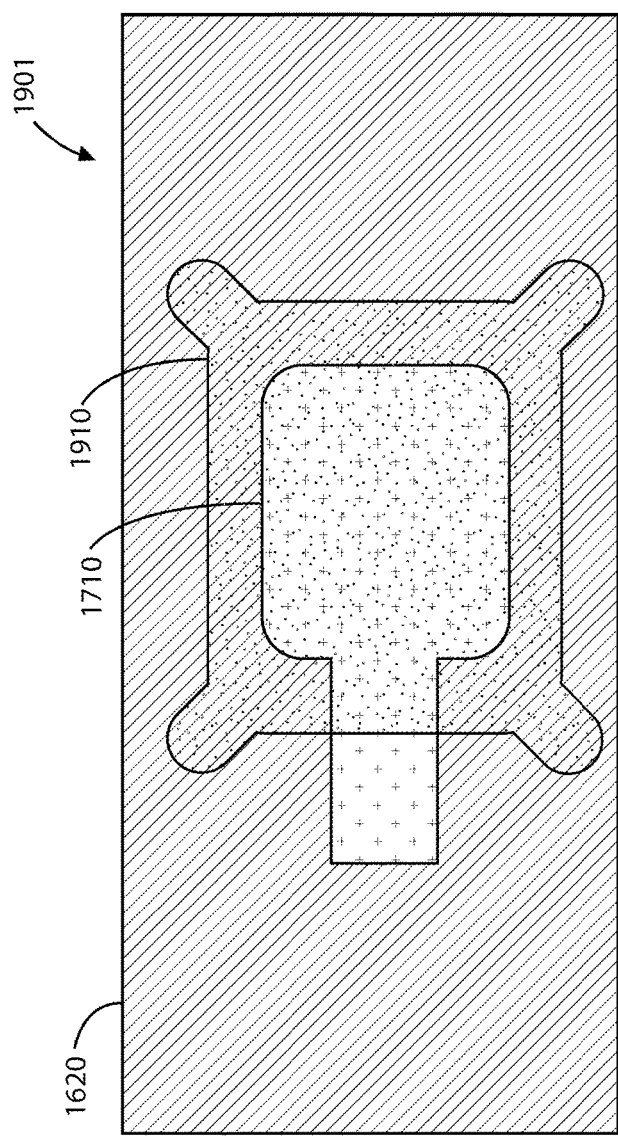
Figure 19B:
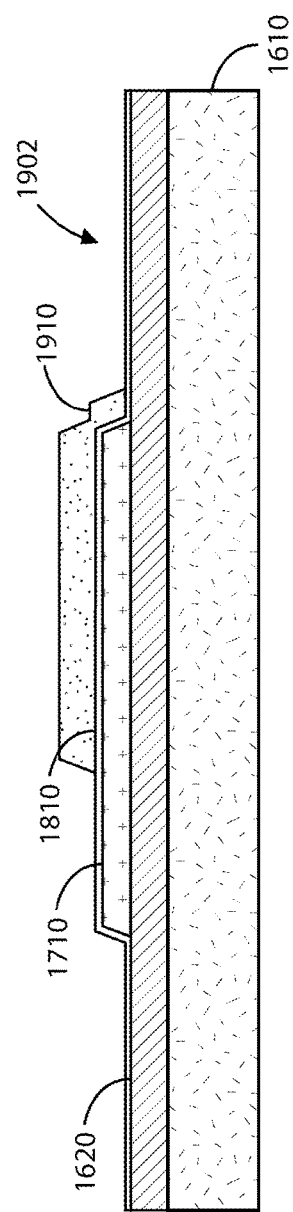

FIGS. 19A-19C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a sacrificial layer 1910 overlying a portion of the first electrode 1810 and a portion of the piezoelectric film 1620. In an example, the sacrificial layer 1910 can include polycrystalline silicon (poly-Si), amorphous silicon (a-Si), or other like materials. In a specific example, this sacrificial layer 1910 can be subjected to a dry etch with a slope and be deposited with a thickness of about 1 um. Further, phosphorous doped $SiO_2$ (PSG) can be used as the sacrificial layer with different combinations of support layer (e.g., SiNx).

FIGS. 20A-20C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a support layer 2010 overlying the sacrificial layer 1910, the first electrode 1710, and the piezoelectric film 1620. In an example, the support layer 2010 can include silicon dioxide ($SiO_2$), silicon nitride (SiN), or other like materials. In a specific example, this support layer 2010 can be deposited with a thickness of about 2-3 um. As described above, other support layers (e.g., SiNx) can be used in the case of a PSG sacrificial layer.

Figure 21C:
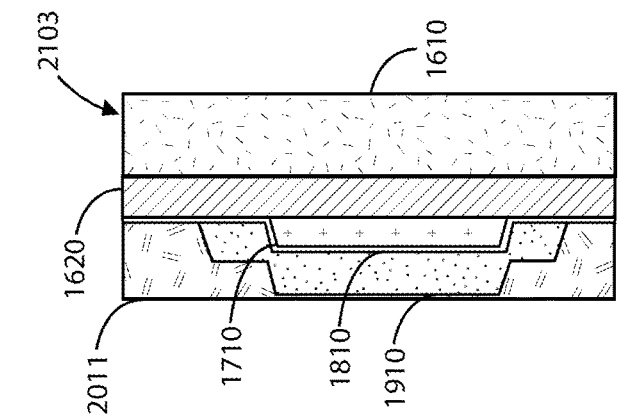
Figure 21A:
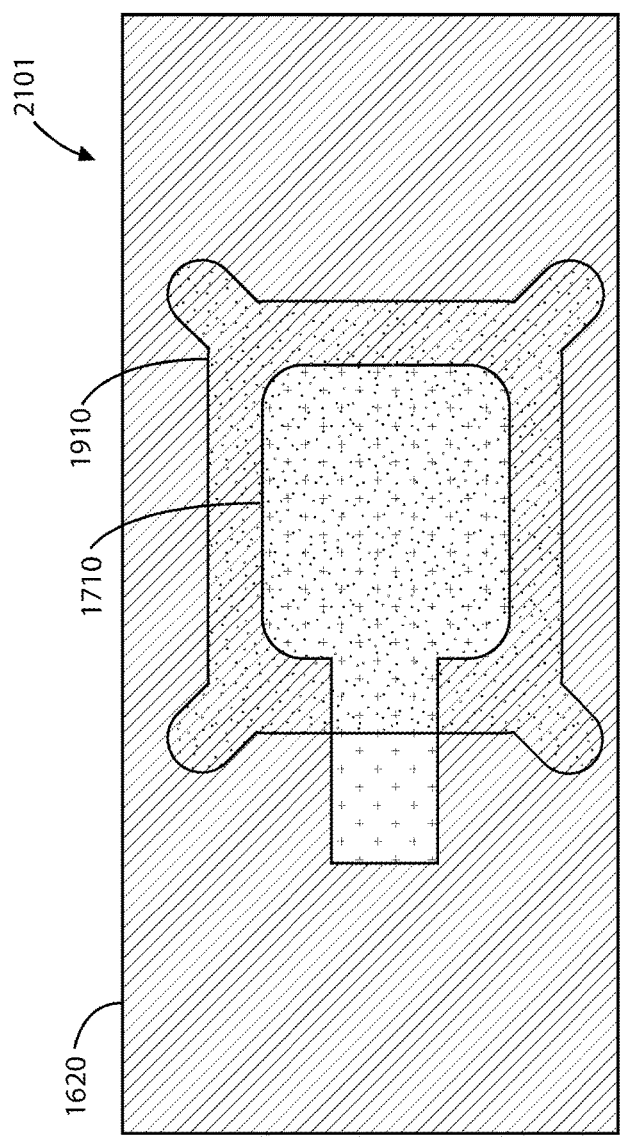
Figure 21B:
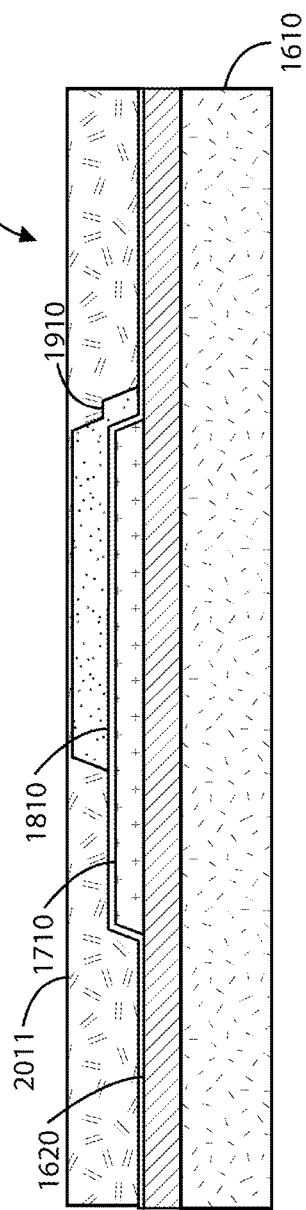

FIGS. 21A-21C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of polishing the support layer 2010 to form a polished support layer 2011. In an example, the polishing process can include a chemical-mechanical planarization process or the like.

FIGS. 22A-22C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate flipping the device and physically coupling overlying the support layer 2011 overlying a bond substrate 2210. In an example, the bond substrate 2210 can include a bonding support layer 2220 ($SiO_2$ or like material) overlying a substrate having silicon (Si), sapphire ($Al_2O_3$), silicon dioxide ($SiO_2$), silicon carbide (SiC), or other like materials. In a specific embodiment, the bonding support layer 2220 of the bond substrate 2210 is physically coupled to the polished support layer 2011. Further, the physical coupling process can include a room temperature bonding process following by a 300 degree Celsius annealing process.

FIGS. 23A-23C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of removing the growth substrate 1610 or otherwise the transfer of the piezoelectric film 1620. In an example, the removal process can include a grinding process, a blanket etching process, a film transfer process, an ion implantation transfer process, a laser crack transfer process, or the like and combinations thereof.

FIGS. 24A-24C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming an electrode contact via 2410 within the piezoelectric film 1620 (becoming piezoelectric film 1621) overlying the first electrode 1710 and forming one or more release holes 2420 within the piezoelectric film 1620 and the first passivation layer 1810 overlying the sacrificial layer 1910. The via forming processes can include various types of etching processes.

FIGS. 25A-25C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a second electrode 2510 overlying the piezoelectric film 1621. In an example, the formation of the second electrode 2510 includes depositing molybdenum (Mo), ruthenium (Ru), tungsten (W), or other like materials; and then etching the second electrode 2510 to form an electrode cavity 2511 and to remove portion 2511 from the second electrode to form a top metal 2520. Further, the top metal 2520 is physically coupled to the first electrode 1720 through electrode contact via 2410.

FIGS. 26A-26C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a first contact metal 2610 overlying a portion of the second electrode 2510 and a portion of the piezoelectric film 1621, and forming a second contact metal 2611 overlying a portion of the top metal 2520 and a portion of the piezoelectric film 1621. In an example, the first and second contact metals can include gold (Au), aluminum (Al), copper (Cu), nickel (Ni), aluminum bronze (AlCu), or related alloys of these materials or other like materials.

FIGS. 27A-27C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a second passivation layer 2710 overlying the second electrode 2510, the top metal 2520, and the piezoelectric film 1621. In an example, the second passivation layer 2710 can include silicon nitride (SiN), silicon oxide (SiO), or other like materials. In a specific example, the second passivation layer 2710 can have a thickness ranging from about 50 nm to about 100 nm. In an example, the release holes 2420 can be formed after the second passivation layer 2710. In this case the release holes 2420 are formed within the piezoelectric film 1621 and the first passivation layer 1810 overlying the sacrificial layer 1910.

FIGS. 28A-28C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of removing the sacrificial layer 1910 to form an air cavity 2810. In an example, the removal process can include a poly-Si etch or an a-Si etch, or the like.

FIGS. 29A-29C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the second electrode 2510 and the top metal 2520 to form a processed second electrode 2910 and a processed top metal 2920. This step can follow the formation of second electrode 2510 and top metal 2520. In an example, the processing of these two components includes depositing molybdenum (Mo), ruthenium (Ru), tungsten (W), or other like materials; and then etching (e.g., dry etch or the like) this material to form the processed second electrode 2910 with an electrode cavity 2912 and the processed top metal 2920. The processed top metal 2920 remains separated from the processed second electrode 2910 by the removal of portion 2911. In a specific example, the processed second electrode 2910 is characterized by the addition of an energy confinement structure configured on the processed second electrode 2910 to increase Q.

FIGS. 30A-30C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 1710 to form a processed first electrode 2310. This step can follow the formation of first electrode 1710. In an example, the processing of these two components includes depositing molybdenum (Mo), ruthenium (Ru), tungsten (W), or other like materials; and then etching (e.g., dry etch or the like) this material to form the processed first electrode 3010 with an electrode cavity, similar to the processed second electrode 2910. Air cavity 2811 shows the change in cavity shape due to the processed first electrode 3010. In a specific example, the processed first electrode 3010 is characterized by the addition of an energy confinement structure configured on the processed second electrode 3010 to increase Q.

FIGS. 31A-31C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 1710, to form a processed first electrode 2310, and the second electrode 2510/top metal 2520 to form a processed second electrode 2910/processed top metal 2920. These steps can follow the formation of each respective electrode, as described for FIGS. 29A-29C and 30A-30C. Those of ordinary skill in the art will recognize other variations, modifications, and alternatives.

FIGS. 32A-32C through FIGS. 46A-46C illustrate a method of fabrication for an acoustic resonator device using a transfer structure without sacrificial layer. In these figure series described below, the "A" figures show simplified diagrams illustrating top cross-sectional views of single crystal resonator devices according to various embodiments of the present invention. The "B" figures show simplified diagrams illustrating lengthwise cross-sectional views of the same devices in the "A" figures. Similarly, the "C" figures show simplified diagrams illustrating widthwise cross-sectional views of the same devices in the "A" figures. In some cases, certain features are omitted to highlight other features and the relationships between such features. Those of ordinary skill in the art will recognize variations, modifications, and alternatives to the examples shown in these figure series.

Figure 32C:
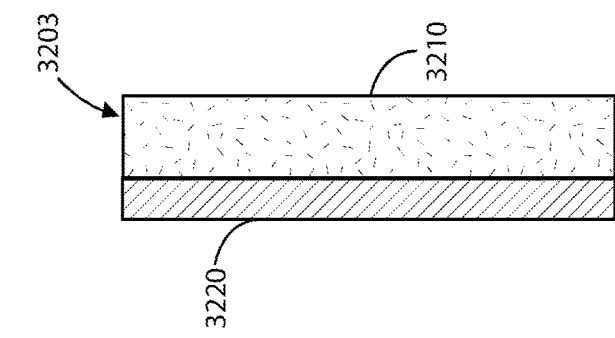
Figure 32A:
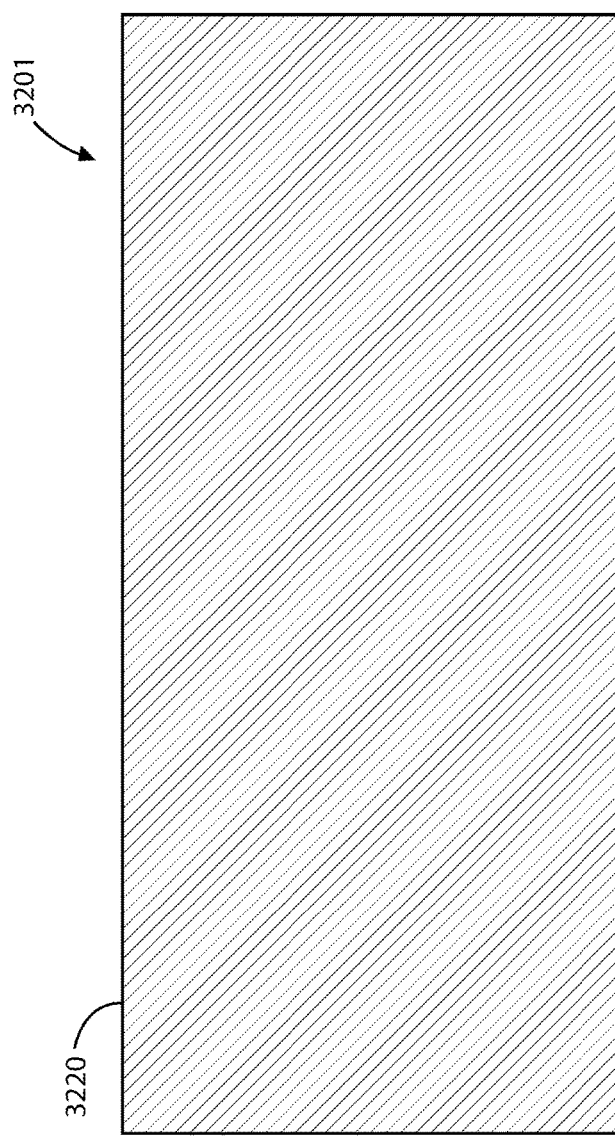
Figure 32B:
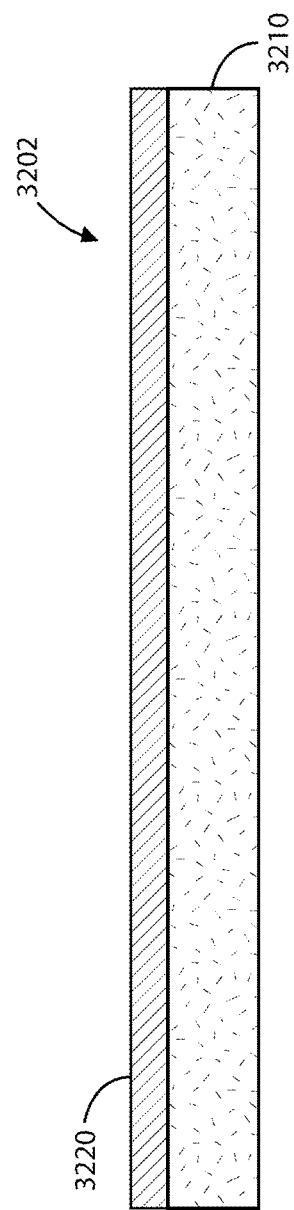

FIGS. 32A-32C are simplified diagrams illustrating various cross-sectional views of a single crystal acoustic resonator device and of method steps for a transfer process for single crystal acoustic resonator devices according to an example of the present invention. As shown, these figures illustrate the method step of forming a piezoelectric film 3220 overlying a growth substrate 3210. In an example, the growth substrate 3210 can include silicon (S), silicon carbide (SiC), or other like materials. The piezoelectric film 3220 can be an epitaxial film including aluminum nitride (AlN), aluminum scandium nitride (AlScN), gallium nitride (GaN), or other like materials. Additionally, this piezoelectric substrate can be subjected to a thickness trim.

Figure 33C:
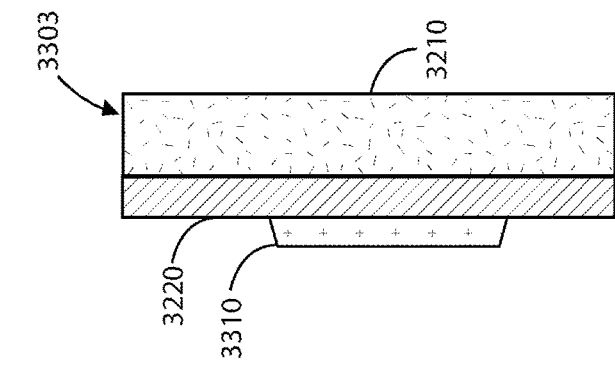
Figure 33A:
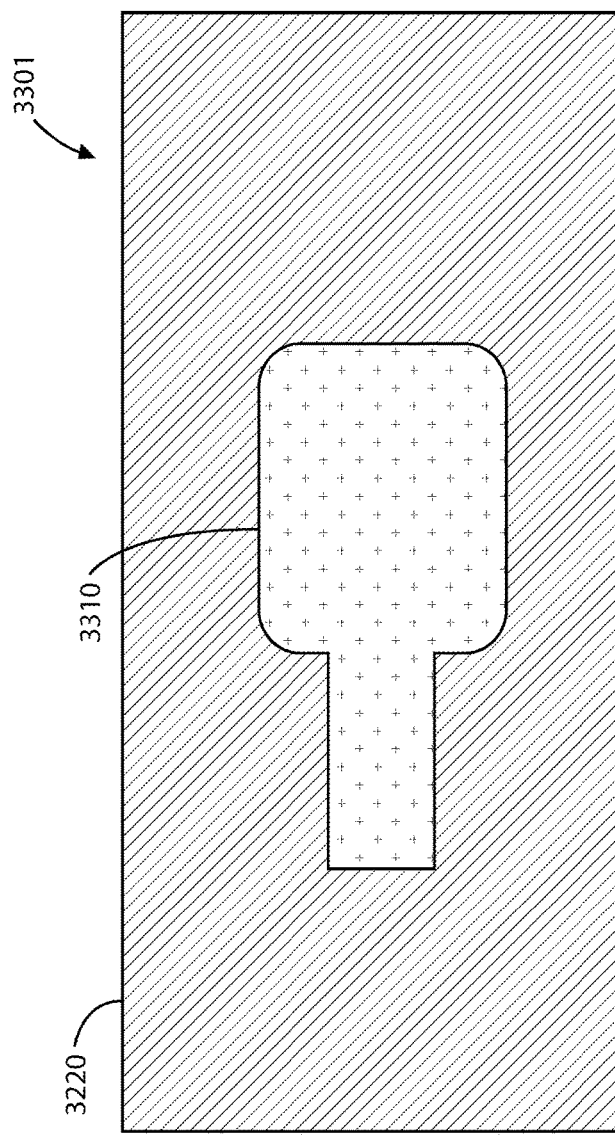
Figure 33B:
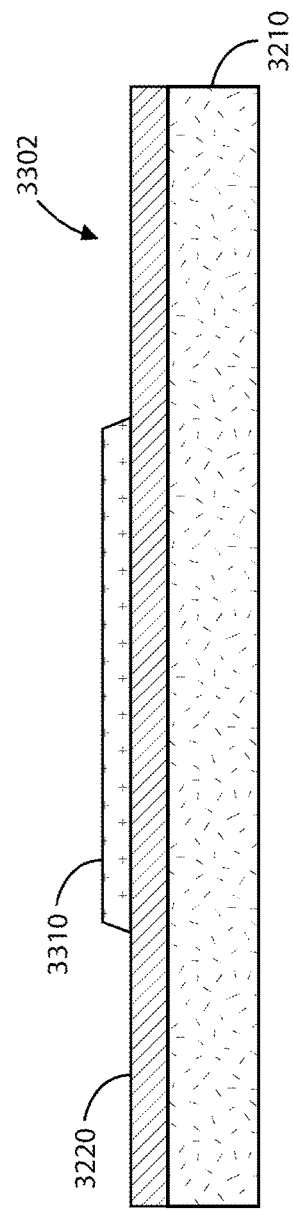

FIGS. 33A-33C are simplified diagrams illustrating various cross-sectional views of a single crystal acoustic resonator device and of method steps for a transfer process for single crystal acoustic resonator devices according to an example of the present invention. As shown, these figures illustrate the method step of forming a first electrode 3310 overlying the surface region of the piezoelectric film 3220. In an example, the first electrode 3310 can include molybdenum (Mo), ruthenium (Ru), tungsten (W), or other like materials. In a specific example, the first electrode 3310 can be subjected to a dry etch with a slope. As an example, the slope can be about 60 degrees.

FIGS. 34A-34C are simplified diagrams illustrating various cross-sectional views of a single crystal acoustic resonator device and of method steps for a transfer process for single crystal acoustic resonator devices according to an example of the present invention. As shown, these figures illustrate the method step of forming a first passivation layer 3410 overlying the first electrode 3310 and the piezoelectric film 3220. In an example, the first passivation layer 3410 can include silicon nitride (SiN), silicon oxide (SiO), or other like materials. In a specific example, the first passivation layer 3410 can have a thickness ranging from about 50 nm to about 100 nm.

Figure 35C:
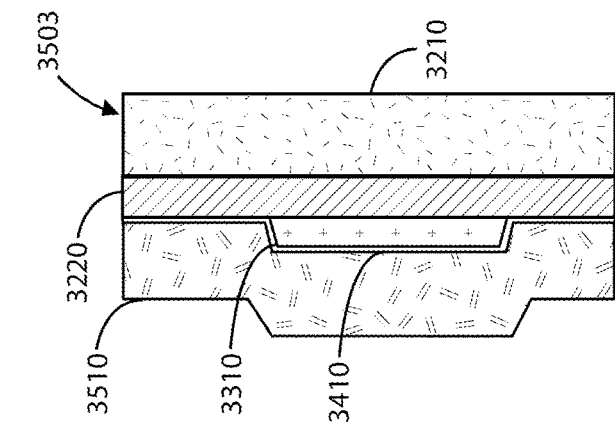
Figure 35A:
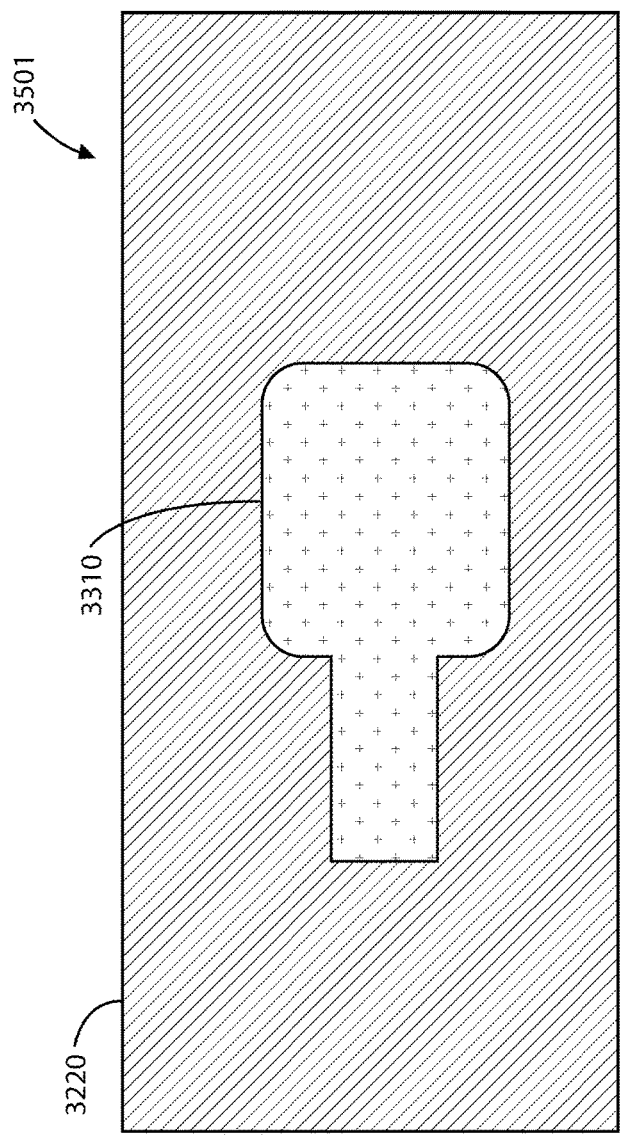
Figure 35B:
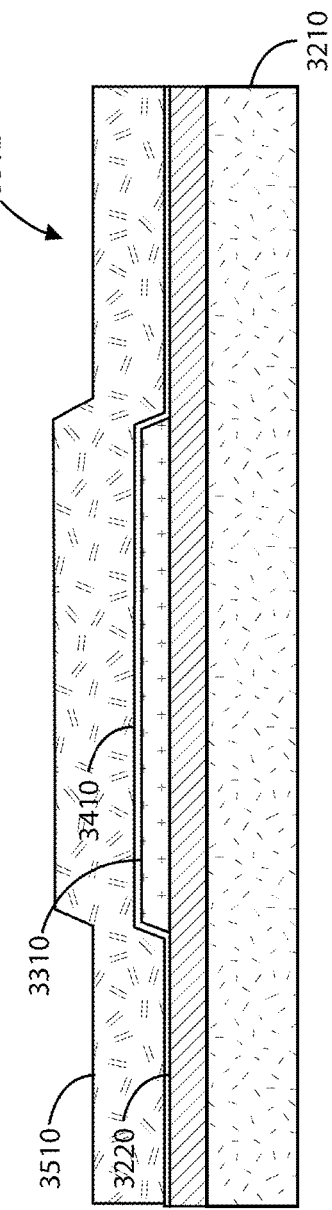

FIGS. 35A-35C are simplified diagrams illustrating various cross-sectional views of a single crystal acoustic resonator device and of method steps for a transfer process for single crystal acoustic resonator devices according to an example of the present invention. As shown, these figures illustrate the method step of forming a support layer 3510 overlying the first electrode 3310, and the piezoelectric film 3220. In an example, the support layer 3510 can include silicon dioxide ($SiO_2$), silicon nitride (SiN), or other like materials. In a specific example, this support layer 3510 can be deposited with a thickness of about 2-3 um. As described above, other support layers (e.g., SiNx) can be used in the case of a PSG sacrificial layer.

Figure 36C:
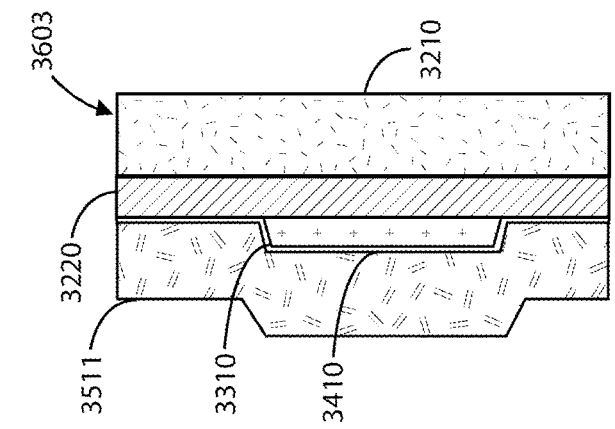
Figure 36A:
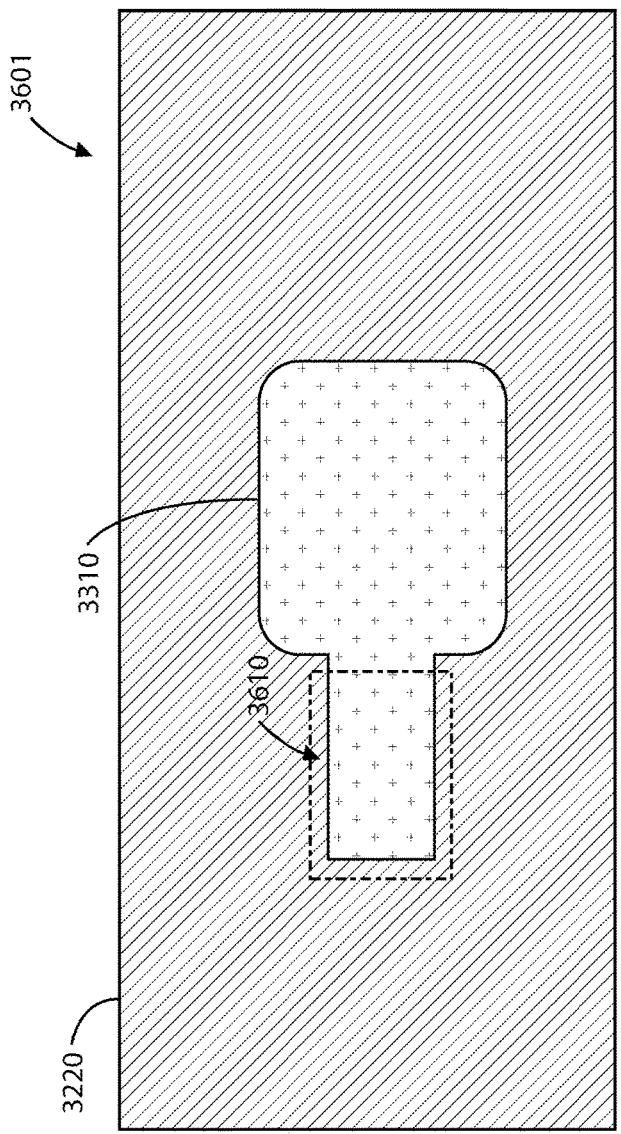
Figure 36B:
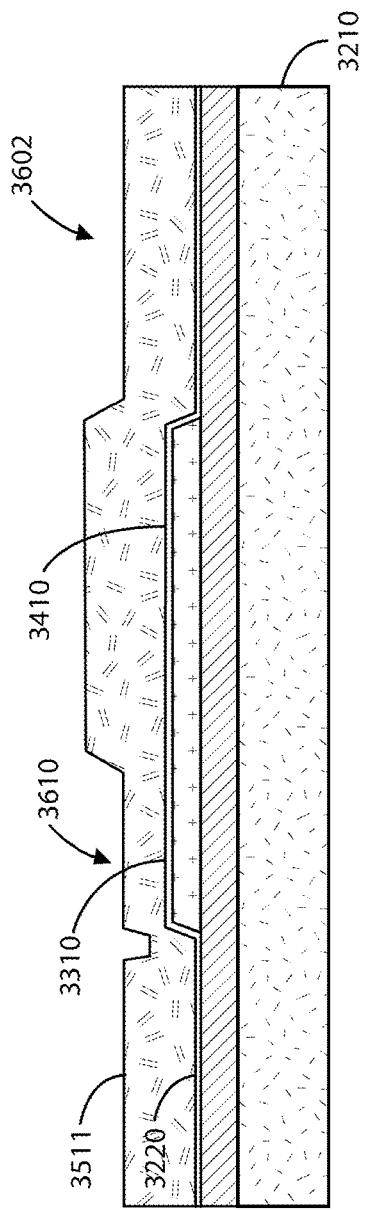

FIGS. 36A-36C are simplified diagrams illustrating various cross-sectional views of a single crystal acoustic resonator device and of method steps for a transfer process for single crystal acoustic resonator devices according to an example of the present invention. As shown, these figures illustrate the optional method step of processing the support layer 3510 (to form support layer 3511) in region 3610. In an example, the processing can include a partial etch of the support layer 3510 to create a flat bond surface. In a specific example, the processing can include a cavity region. In other examples, this step can be replaced with a polishing process such as a chemical-mechanical planarization process or the like.

FIGS. 37A-37C are simplified diagrams illustrating various cross-sectional views of a single crystal acoustic resonator device and of method steps for a transfer process for single crystal acoustic resonator devices according to an example of the present invention. As shown, these figures illustrate the method step of forming an air cavity 3710 within a portion of the support layer 3511 (to form support layer 3512). In an example, the cavity formation can include an etching process that stops at the first passivation layer 3410.

FIGS. 38A-38C are simplified diagrams illustrating various cross-sectional views of a single crystal acoustic resonator device and of method steps for a transfer process for single crystal acoustic resonator devices according to an example of the present invention. As shown, these figures illustrate the method step of forming one or more cavity vent holes 3810 within a portion of the piezoelectric film 3220 through the first passivation layer 3410. In an example, the cavity vent holes 3810 connect to the air cavity 3710.

FIGS. 39A-39C are simplified diagrams illustrating various cross-sectional views of a single crystal acoustic resonator device and of method steps for a transfer process for single crystal acoustic resonator devices according to an example of the present invention. As shown, these figures illustrate flipping the device and physically coupling overlying the support layer 3512 overlying a bond substrate 3910. In an example, the bond substrate 3910 can include a bonding support layer 3920 (SiO$_2$ or like material) overlying a substrate having silicon (Si), sapphire (Al$_2$O$_3$), silicon dioxide (SiO$_2$), silicon carbide (SiC), or other like materials. In a specific embodiment, the bonding support layer 3920 of the bond substrate 3910 is physically coupled to the polished support layer 3512. Further, the physical coupling process can include a room temperature bonding process following by a 300 degree Celsius annealing process.

FIGS. 40A-40C are simplified diagrams illustrating various cross-sectional views of a single crystal acoustic resonator device and of method steps for a transfer process for single crystal acoustic resonator devices according to an example of the present invention. As shown, these figures illustrate the method step of removing the growth substrate 3210 or otherwise the transfer of the piezoelectric film 3220. In an example, the removal process can include a grinding process, a blanket etching process, a film transfer process, an ion implantation transfer process, a laser crack transfer process, or the like and combinations thereof.

Figure 41C:
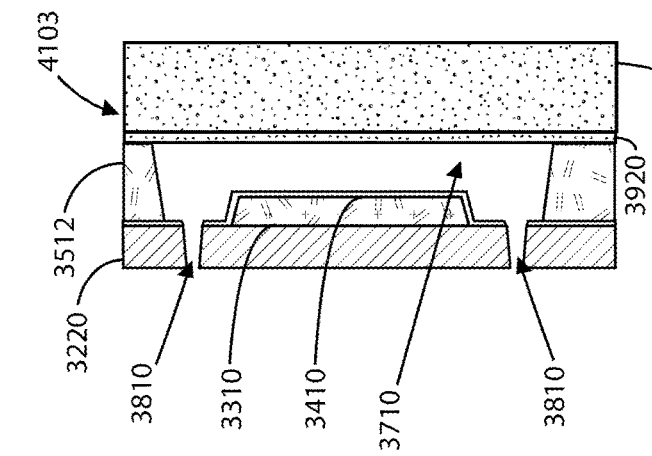
Figure 41A:
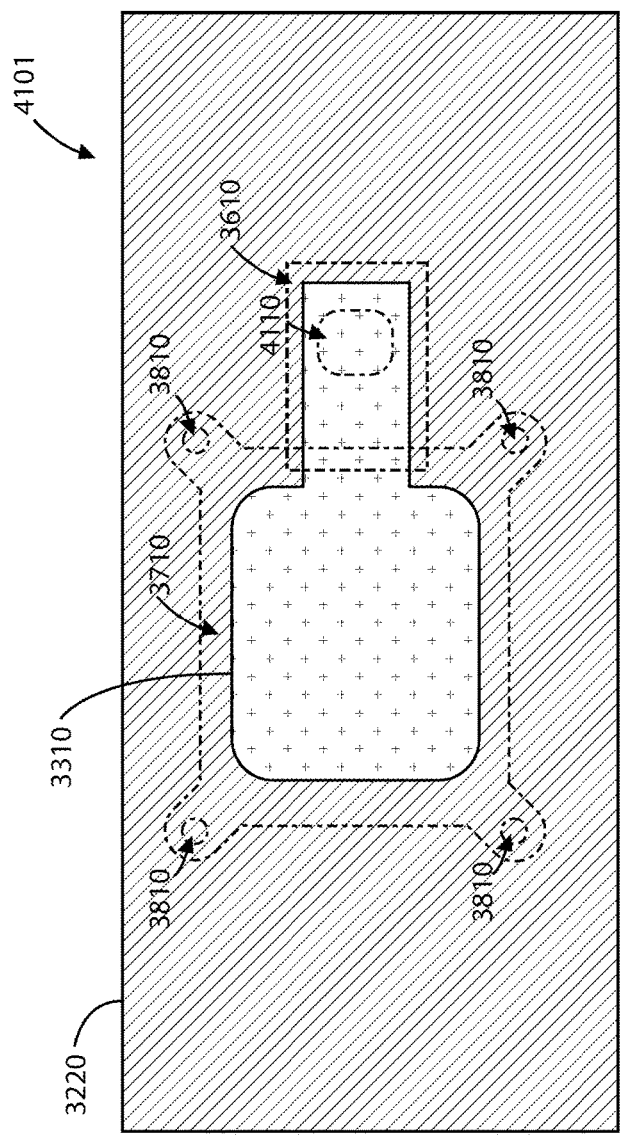
Figure 41B:
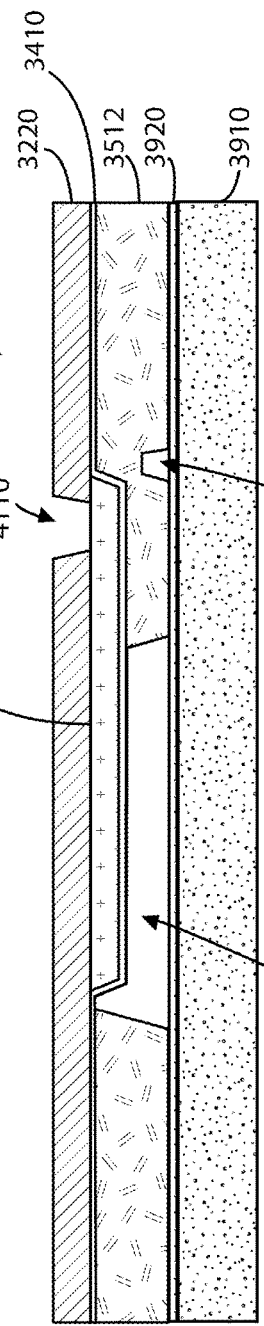

FIGS. 41A-41C are simplified diagrams illustrating various cross-sectional views of a single crystal acoustic resonator device and of method steps for a transfer process for single crystal acoustic resonator devices according to an example of the present invention. As shown, these figures illustrate the method step of forming an electrode contact via 4110 within the piezoelectric film 3220 overlying the first electrode 3310. The via forming processes can include various types of etching processes.

FIGS. 42A-42C are simplified diagrams illustrating various cross-sectional views of a single crystal acoustic resonator device and of method steps for a transfer process for single crystal acoustic resonator devices according to an example of the present invention. As shown, these figures illustrate the method step of forming a second electrode 4210 overlying the piezoelectric film 3220. In an example, the formation of the second electrode 4210 includes depositing molybdenum (Mo), ruthenium (Ru), tungsten (W), or other like materials; and then etching the second electrode 4210 to form an electrode cavity 4211 and to remove portion 4211 from the second electrode to form a top metal 4220. Further, the top metal 4220 is physically coupled to the first electrode 3310 through electrode contact via 4110.

FIGS. 43A-43C are simplified diagrams illustrating various cross-sectional views of a single crystal acoustic resonator device and of method steps for a transfer process for single crystal acoustic resonator devices according to an example of the present invention. As shown, these figures illustrate the method step of forming a first contact metal 4310 overlying a portion of the second electrode 4210 and a portion of the piezoelectric film 3220, and forming a second contact metal 4311 overlying a portion of the top metal 4220 and a portion of the piezoelectric film 3220. In an example, the first and second contact metals can include gold (Au), aluminum (Al), copper (Cu), nickel (Ni), aluminum bronze (AlCu), or other like materials. This figure also shows the method step of forming a second passivation layer 4320 overlying the second electrode 4210, the top metal 4220, and the piezoelectric film 3220. In an example, the second passivation layer 4320 can include silicon nitride (SiN), silicon oxide (SiO), or other like materials. In a specific example, the second passivation layer 4320 can have a thickness ranging from about 50 nm to about 100 nm.

FIGS. 44A-44C are simplified diagrams illustrating various cross-sectional views of a single crystal acoustic resonator device and of method steps for a transfer process for single crystal acoustic resonator devices according to another example of the present invention. As shown, these figures illustrate the method step of processing the second electrode 4210 and the top metal 4220 to form a processed second electrode 4410 and a processed top metal 4420. This step can follow the formation of second electrode 4210 and top metal 4220. In an example, the processing of these two components includes depositing molybdenum (Mo), ruthenium (Ru), tungsten (W), or other like materials; and then etching (e.g., dry etch or the like) this material to form the processed second electrode 4410 with an electrode cavity 4412 and the processed top metal 4420. The processed top metal 4420 remains separated from the processed second electrode 4410 by the removal of portion 4411. In a specific example, the processed second electrode 4410 is characterized by the addition of an energy confinement structure configured on the processed second electrode 4410 to increase Q.

FIGS. 45A-45C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 3310 to form a processed first electrode 4510. This step can follow the formation of first electrode 3310. In an example, the processing of these two components includes depositing molybdenum (Mo), ruthenium (Ru), tungsten (W), or other like materials; and then etching (e.g., dry etch or the like) this material to form the processed first electrode 4510 with an electrode cavity, similar to the processed second electrode 4410. Air cavity 3711 shows the change in cavity shape due to the processed first electrode 4510. In a specific example, the processed first electrode 4510 is characterized by the addition of an energy confinement structure configured on the processed second electrode 4510 to increase Q.

FIGS. 46A-46C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 3310, to form a processed first electrode 4510, and the second electrode 4210/top metal 4220 to form a processed second electrode 4410/processed top metal 4420. These steps can follow the formation of each respective electrode, as described for FIGS. 44A-44C and 45A-45C. Those of ordinary skill in the art will recognize other variations, modifications, and alternatives.

FIGS. 47A-47C through FIGS. 59A-59C illustrate a method of fabrication for an acoustic resonator device using a transfer structure with a multilayer mirror structure. In these figure series described below, the "A" figures show simplified diagrams illustrating top cross-sectional views of single crystal resonator devices according to various embodiments of the present invention. The "B" figures show simplified diagrams illustrating lengthwise cross-sectional views of the same devices in the "A" figures. Similarly, the "C" figures show simplified diagrams illustrating widthwise cross-sectional views of the same devices in the "A" figures. In some cases, certain features are omitted to highlight other features and the relationships between such features. Those of ordinary skill in the art will recognize variations, modifications, and alternatives to the examples shown in these figure series.

Figure 47C:
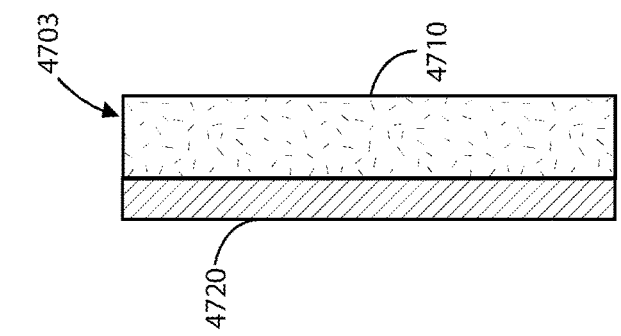
FIGS. 47A-47C though
Figure 47A:
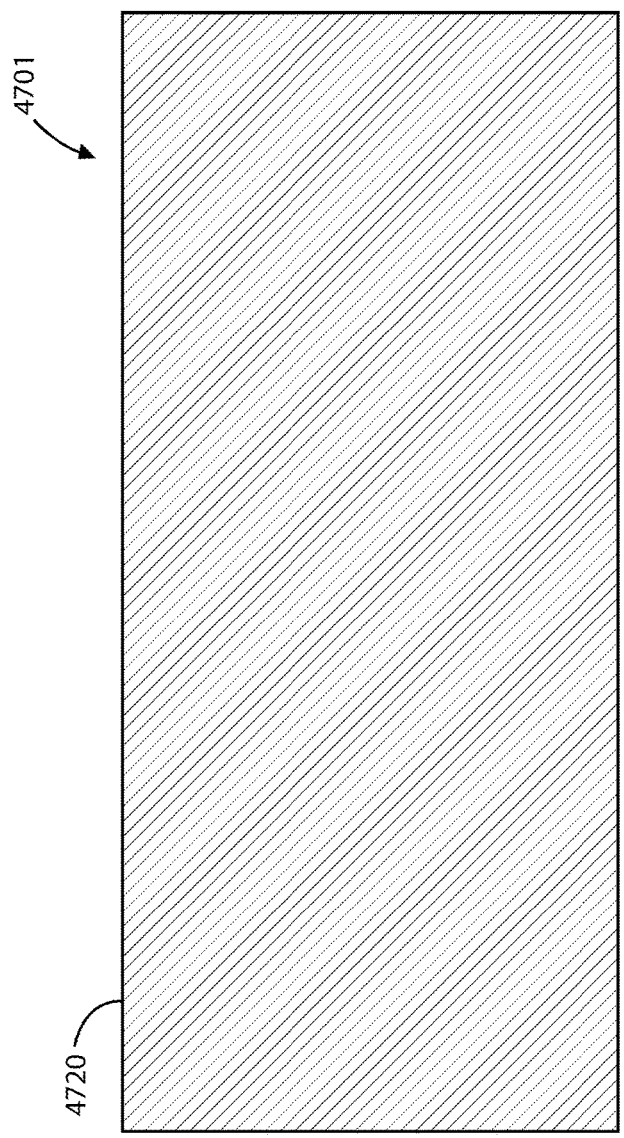
Figure 47B:
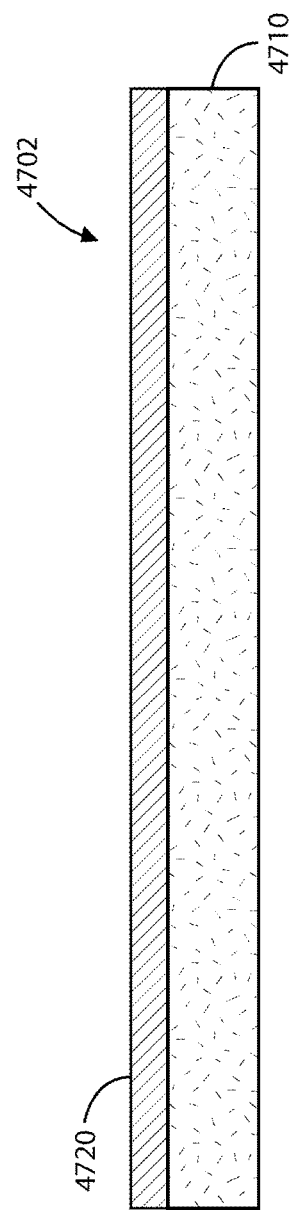

FIGS. 47A-47C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a piezoelectric film 4720 overlying a growth substrate 4710. In an example, the growth substrate 4710 can include silicon (S), silicon carbide (SiC), or other like materials. The piezoelectric film 4720 can be an epitaxial film including aluminum nitride (AlN), aluminum scandium nitride (AlScN), gallium nitride (GaN), or other like materials. Additionally, this piezoelectric substrate can be subjected to a thickness trim.

Figure 48C:
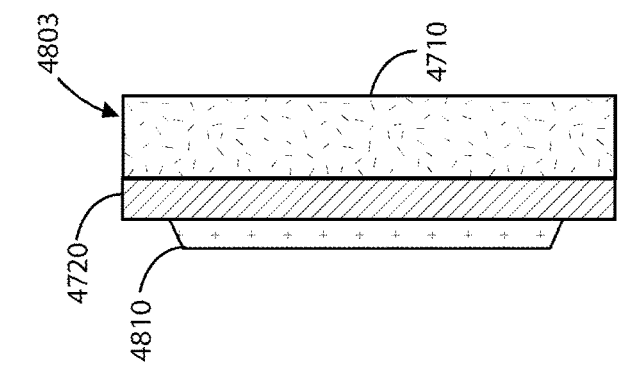
Figure 48A:
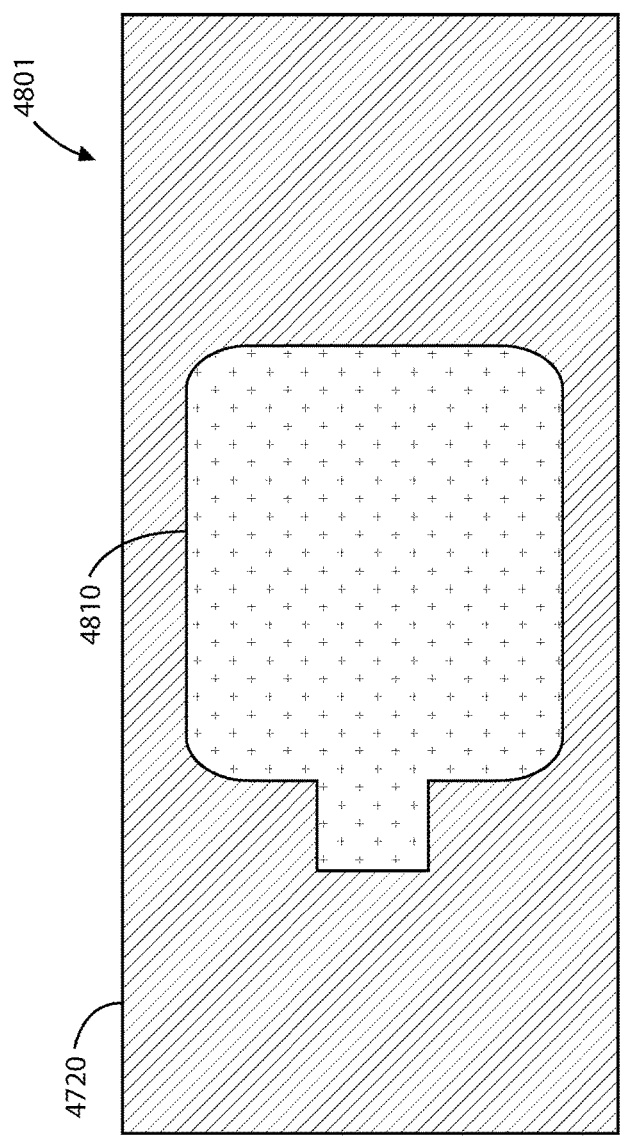
Figure 48B:
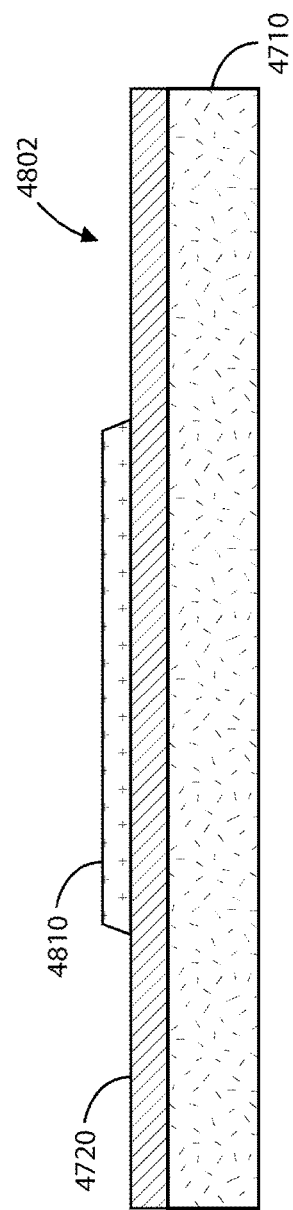

FIGS. 48A-48C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a first electrode 4810 overlying the surface region of the piezoelectric film 4720. In an example, the first electrode 4810 can include molybdenum (Mo), ruthenium (Ru), tungsten (W), or other like materials. In a specific example, the first electrode 4810 can be subjected to a dry etch with a slope. As an example, the slope can be about 60 degrees.

FIGS. 49A-49C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a multilayer mirror or reflector structure. In an example, the multilayer mirror includes at least one pair of layers with a low impedance layer 4910 and a high impedance layer 4920. In FIGS. 49A-49C, two pairs of low/high impedance layers are shown (low: 4910 and 4911; high: 4920 and 4921). In an example, the mirror/reflector area can be larger than the resonator area and can encompass the resonator area. In a specific embodiment, each layer thickness is about ¼ of the wavelength of an acoustic wave at a targeting frequency. The layers can be deposited in sequence and be etched afterwards, or each layer can be deposited and etched individually. In another example, the first electrode 4810 can be patterned after the mirror structure is patterned.

FIGS. 50A-50C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a support layer 5010 overlying the mirror structure (layers 4910, 4911, 4920, and 4921), the first electrode 4810, and the piezoelectric film 4720. In an example, the support layer 5010 can include silicon dioxide ($SiO_2$), silicon nitride (SiN), or other like materials. In a specific example, this support layer 5010 can be deposited with a thickness of about 2-3 um. As described above, other support layers (e.g., SiNx) can be used.

FIGS. 51A-51C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of polishing the support layer 5010 to form a polished support layer 5011. In an example, the polishing process can include a chemical-mechanical planarization process or the like.

FIGS. 52A-52C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate flipping the device and physically coupling overlying the support layer 5011 overlying a bond substrate 5210. In an example, the bond substrate 5210 can include a bonding support layer 5220 ($SiO_2$ or like material) overlying a substrate having silicon (Si), sapphire ($Al_2O_3$), silicon dioxide ($SiO_2$), silicon carbide (SiC), or other like materials. In a specific embodiment, the bonding support layer 5220 of the bond substrate 5210 is physically coupled to the polished support layer 5011. Further, the physical coupling process can include a room temperature bonding process following by a 300 degree Celsius annealing process.

FIGS. 53A-53C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of removing the growth substrate 4710 or otherwise the transfer of the piezoelectric film 4720. In an example, the removal process can include a grinding process, a blanket etching process, a film transfer process, an ion implantation transfer process, a laser crack transfer process, or the like and combinations thereof.

Figure 54C:
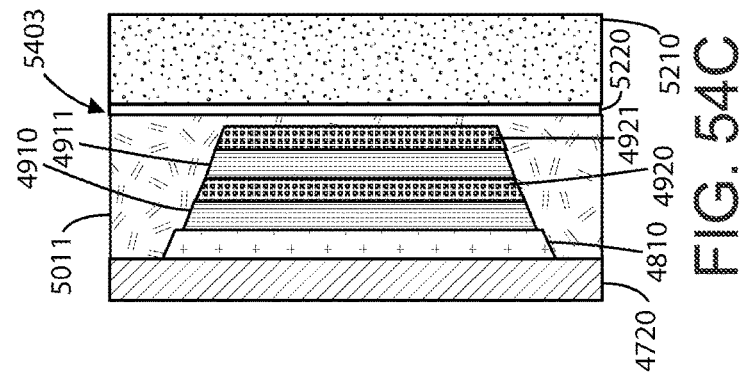
Figure 54A:
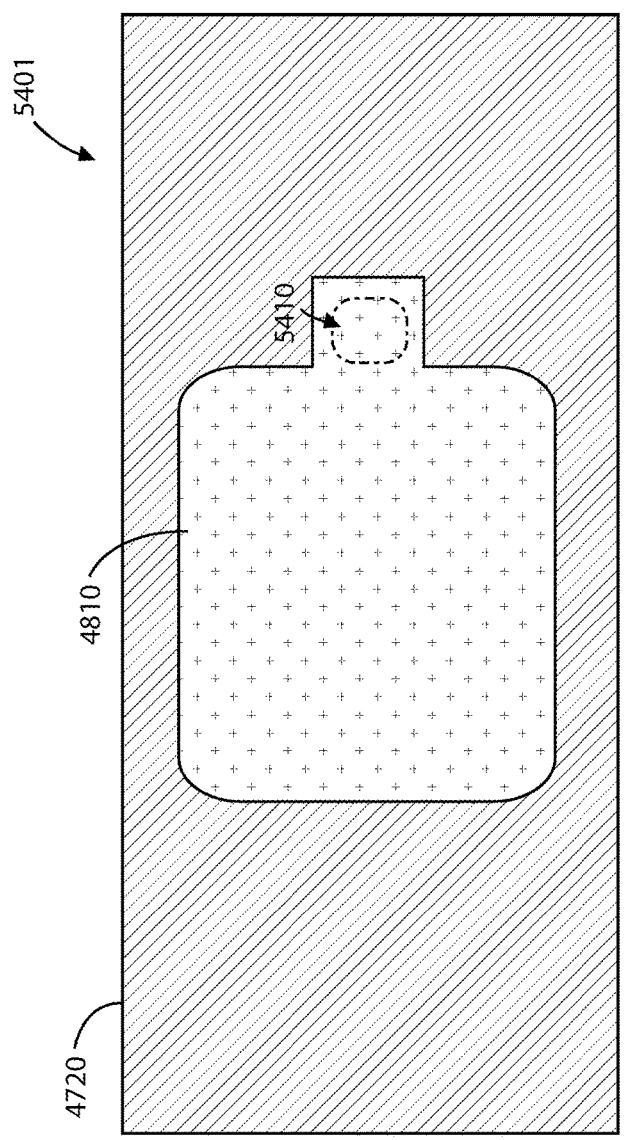
Figure 54B:
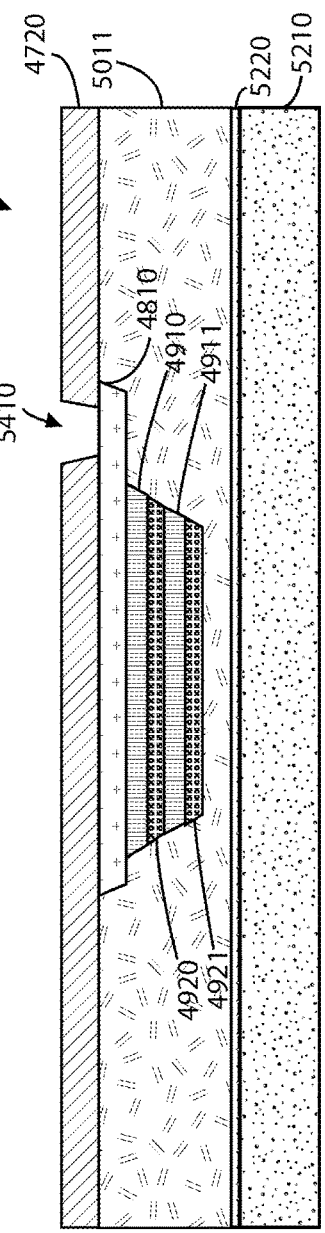

FIGS. 54A-54C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming an electrode contact via 5410 within the piezoelectric film 4720 overlying the first electrode 4810. The via forming processes can include various types of etching processes.

FIGS. 55A-55C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a second electrode 5510 overlying the piezoelectric film 4720. In an example, the formation of the second electrode 5510 includes depositing molybdenum (Mo), ruthenium (Ru), tungsten (W), or other like materials; and then etching the second electrode 5510 to form an electrode cavity 5511 and to remove portion 5511 from the second electrode to form a top metal 5520. Further, the top metal 5520 is physically coupled to the first electrode 5520 through electrode contact via 5410.

FIGS. 56A-56C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a first contact metal 5610 overlying a portion of the second electrode 5510 and a portion of the piezoelectric film 4720, and forming a second contact metal 5611 overlying a portion of the top metal 5520 and a portion of the piezoelectric film 4720. In an example, the first and second contact metals can include gold (Au), aluminum (Al), copper (Cu), nickel (Ni), aluminum bronze (AlCu), or other like materials. This figure also shows the method step of forming a second passivation layer 5620 overlying the second electrode 5510, the top metal 5520, and the piezoelectric film 4720. In an example, the second passivation layer 5620 can include silicon nitride (SiN), silicon oxide (SiO), or other like materials. In a specific example, the second passivation layer 5620 can have a thickness ranging from about 50 nm to about 100 nm.

Figure 57C:
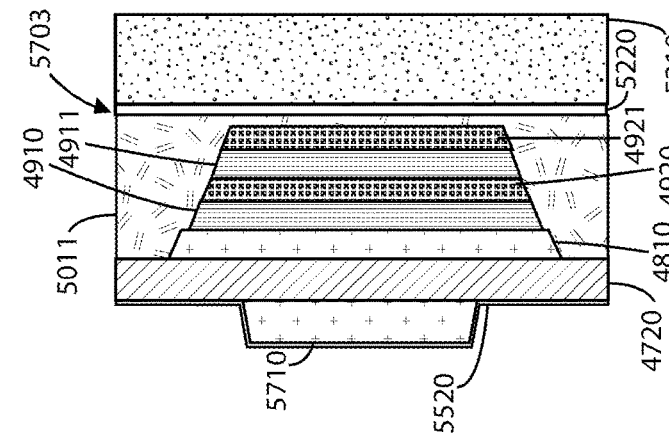
Figure 57A:
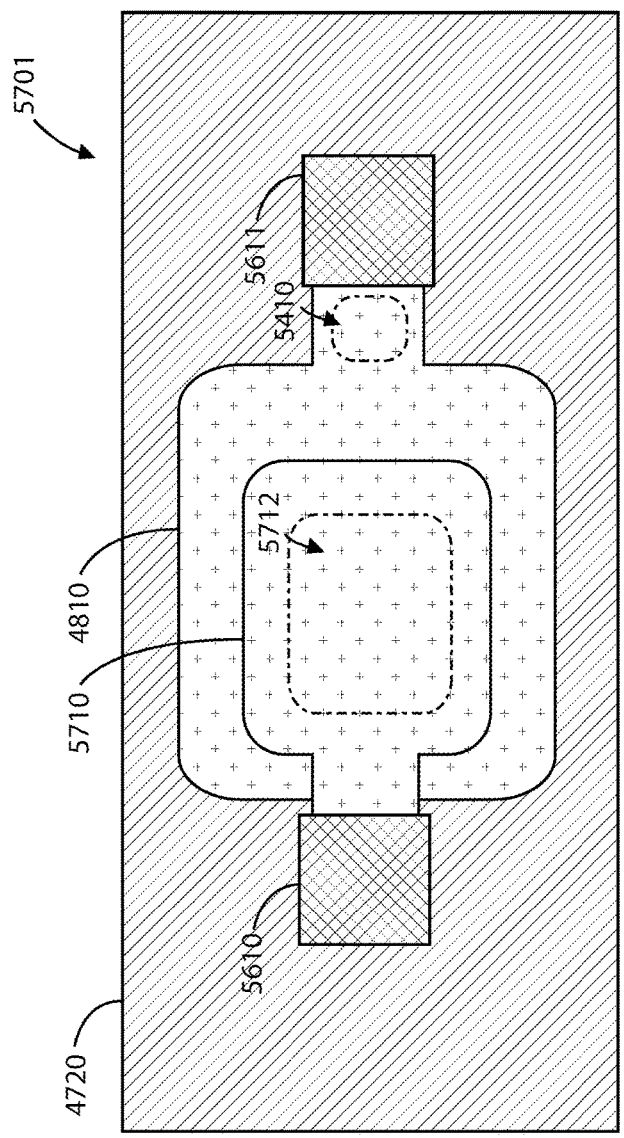
Figure 57B:
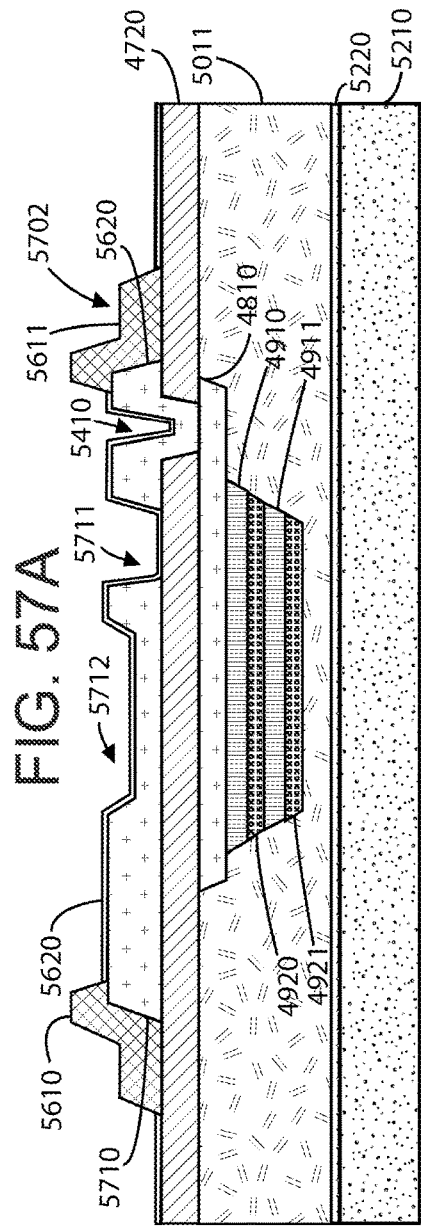

FIGS. 57A-57C are simplified diagrams illustrating various cross-sectional views of a single crystal acoustic resonator device and of method steps for a transfer process with a multilayer mirror for single crystal acoustic resonator devices according to another example of the present invention. As shown, these figures illustrate the method step of processing the second electrode 5510 and the top metal 5520 to form a processed second electrode 5710 and a processed top metal 5720. This step can follow the formation of second electrode 5710 and top metal 5720. In an example, the processing of these two components includes depositing molybdenum (Mo), ruthenium (Ru), tungsten (W), or other like materials; and then etching (e.g., dry etch or the like) this material to form the processed second electrode 5410 with an electrode cavity 5712 and the processed top metal 5720. The processed top metal 5720 remains separated from the processed second electrode 5710 by the removal of portion 5711. In a specific example, this processing gives the second electrode and the top metal greater thickness while creating the electrode cavity 5712. In a specific example, the processed second electrode 5710 is characterized by the addition of an energy confinement structure configured on the processed second electrode 5710 to increase Q.

FIGS. 58A-58C are simplified diagrams illustrating various cross-sectional views of a single crystal acoustic resonator device and of method steps for a transfer process with a multilayer mirror for single crystal acoustic resonator devices according to another example of the present invention. As shown, these figures illustrate the method step of processing the first electrode 4810 to form a processed first electrode 5810. This step can follow the formation of first electrode 4810. In an example, the processing of these two components includes depositing molybdenum (Mo), ruthenium (Ru), tungsten (W), or other like materials; and then etching (e.g., dry etch or the like) this material to form the processed first electrode 5810 with an electrode cavity, similar to the processed second electrode 5710. Compared to the two previous examples, there is no air cavity. In a specific example, the processed first electrode 5810 is characterized by the addition of an energy confinement structure configured on the processed second electrode 5810 to increase Q.

FIGS. 59A-59C are simplified diagrams illustrating various cross-sectional views of a single crystal acoustic resonator device and of method steps for a transfer process with a multilayer mirror for single crystal acoustic resonator devices according to another example of the present invention. As shown, these figures illustrate the method step of processing the first electrode 4810, to form a processed first electrode 5810, and the second electrode 5510/top metal 5520 to form a processed second electrode 5710/processed top metal 5720. These steps can follow the formation of each respective electrode, as described for FIGS. 57A-57C and 58A-58C. Those of ordinary skill in the art will recognize other variations, modifications, and alternatives.

According to an example, the present invention provides for a method of manufacture and resulting acoustic resonator device using dielectric protection layers (DPL). These DPLs can be configured as embedded oxide layers, or the like. In an example, the DPL protects the piezoelectric layer from etching processes that can produce rough surfaces and reduces parasitic capacitance around the perimeter of the resonator when the DPL layer's dielectric constant is lower that that of the piezoelectric layer. The DPL can also improve the temperature coefficient of frequency (TCF) of the acoustic resonator device. In an example, the DPLs can have a thickness ranging from about 50 Angstroms to about 10,000 Angstroms, and can include silicon dioxide ($SiO_2$), silicon nitride (SiN), aluminum nitride (AlN), aluminum oxide ($Al_2O_3$), silicon oxycarbide (SiOC), or other oxide materials and the like. The DPLs can be configured between the top electrode and the piezoelectric layer, between the bottom electrode and the piezoelectric layer, or both. A portion of the DPL within the resonator region (i.e., the region where the top electrode, the bottom electrode, and the piezoelectric layer overlap) can be removed such that the piezoelectric layer is in direct contact with the top or bottom electrode. These layers can be used in combination with any of the previously discussed methods of manufacture of acoustic resonator devices. Those of ordinary skill in the art will recognize other variations, modifications, and alternatives. An example method of manufacturing such acoustic resonator devices are discussed further below with reference to FIGS. 60A-60C to 66A-66C.

FIGS. 60A-60C are simplified diagrams illustrating various cross-sectional views of a method step for manufacturing an acoustic resonator device with a DPL according to an example of the present invention. As shown, these figures illustrate a method step of a modified transfer process for manufacturing a single crystal acoustic resonator device with a DPL 6010 configured overlying the piezoelectric layer 1620. In an example, the DPL 6010 can formed overlying the piezoelectric layer 1620 following the removal of the growth substrate 1610 as illustrated in FIGS. 23A-23C, and the shared reference numbers for devices 6001-6003 refer to the same elements shown in FIGS. 23A-23C.

FIGS. 61A-61C are simplified diagrams illustrating various cross-sectional views of a method step for manufacturing an acoustic resonator device with a DPL following the method step shown in FIGS. 60A-60C. As shown, these figures illustrate the method step of forming an electrode contact via 2410 within the piezoelectric film 1620 (becoming piezoelectric film 1621) and the DPL 6010 (becoming DPL 6011) overlying the first electrode 1710. This step is similar to the method step shown in FIGS. 24A-24C, and the shared reference numbers for devices 6101-6103 refer to the same elements shown in FIGS. 24A-24C.

Figure 62C:
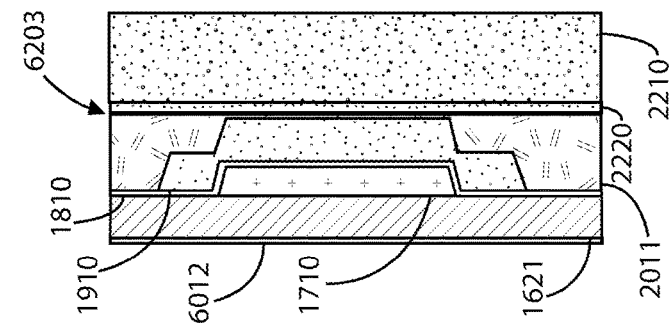
Figure 62A:
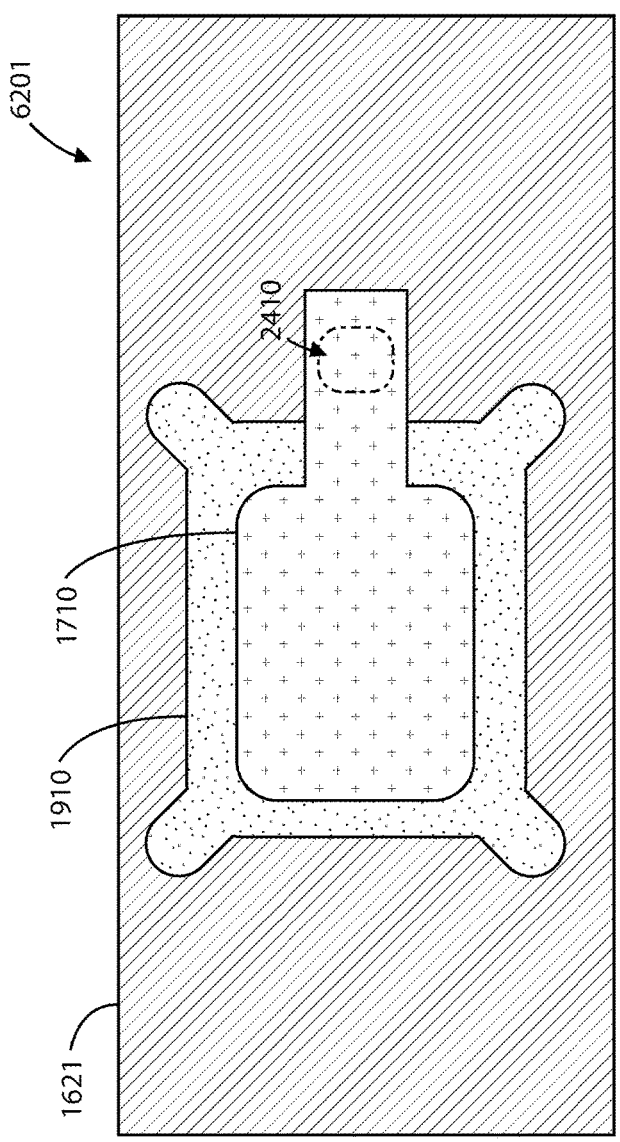
Figure 62B:
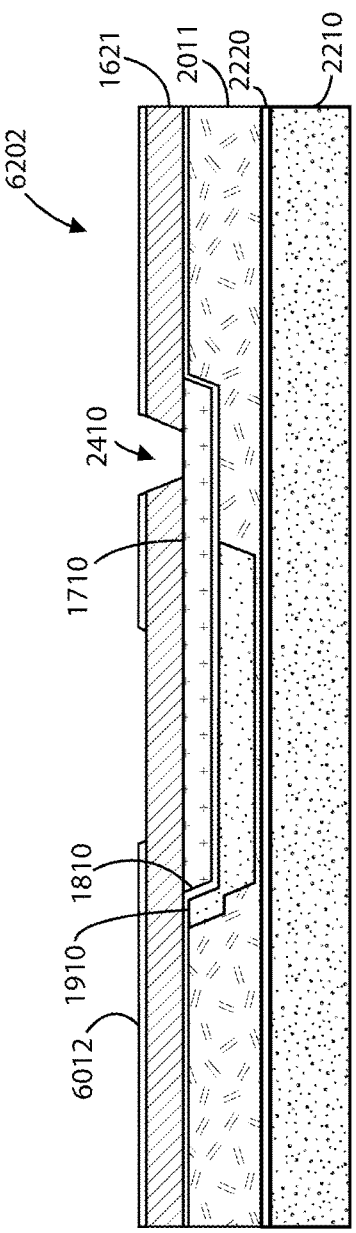

FIGS. 62A-62C are simplified diagrams illustrating various cross-sectional views of a method step for manufacturing an acoustic resonator device with a DPL following the method step shown in FIGS. 61A-61C. As shown, these figures illustrate the method step of removing a portion of the DPL 6011 (becoming DPL 6012) inside the resonator area and exposing a portion of the surface region of the piezoelectric layer 1621. The removal process can include patterning and etching processes, and the like. The remaining portion of the DPL 6012 protects the piezoelectric layer 1621.

Figure 63C:
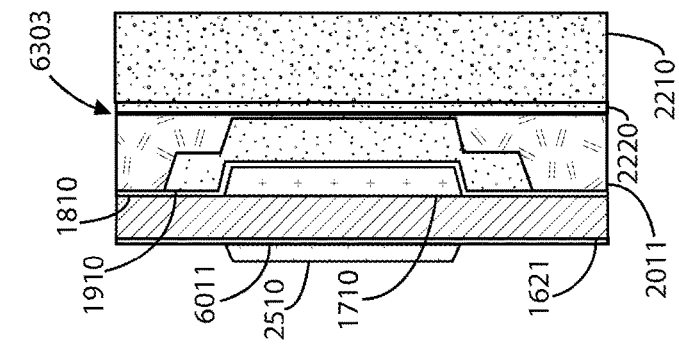
Figure 63A:
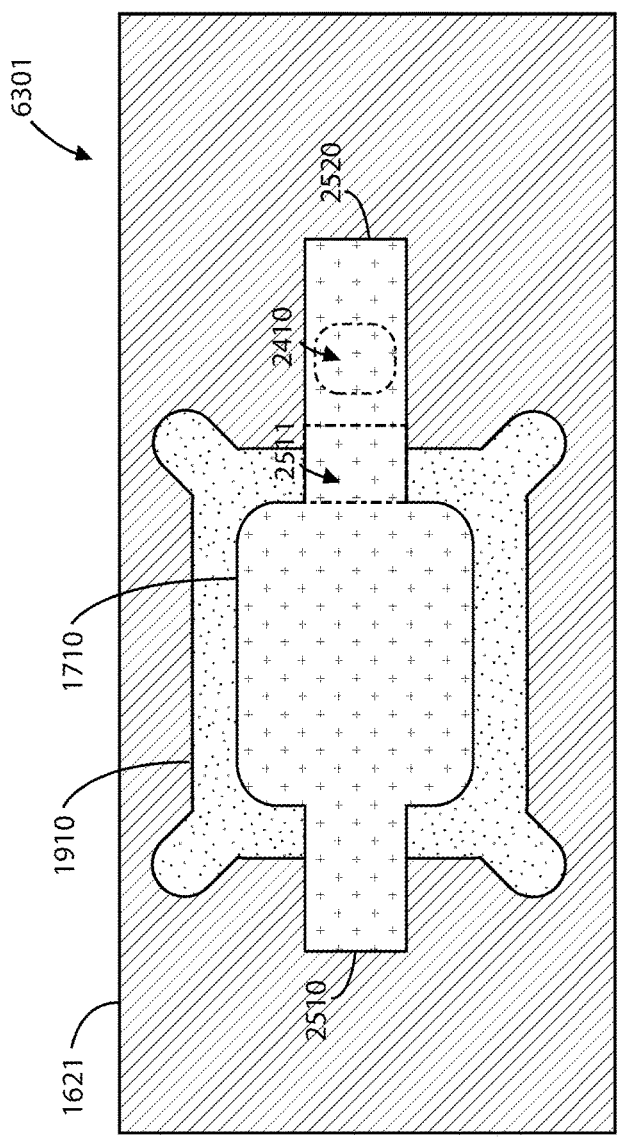
Figure 63B:
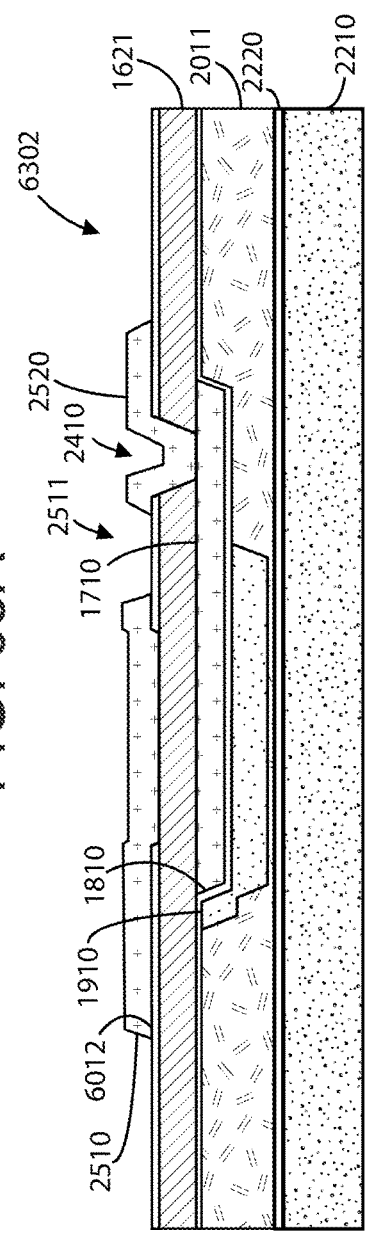

FIGS. 63A-63C are simplified diagrams illustrating various cross-sectional views of a method step for manufacturing an acoustic resonator device with a DPL following the method step shown in FIGS. 62A-62C. As shown, these figures illustrate the method step of forming a second electrode 2510 and a top metal 2520 overlying the piezoelectric film 1621. This step is similar to the method step shown in FIGS. 25A-25C, and the shared reference numbers for devices 6301-6303 refer to the same elements shown in FIGS. 25A-25C. By removing the portion of the DPL 6012 within the resonator area (i.e., where the first and second electrodes overlap with the piezoelectric layer) allows the deposited second electrode 2510 to have direct contact with the piezoelectric layer 1621, which provides for efficient piezoelectric coupling. In a specific example, the DPL removal can leave a small portion of the edge forming a ring around the resonator, which remains between the second electrode 2510 and the piezoelectric layer 1621. When the DPL 6012 is made of a material with a lower acoustic impedance than the second electrode 2510, the DPL ring (i.e., perimeter region) in combination with the second electrode 2510 performs as an acoustic barrier to confine bulk acoustic waves inside the resonator, which improves its quality factor. The width of the remaining DPL under the second electrode 2510 can be adjusted to maximize the quality factor.

Figure 64C:
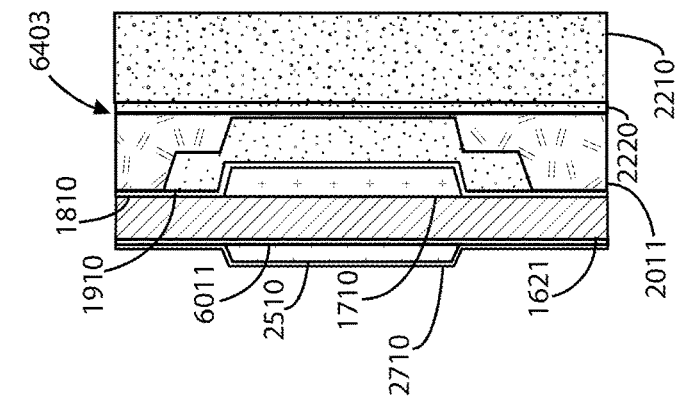
Figure 64A:
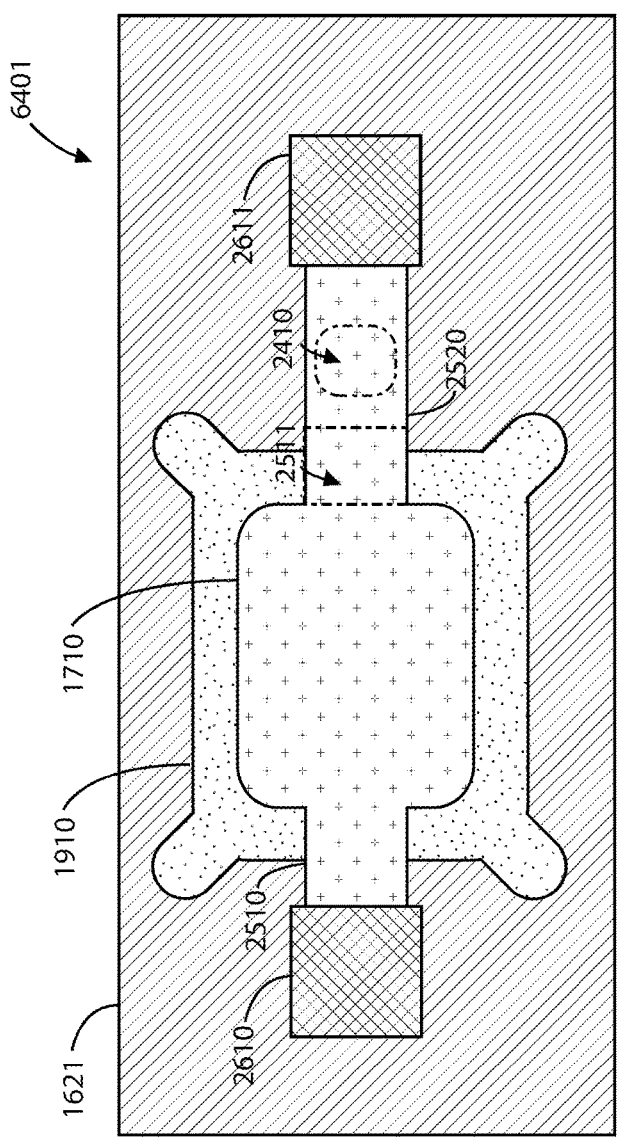
Figure 64B:
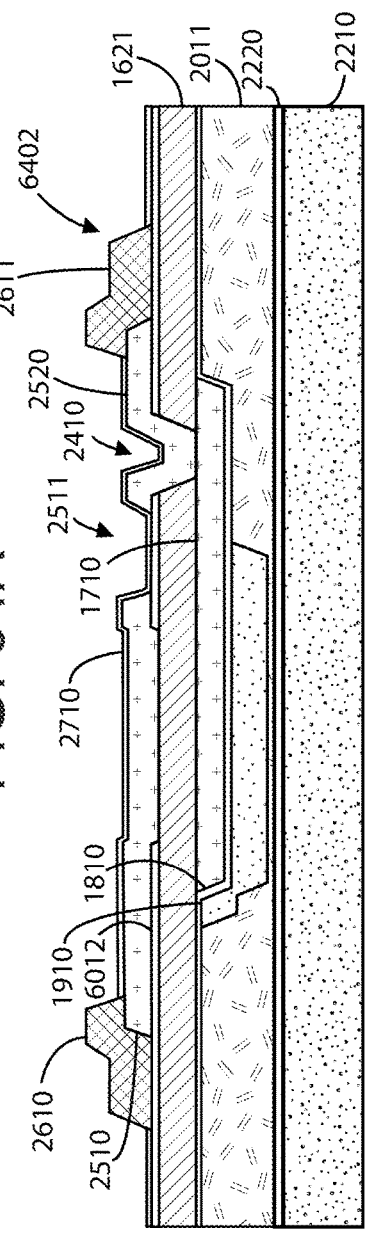

FIGS. 64A-64C are simplified diagrams illustrating various cross-sectional views of a method step for manufacturing an acoustic resonator device with a DPL following the method step shown in FIGS. 63A-63C. As shown, these figures illustrate the method step of forming a first contact metal 2610 overlying a portion of the second electrode 2510 and a portion of the piezoelectric film 1621, and forming a second contact metal 2611 overlying a portion of the top metal 2520 and a portion of the piezoelectric film 1621. These figures also show the method step of forming a second passivation layer 2710 overlying the second electrode 2510, the top metal 2520, and the piezoelectric film 1621. These steps are similar to the method steps shown in FIGS. 26A-26C and FIGS. 27A-27C, and the shared reference numbers for devices 6301-6303 refer to the same elements shown in FIGS. 26A-26C and FIGS. 27A-27C.

FIGS. 65A-65C are simplified diagrams illustrating various cross-sectional views of a a method of manufacturing an acoustic resonator device with a DPL following the method step shown in FIGS. 64A-64C. As shown, these figures illustrate the method step of forming one or more release holes 2420 within the piezoelectric film 1620 and the first passivation layer 1810 overlying the sacrificial layer 1910. This step is similar to the method step shown in FIGS. 24A-24C, and the shared reference numbers for devices 6501-6503 refer to the same elements shown in FIGS. 24A-24C.

FIGS. 66A-66C are simplified diagrams illustrating various cross-sectional views of an acoustic resonator device with a dielectric protection layer (DPL) according to an example of the present invention. As shown, these figures illustrate the method step of removing the sacrificial layer 1910 to form an air cavity 2810. This step is similar to the method step shown in FIGS. 28A-28C, and the shared reference numbers for devices 6601-6603 refer to the same elements shown in FIGS. 28A-28C.

In an example, the DPL can be formed overlying the piezoelectric layer 1620 prior to the formation of the first electrode 1710 (i.e., bottom electrode), as shown in FIGS. 17A-17C. Similar to the example shown in FIGS. 62A-62C, a portion of the DPL can be removed within the resonator region such that the first electrode 1710 is formed in direct contact with the piezoelectric layer 1620. In a specific example, the DPL removal can leave a small portion of the edge forming a ring around the resonator, which remains between the first electrode 1710 and the piezoelectric layer 1620. In another example, the acoustic resonator device can include both a first DPL and a second DPL combining the techniques described previously. The first DPL can be formed overlying the piezoelectric layer 1620 prior to the formation of the first electrode 1710, while the second DPL can be formed overlying the piezoelectric layer 1620 following the removal of the growth substrate 1610 as illustrated in FIGS. 23A-23C.

In each of the preceding examples relating to transfer processes, energy confinement structures can be formed on the first electrode, second electrode, or both. In an example, these energy confinement structures are mass loaded areas surrounding the resonator area. The resonator area is the area where the first electrode, the piezoelectric layer, and the second electrode overlap. The larger mass load in the energy confinement structures lowers a cut-off frequency of the resonator. The cut-off frequency is the lower or upper limit of the frequency at which the acoustic wave can propagate in a direction parallel to the surface of the piezoelectric film. Therefore, the cut-off frequency is the resonance frequency in which the wave is travelling along the thickness direction and thus is determined by the total stack structure of the resonator along the vertical direction. In piezoelectric films (e.g., AlN), acoustic waves with lower frequency than the cut-off frequency can propagate in a parallel direction along the surface of the film, i.e., the acoustic wave exhibits a high-band-cut-off type dispersion characteristic. In this case, the mass loaded area surrounding the resonator provides a barrier preventing the acoustic wave from propagating outside the resonator. By doing so, this feature increases the quality factor of the resonator and improves the performance of the resonator and, consequently, the filter.

In addition, the top single crystalline piezoelectric layer can be replaced by a polycrystalline piezoelectric film. In such films, the lower part that is close to the interface with the substrate has poor crystalline quality with smaller grain sizes and a wider distribution of the piezoelectric polarization orientation than the upper part of the film close to the surface. This is due to the polycrystalline growth of the piezoelectric film, i.e., the nucleation and initial film have random crystalline orientations. Considering AlN as a piezoelectric material, the growth rate along the c-axis or the polarization orientation is higher than other crystalline orientations that increase the proportion of the grains with the c-axis perpendicular to the growth surface as the film grows thicker. In a typical polycrystalline AlN film with about a 1 um thickness, the upper part of the film close to the surface has better crystalline quality and better alignment in terms of piezoelectric polarization. By using the thin film transfer process contemplated in the present invention, it is possible to use the upper portion of the polycrystalline film in high frequency BAW resonators with very thin piezoelectric films. This can be done by removing a portion of the piezoelectric layer during the growth substrate removal process. Of course, there can be other variations, modifications, and alternatives.

While the above is a full description of the specific embodiments, various modifications, alternative constructions and equivalents may be used. As an example, the packaged device can include any combination of elements described above, as well as outside of the present specification. Therefore, the above description and illustrations should not be taken as limiting the scope of the present invention which is defined by the appended claims.

What is claimed is:
1. A method for fabricating an acoustic resonator device, the method comprising:
   forming a piezoelectric film overlying a growth substrate;
   forming a first electrode overlying the piezoelectric film;
   forming a first passivation layer overlying the first electrode and the piezoelectric film;

forming a sacrificial layer overlying the first passivation layer, the first electrode, and the piezoelectric film;

forming a support layer overlying the sacrificial layer, the first passivation layer, the first electrode, and the piezoelectric film thereby forming a device on the growth substrate;

polishing the support layer;

forming a bonding support layer overlying a bond substrate;

flipping the device on the growth substrate and bonding the polished support layer to the bonding support layer thereby forming a bonded device;

removing the growth substrate from the bonded device;

forming a dielectric protection layer (DPL) overlying the piezoelectric layer;

forming an electrode contact via within the piezoelectric film and the DPL overlying the first electrode on the bonded device;

removing a portion of the DPL overlying the piezoelectric film and the first electrode;

forming a second electrode layer overlying the DPL, the piezoelectric film, and within the contact via;

etching the second electrode layer to form a top metal separated from a second electrode, wherein the top metal is physically coupled to the first electrode through the electrode contact via and the second electrode is overlying the DPL and the piezoelectric film;

forming a first contact metal overlying the second electrode, the DPL, and the piezoelectric film;

forming a second contact metal overlying the top metal, the DPL, and the piezoelectric film;

forming a second passivation layer overlying the DPL, the piezoelectric film, the second electrode, and the top metal;

forming one or more release holes within the DPL, the piezoelectric film, and the first passivation layer overlying the sacrificial layer on the bonded device; and removing the sacrificial layer by way of the one or more release holes to form an air cavity within the bonded device.

2. The method of claim 1 wherein the growth substrate and bond substrate includes silicon (S), silicon carbide (SiC), sapphire ($Al_2O_3$), silicon dioxide ($SiO_2$), or other silicon materials.

3. The method of claim 1 wherein the piezoelectric film is a single crystal or polycrystalline piezoelectric film that includes aluminum nitride (AlN), aluminum scandium nitride (AlScN), gallium nitride (GaN), $Al_xGa_{1-x}N$ alloys, or other epitaxial materials.

4. The method of claim 1 wherein the piezoelectric film is an upper portion of a polycrystalline piezoelectric film that includes aluminum nitride (AlN), aluminum scandium nitride (AlScN), gallium nitride (GaN), $Al_xGa_{1-x}N$ alloys, or other polycrystalline epitaxial materials.

5. The method of claim 1 wherein the first electrode, second electrode, and top metal include molybdenum (Mo), ruthenium (Ru), tungsten (W), or other conductive materials;

wherein the first and second passivation layers, and the sacrificial layer include silicon nitride (SiN), silicon oxide (SiO), silicon dioxide ($SiO_2$), or other silicon materials; and wherein the first and second contact metals include gold (Au), aluminum (Al), copper (Cu), nickel (Ni), aluminum bronze (AlCu), or other metal materials.

6. The method of claim 1 wherein the DPL is characterized by a thickness of 50 to 10,000 Angstroms.

7. The method of claim 1 wherein polishing the support layer includes a chemical-mechanical planarization (CMP) process; wherein the support layer and the bonding support layer include silicon dioxide ($SiO_2$) or other silicon materials; and wherein removing the growth substrate includes a grinding process, a blanket etching process, a film transfer process, an ion implantation transfer process, or a laser crack transfer process; and wherein the removal of the sacrificial layer includes a poly-Si etch or an a-Si etch or other etching process.

8. The method of claim 1 further comprising processing the second electrode and the top metal to form a processed second electrode and a processed top metal, wherein the processed second electrode includes an energy confinement structure.

9. The method of claim 1 further comprising processing the first electrode to form a processed first electrode, wherein the processed first electrode includes an energy confinement structure.

10. The method of claim 1 wherein the DPL includes silicon dioxide ($SiO_2$), silicon nitride (SiN), aluminum nitride (AlN), aluminum oxide ($Al_2O_3$), silicon oxycarbide (SiOC), or other oxide material.

11. A method for fabricating an acoustic resonator device, the method comprising:

forming a piezoelectric film overlying a growth substrate;

forming a dielectric protection layer (DPL) overlying the piezoelectric film;

removing a portion of the DPL exposing a portion of the piezoelectric film forming a first electrode overlying the DPL and the piezoelectric film, wherein the first electrode is configured overlying the exposed portion of the piezoelectric film;

forming a first passivation layer overlying the first electrode, the DPL, and the piezoelectric film;

forming a sacrificial layer overlying the first passivation layer, the first electrode, the DPL, and the piezoelectric film;

forming a support layer overlying the sacrificial layer, the first passivation layer, the first electrode, the DPL, and the piezoelectric film thereby forming a device on the growth substrate;

polishing the support layer;

forming a bonding support layer overlying a bond substrate;

flipping the device on the growth substrate and bonding the polished support layer to the bonding support layer thereby forming a bonded device;

removing the growth substrate from the bonded device;

forming an electrode contact via within the piezoelectric film and overlying the first electrode on the bonded device;

forming a second electrode layer overlying the piezoelectric film and within the contact via;

etching the second electrode layer to form a top metal separated from a second electrode, wherein the top metal is physically coupled to the first electrode through the electrode contact via and the second electrode is overlying the piezoelectric film;

forming a first contact metal overlying the second electrode and the piezoelectric film;

forming a second contact metal overlying the top metal and the piezoelectric film;

forming a second passivation layer overlying the piezoelectric film, the second electrode, and the top metal;

forming one or more release holes within the piezoelectric film and the first passivation layer overlying the sacrificial layer on the bonded device; and removing the sacrificial layer by way of the one or more release holes to form an air cavity within the bonded device.

12. The method of claim 11 wherein the growth substrate and bond substrate includes silicon (S), silicon carbide (SiC), sapphire ($Al_2O_3$), silicon dioxide ($SiO_2$), or other silicon materials.

13. The method of claim 11 wherein the piezoelectric film is a single crystal or polycrystalline piezoelectric film that includes aluminum nitride (AlN), aluminum scandium nitride (AlScN), gallium nitride (GaN), $Al_xGa_{1-x}N$ alloys, or other epitaxial materials.

14. The method of claim 11 wherein the piezoelectric film is an upper portion of a polycrystalline piezoelectric film that includes aluminum nitride (AlN), aluminum scandium nitride (AlScN), gallium nitride (GaN), $Al_xGa_{1-x}N$ alloys, or other polycrystalline epitaxial materials.

15. The method of claim 11 wherein the first electrode, second electrode, and top metal include molybdenum (Mo), ruthenium (Ru), tungsten (W), or other conductive materials;

wherein the first and second passivation layers, and the sacrificial layer include silicon nitride (SiN), silicon oxide (SiO), silicon dioxide ($SiO_2$), or other silicon materials; and wherein the first and second contact metals include gold (Au), aluminum (Al), copper (Cu), nickel (Ni), aluminum bronze (AlCu), or other metal materials.

16. The method of claim 11 wherein the DPL is characterized by a thickness of 50 to 10,000 Angstroms.

17. The method of claim 11 wherein polishing the support layer includes a chemical-mechanical planarization (CMP) process; wherein the support layer and the bonding support layer include silicon dioxide ($SiO_2$) or other silicon materials; and wherein removing the growth substrate includes a grinding process, a blanket etching process, a film transfer process, an ion implantation transfer process, or a laser crack transfer process; and wherein the removal of the sacrificial layer includes a poly-Si etch or an a-Si etch or other etching process.

18. The method of claim 11 further comprising processing the second electrode and the top metal to form a processed second electrode and a processed top metal, wherein the processed second electrode includes an energy confinement structure.

19. The method of claim 11 further comprising processing the first electrode to form a processed first electrode, wherein the processed first electrode includes an energy confinement structure.

20. The method of claim 11 wherein the DPL includes silicon dioxide ($SiO_2$), silicon nitride (SiN), aluminum nitride (AlN), aluminum oxide ($Al_2O_3$), silicon oxycarbide (SiOC), or other oxide material.

* * * * *